(12) United States Patent
Tan et al.

(10) Patent No.: US 11,688,829 B2
(45) Date of Patent: Jun. 27, 2023

(54) ENGINEERED SUBSTRATE ARCHITECTURE FOR INGAN RED MICRO-LEDS

(71) Applicant: Meta Platforms Technologies, LLC, Menlo Park, CA (US)

(72) Inventors: Wei Sin Tan, Plymouth (GB); Andrea Pinos, Plymouth (GB); John Lyle Whiteman, St. Austell (GB)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 273 days.

(21) Appl. No.: 17/138,258

(22) Filed: Dec. 30, 2020

(65) Prior Publication Data
US 2022/0209066 A1 Jun. 30, 2022

(51) Int. Cl.
*H01L 33/32* (2010.01)
*H01L 33/00* (2010.01)
(Continued)

(52) U.S. Cl.
CPC ............ *H01L 33/32* (2013.01); *H01L 33/007* (2013.01); *H01L 33/06* (2013.01); *H01L 33/16* (2013.01); *G02B 27/0172* (2013.01); *H01L 27/15* (2013.01)

(58) Field of Classification Search
CPC ......... H01L 33/16; H01L 33/06; H01L 33/32; H01L 27/156; H01L 33/007; H01L 33/44; H01L 33/385; H01L 27/15; G02B 27/0172
See application file for complete search history.

(56) References Cited

U.S. PATENT DOCUMENTS

| 10,554,017 B2 | 2/2020 | Han et al. |
| 2009/0001416 A1 | 1/2009 | Chua et al. |

(Continued)

FOREIGN PATENT DOCUMENTS

| GB | 2575311 A | 1/2020 |
| GB | 2593693 A | 10/2021 |

OTHER PUBLICATIONS

International Search Report and Written Opinion for International Application No. PCT/US2021/059253, dated Apr. 7, 2022, 9 pages.
(Continued)

*Primary Examiner* — Savitri Mulpuri
(74) *Attorney, Agent, or Firm* — Weaver Austin Villeneuve & Sampson LLP

(57) ABSTRACT

A light emitting diode (LED) device includes a substrate and a plurality of mesa structures. Each mesa structure includes a layer of a first semiconductor material, a porous layer of the first semiconductor material on the layer of the first semiconductor material, and a layer of a second semiconductor material on the porous layer. The porous layer is characterized by an areal porosity ≥15%. The second semiconductor material is characterized by a lattice constant greater than a lattice constant of the first semiconductor material. Each mesa structure also includes an active region on the layer of the second semiconductor material and configured to emit red light, a p-contact layer on the active region, a dielectric layer on sidewalls of the p-contact layer and the active region, and an n-contact layer in physical contact with at least a portion of sidewalls of the layer of the second semiconductor material.

19 Claims, 34 Drawing Sheets

(51) Int. Cl.
*H01L 33/06* (2010.01)
*H01L 33/16* (2010.01)
*G02B 27/01* (2006.01)
*H01L 27/15* (2006.01)

(56) References Cited

U.S. PATENT DOCUMENTS

| | | |
|---|---|---|
| 2009/0140274 A1 | 6/2009 | Wierer, Jr. et al. |
| 2016/0153113 A1 | 6/2016 | Zhang et al. |
| 2017/0237234 A1 | 8/2017 | Han et al. |
| 2021/0193873 A1* | 6/2021 | Pernel ............... H01L 33/12 |
| 2022/0085238 A1* | 3/2022 | Chudzik ............. H01L 33/32 |
| 2022/0208848 A1 | 6/2022 | Tan et al. |

OTHER PUBLICATIONS

International Search Report and Written Opinion for International Application No. PCT/US2021/065173, dated Apr. 20, 2022, 10 pages.

Pasayat S., et al., Color-Tunable10 [mu]m Square InGaN Micro-LEDs on Compliant GaN-on-Porous-GaN Pseudo-Substrates, Applied Physics Letters, Aug. 14, 2020, vol. 117, No. 6, 7 pages.

Pasayat S., et al., Growth of Strain-Relaxed InGaN on Micrometer-Sized Patterned Compliant GaN Pseudo-Substrates, Applied Physics Letters, Mar. 16, 2020, vol. 116, No. 11, 6 pages.

Griffin P.H., et al., "Porous Nitride Semiconductors Reviewed," Journal of Physics D: Applied Physics, Jul. 2, 2020, vol. 53(383002), 18 pages.

Li X., et al., "In-plane Bandgap Control in Porous GaN Through Electroless Wet Chemical Etching," Applied physics letters, Feb. 11, 2002, vol. 80, No. 6, pp. 980-982.

Mitchell B., et al., "Perspective: Toward Efficient GaN-Based Red Light Emitting Diodes Using Europium Doping," Journal of Applied Physics, 123:160901, Mar. 29, 2018, 12 pages.

Robin Y., et al., "Monolithic Integration of Tricolor Micro-LEDs and Color Mixing Investigation by Analog and Digital Dimming," Japan Society of Applied Physics, Apr. 29, 2019, vol. 58:SCCC06, 6 pages.

Wu C-J., et al., "Deep-UV Porous AlGaN Distributed Bragg Reflectors for Deep Ultraviolet Light-Emitting Diodes and Laser Diodes," ACS Applied Nano Materials, Jan. 6, 2020, vol. 3, pp. 399-402.

Zhu T., et al., "Wafer-Scale Fabrication of Non-Polar Mesoporous GaN Distributed Bragg Reflectors via Electrochemical Porosification," Scientific Reports, Mar. 27, 2017, vol. 7:45344, 8 pages.

Zwierz R.P., "Plasma Enhanced Growth of GaN Single Crystalline Layers from Vapour Phase," 2014, 172 pages.

\* cited by examiner

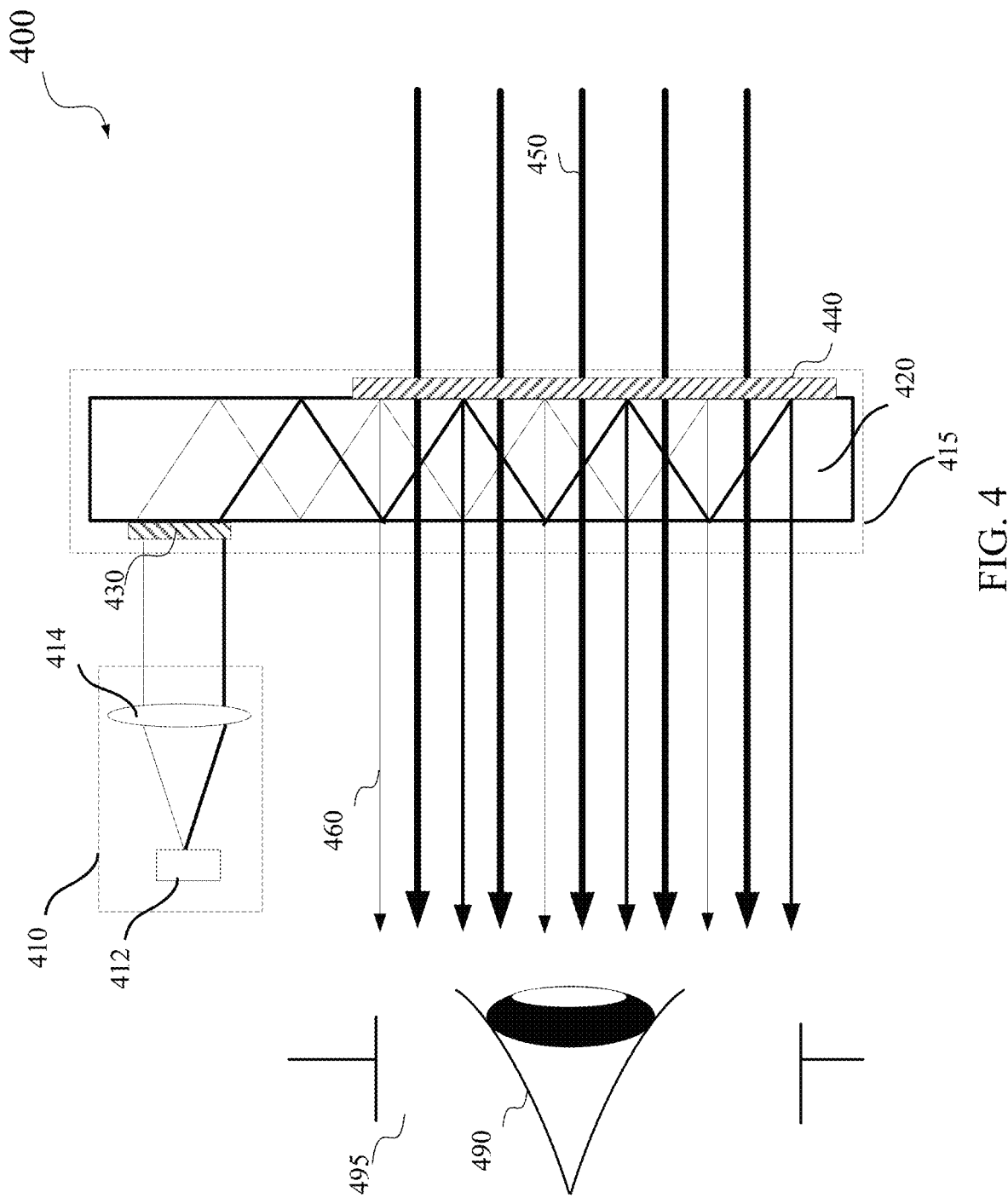

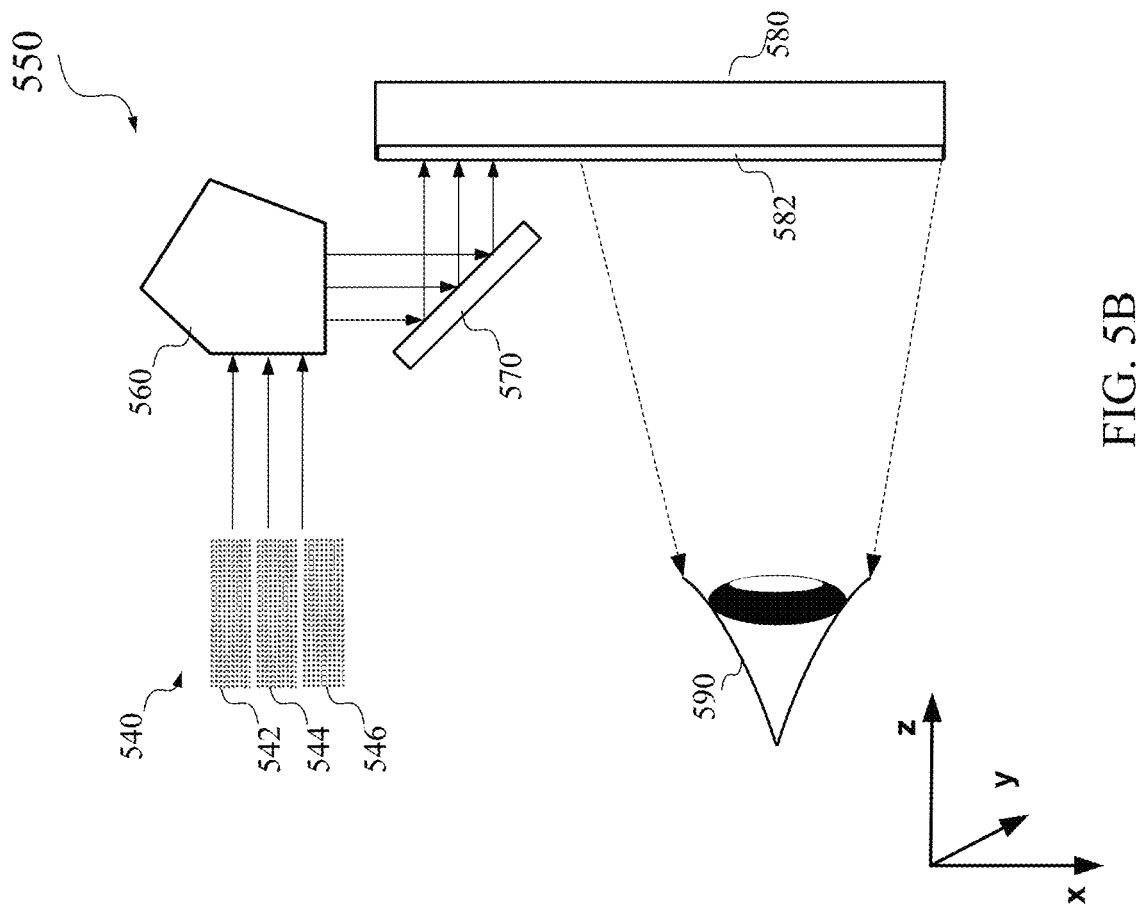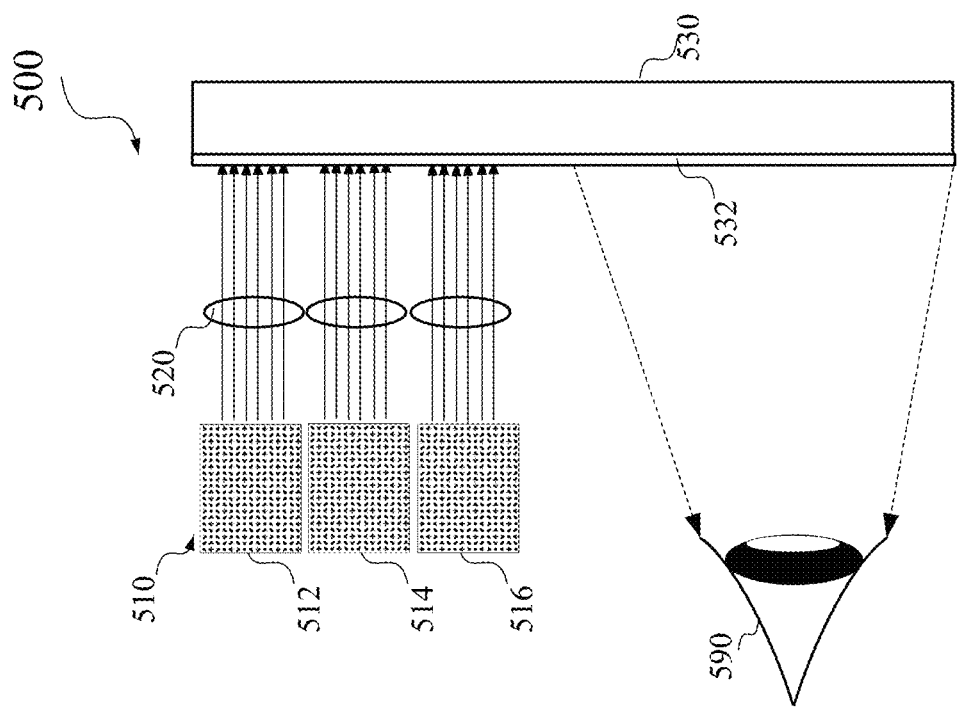

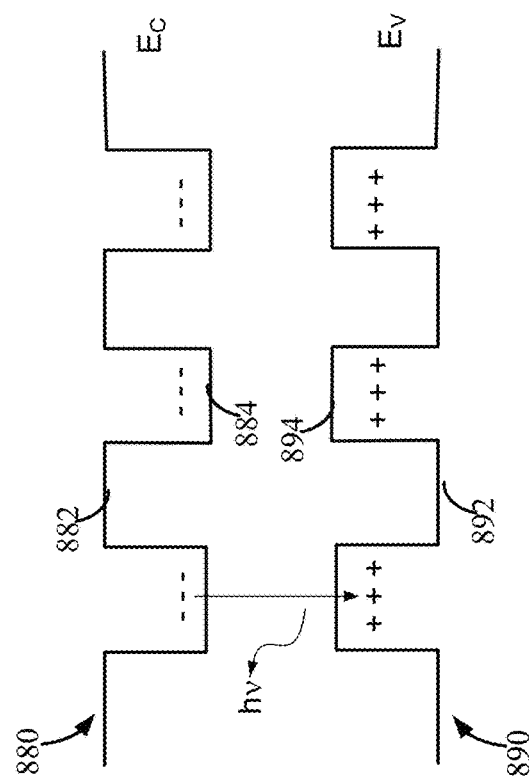
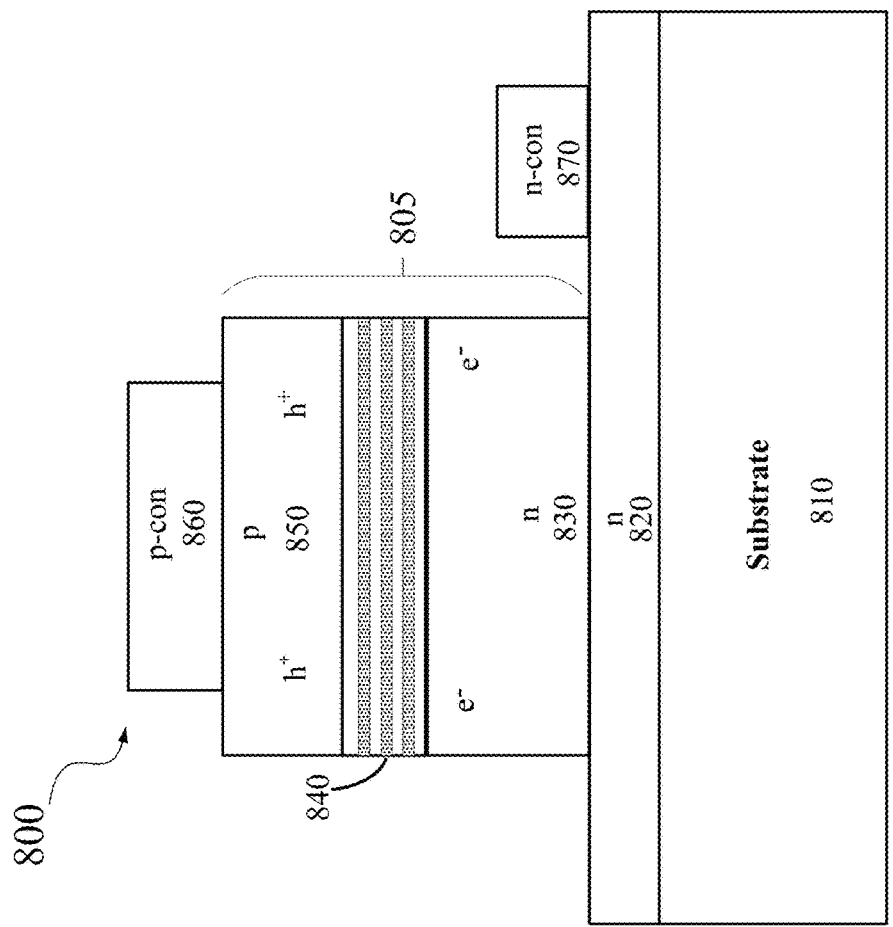
FIG. 8B
FIG. 8A

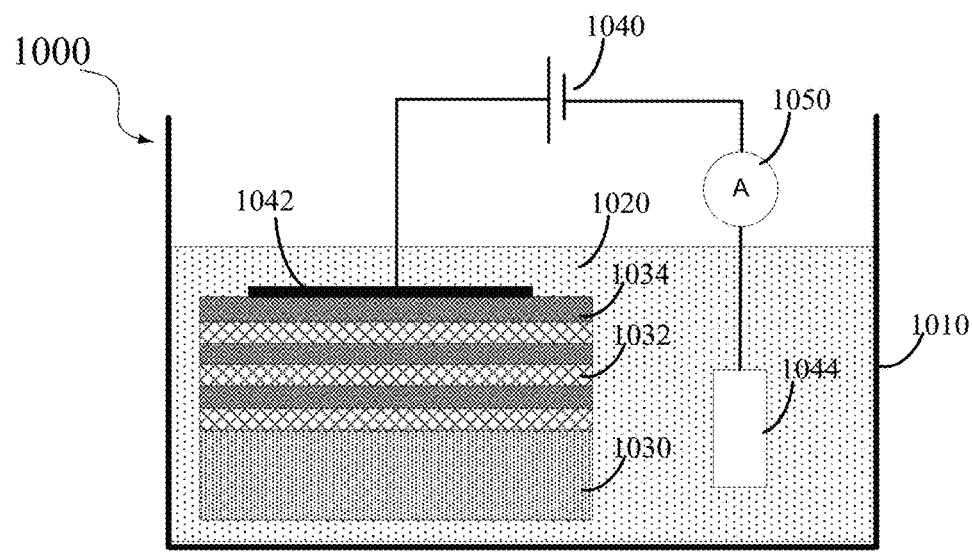
FIG. 10A
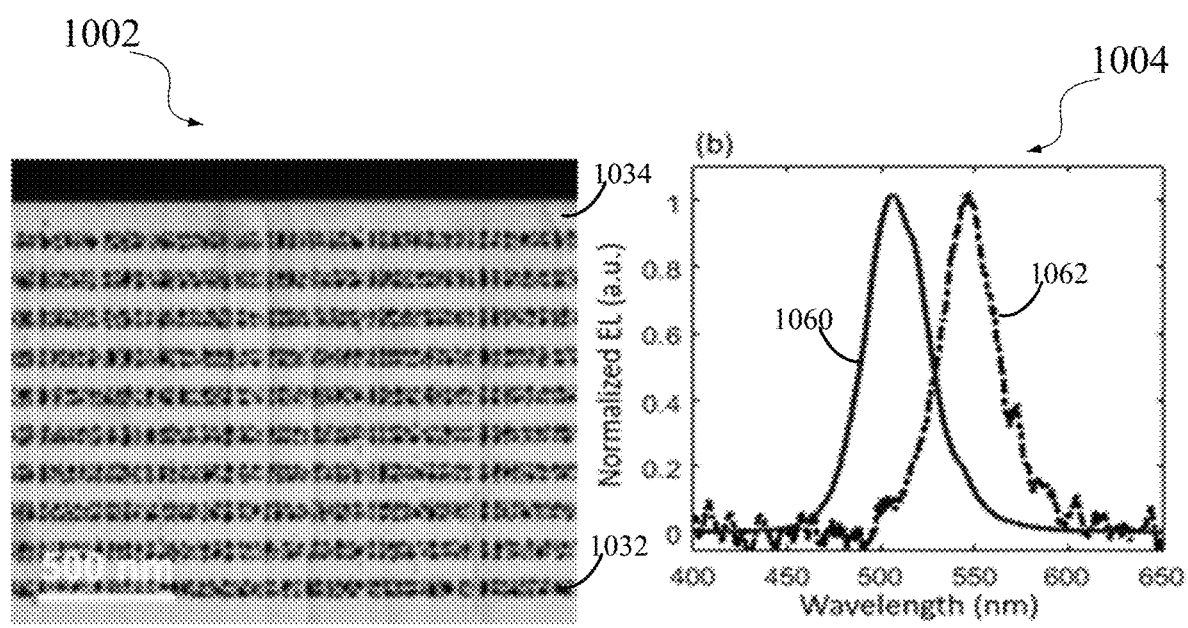
FIG. 10B
FIG. 10C

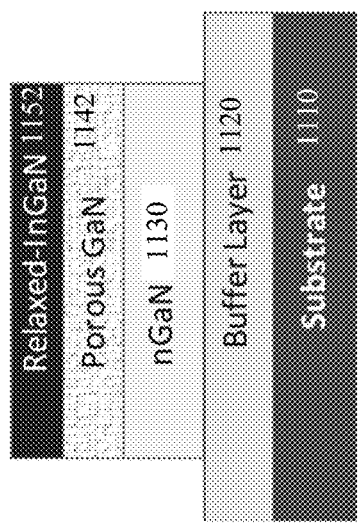
FIG. 11C
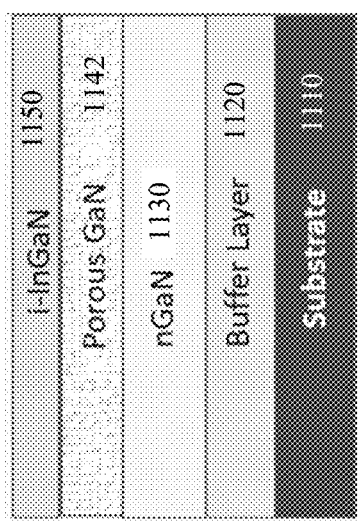
FIG. 11B
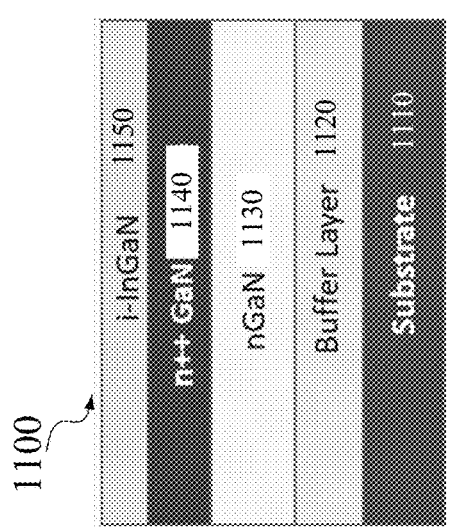
FIG. 11A
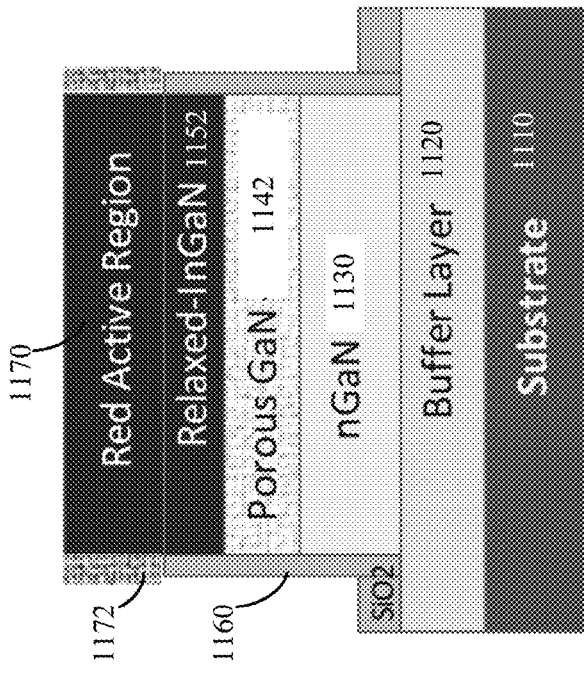
FIG. 11E
FIG. 11D

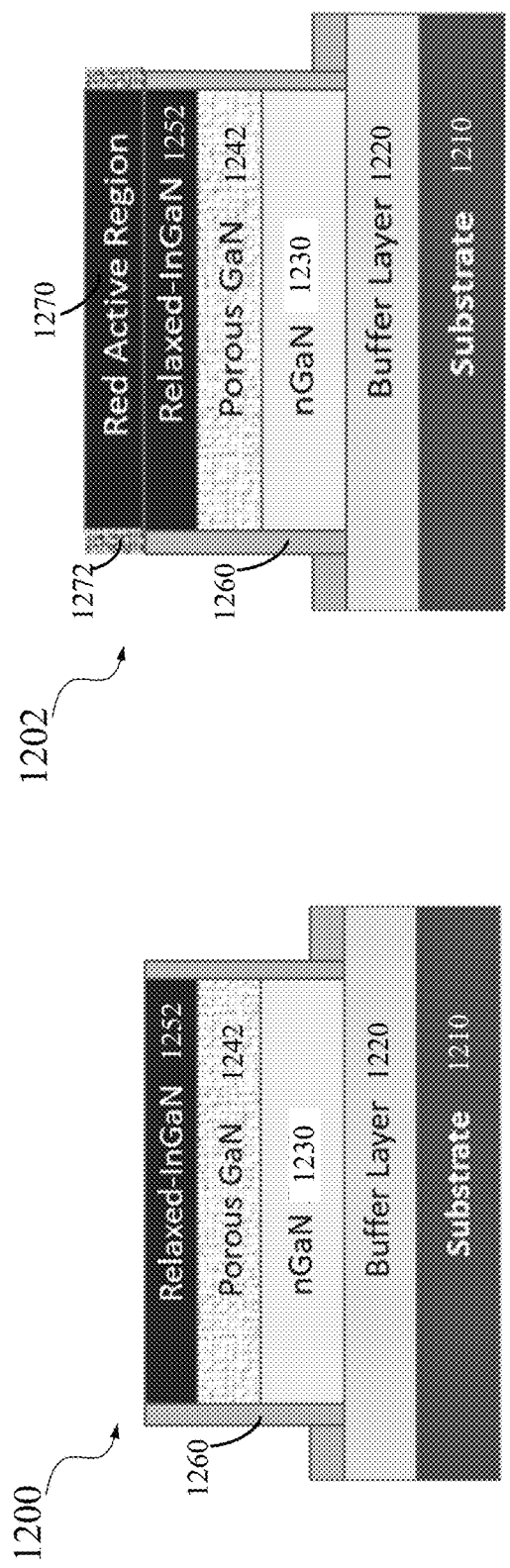
FIG. 12A
FIG. 12C
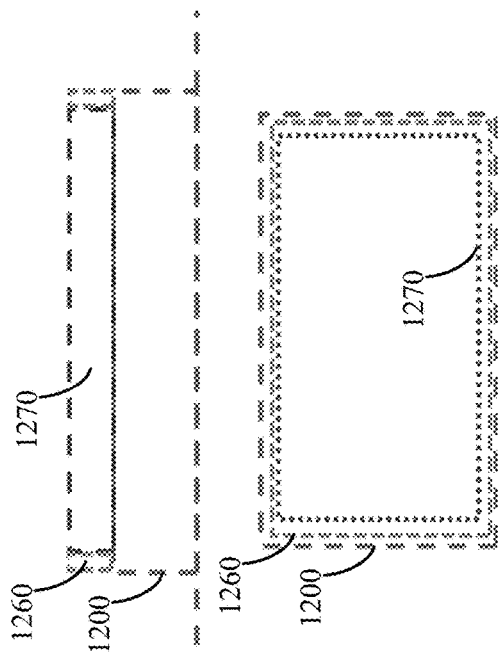
FIG. 12D
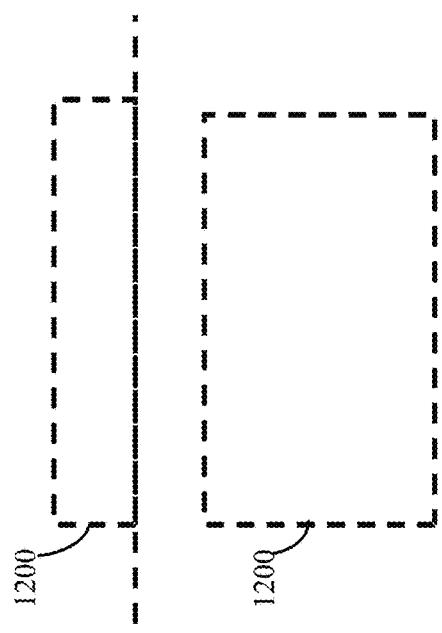
FIG. 12B

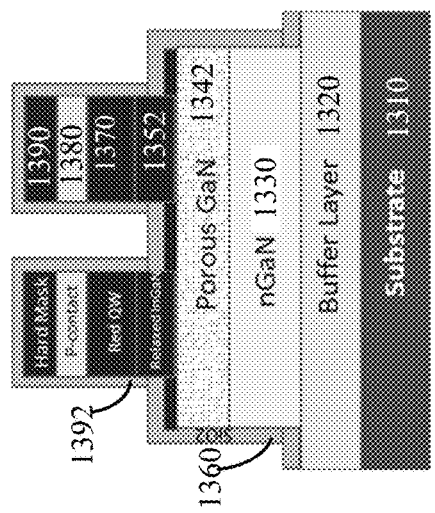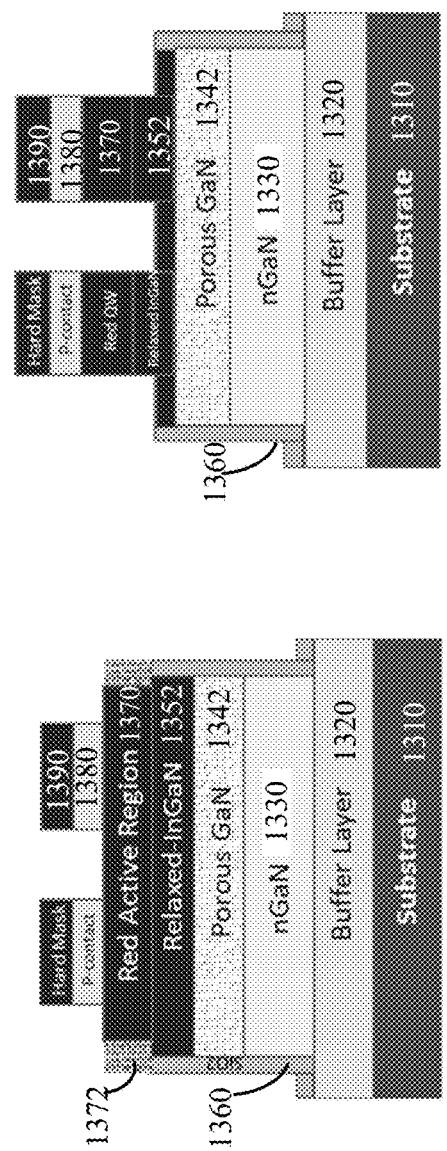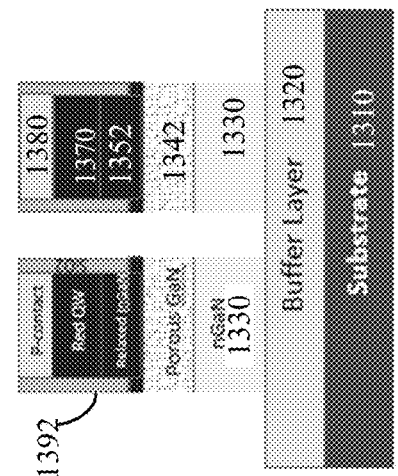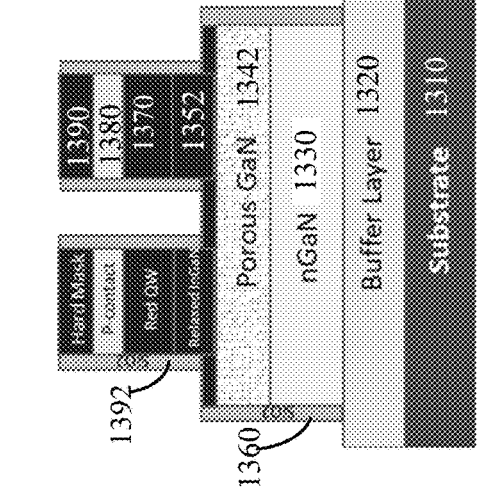
FIG. 13I
FIG. 13L
FIG. 13H
FIG. 13K
FIG. 13G
FIG. 13J

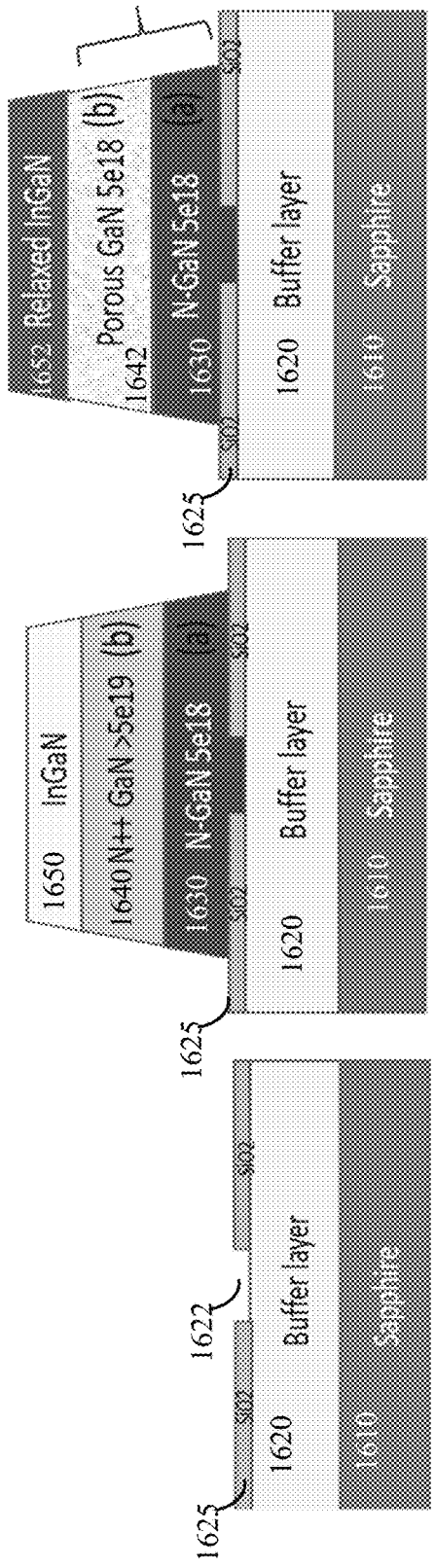
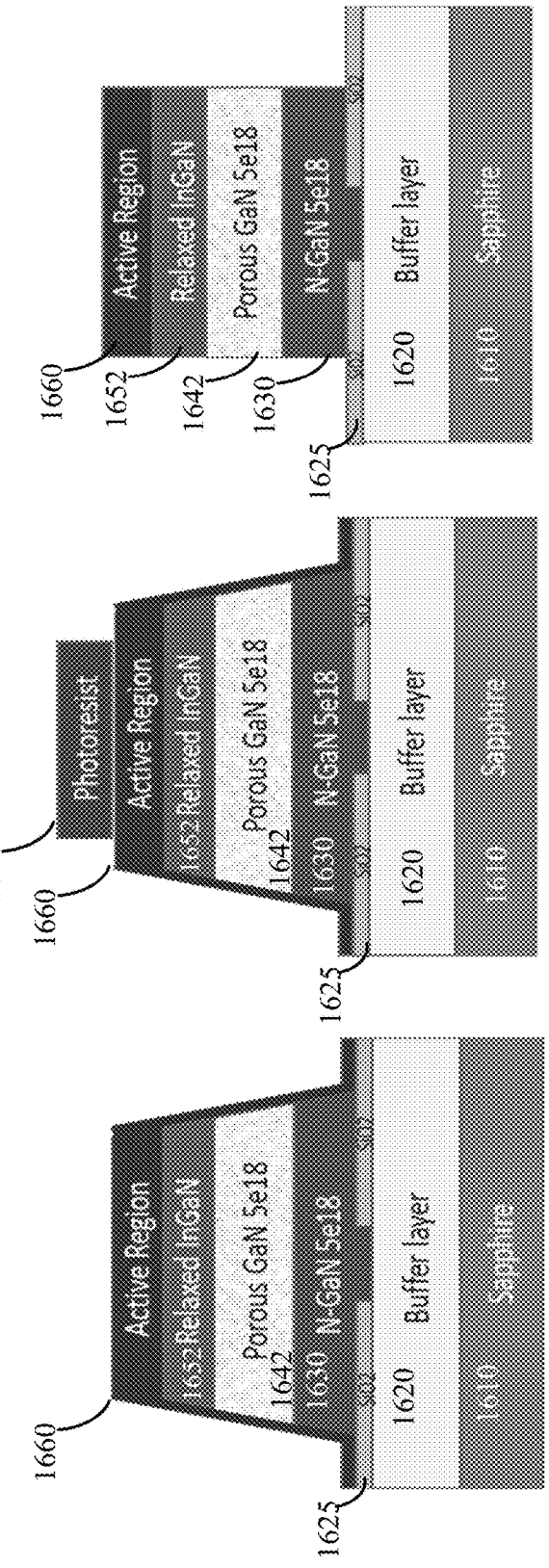
FIG. 16A FIG. 16B FIG. 16C FIG. 16D FIG. 16E FIG. 16F

ENGINEERED SUBSTRATE ARCHITECTURE FOR INGAN RED MICRO-LEDS

CROSS-REFERENCES TO RELATED APPLICATIONS

The following two U.S. patent applications (including this one) are being filed concurrently, and the entire disclosure of the other application is incorporated by reference into this application for all purposes:

application Ser. No. 17/138,258, filed Dec. 30, 2020, entitled "ENGINEERED SUBSTRATE ARCHITECTURE FOR INGAN RED MICRO-LEDS"; and application Ser. No. 17/138,275, filed Dec. 30, 2020, entitled "ENGINEERED WAFER WITH SELECTIVE POROSIFICATION FOR MULTI-COLOR LIGHT EMISSION".

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, AlGaInP, other quaternary phosphide compositions, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, this disclosure relates to high-efficiency micro-LEDs configured to emit light in various colors (e.g., red, green, and/or blue), and the fabrication of the high-efficiency micro-LEDs using, for example, III-nitride semiconductor materials. According to certain embodiments, an LED device may include a substrate and a plurality of mesa structures on the substrate. Each mesa structure may include a layer of a first semiconductor material grown on the substrate, a porous layer of the first semiconductor material on the layer of the first semiconductor material, and a layer of a second semiconductor material on the porous layer. The porous layer may be characterized by an areal porosity equal to or greater than about 15%. The second semiconductor material may be characterized by a lattice constant greater than a lattice constant of the first semiconductor material. Each mesa structure may also include an active region on the layer of the second semiconductor material and configured to emit red light, a p-contact layer on the active region, a dielectric layer on sidewalls of the p-contact layer and the active region, and an n-contact layer in physical contact with at least a portion of sidewalls of the layer of the second semiconductor material.

In some embodiments, the first semiconductor material may include a first III-nitride semiconductor material (e.g., GaN), and the second semiconductor material may include a second III-nitride semiconductor material (e.g., InGaN). The active region may include at least one quantum well layer, the at least one quantum well layer including $In_xGa_{1-x}N$, where x>0.2. The layer of the second semiconductor material may include $In_xGa_{1-x}N$, where $0<x\le0.2$. The dielectric layer may be between the n-contact layer and the sidewalls of the p-contact layer and the active region. The dielectric layer is on a portion of the sidewalls of the layer of the second semiconductor material. The n-contact layer may be on sidewalls of the porous layer and at least a portion of sidewalls of the layer of the first semiconductor material. The layer of the second semiconductor material may have a lower resistance than the porous layer. the areal porosity of the porous layer may be between about 30% and about 90%. A thickness of the porous layer may be greater than about 50 nm.

In some embodiments, the substrate may include a buffer layer and a sapphire or silicon substrate layer. In some embodiments, the layer of the first semiconductor material and the porous layer may be n-doped; and a difference between a doping density of the porous layer and the doping density of the layer of the first semiconductor material may be less than about 5%. In some embodiments, the LED device may include a patterned dielectric layer on the substrate. The substrate may include a buffer layer. The patterned dielectric layer may be on the buffer layer and may include a plurality of apertures to expose portions of the substrate. The layer of the first semiconductor material in each mesa structure of the plurality of mesa structures may be grown on a respective portion of the buffer layer through a respective aperture of the plurality of apertures. In some embodiments, the LED device may include a driver backplane bonded to the plurality of mesa structures. The driver backplane may include driver circuits electrically connected to the p-contact layer and the n-contact layer of each mesa structure of the plurality of mesa structures.

According to certain embodiments, a method of fabricating an LED device may include forming a plurality of precursor mesa structures on a substrate, forming an LED layer stack on each precursor mesa structure of the plurality of precursor mesa structures, etching the LED layer stack using a mask layer to remove peripheral regions of the LED layer stack and to form one or more pixel mesa structures on each precursor mesa structure of the plurality of precursor mesa structures, forming a dielectric layer on sidewalls of each pixel mesa structures of the one or more pixel mesa structures, etching the plurality of precursor mesa structures on the substrate using the mask layer on the one or more pixel mesa structure, and forming an n-contact layer on sidewalls of each pixel mesa structure of the one or more pixel mesa structures, the n-contact layer in physical contact with the dielectric layer, at least a portion of sidewalls of the layer of the second semiconductor material, and sidewalls of the porous layer. Each precursor mesa structure of the plurality of precursor mesa structures may include a layer of a first semiconductor material grown on the substrate, a porous layer of the first semiconductor material on the layer of the first semiconductor material and characterized by an areal porosity equal to or greater than about 15%, and a layer of a second semiconductor material on the porous layer, where the second semiconductor material may be characterized by a lattice constant greater than a lattice constant of the first semiconductor material. The LED layer stack may include an active region on the layer of the second semiconductor material and configured to emit red light, and a p-contact layer on the active region.

In some embodiments, forming the plurality of precursor mesa structures on the substrate may include growing, on the substrate, an epitaxial layer stack that may include the layer of the first semiconductor material, an n$^+$-type layer of the first semiconductor material, and the layer of the second semiconductor material on the n$^+$-type layer; electrochemically etching the n$^+$-type layer of the first semiconductor material to form the porous layer; etching the epitaxial layer stack to form the plurality of precursor mesa structures; and thermally treating the plurality of precursor mesa structures to cause the layer of the second semiconductor material to relax. The layer of the first semiconductor material may be n-doped with a doping density less than $1 \times 10^{19}$ cm$^{-3}$. The n$^+$-type layer of the first semiconductor material may have a higher doping density than the layer of the first semiconductor material. Electrochemically etching the n$^+$-type layer of the first semiconductor material may include etching the n$^+$-type layer of the first semiconductor material until a difference between a doping density of the n$^+$-type layer and a doping density of the layer of the first semiconductor material is less than 5%.

In some embodiments, forming the plurality of precursor mesa structures on the substrate may include forming, on the substrate, a patterned dielectric layer that includes a plurality of apertures to expose portions of a buffer layer on the substrate; growing, through a respective aperture of the plurality of apertures, a respective epitaxial layer stack on each exposed portion of the exposed portions of the buffer layer on substrate, the respective epitaxial layer stack including the layer of the first semiconductor material, an n$^+$-type layer of the first semiconductor material, and the layer of the second semiconductor material on the n$^+$-type layer; electrochemically etching the n$^+$-type layer of the first semiconductor material to form the porous layer; and thermally treating the plurality of precursor mesa structures to cause the layer of the second semiconductor material to relax.

In some embodiments, forming the LED layer stack may include forming a growth mask layer on sidewalls of each precursor mesa structure of the plurality of precursor mesa structures, growing the active region on the layer of the second semiconductor material, and forming the p-contact layer on the active region.

According to certain embodiments, an engineered wafer may include a plurality of mesa structures, where the plurality of mesa structures may include a first mesa structure and a second mesa structure. The first mesa structure may include a first porous layer of a first semiconductor material having a first lattice constant, and a first layer of a second semiconductor material on the first porous layer. The first porous layer may be characterized by a first porosity. The second semiconductor material may be characterized by a second lattice constant greater than the first lattice constant. The second mesa structure may include a second porous layer of the first semiconductor material, and a second layer of the second semiconductor material on the second porous layer. The second porous layer may be characterized by a second porosity different from the first porosity.

In some embodiments of the engineered wafer, the first semiconductor material may include a first III-nitride semiconductor material (e.g., GaN); and the second semiconductor material includes a second III-nitride semiconductor material (e.g., InGaN). The engineered wafer may also include a substrate and an n-type layer of the first semiconductor material on the substrate, where the plurality of mesa structures is on the n-type layer of the first semiconductor material. In some embodiments, the engineered wafer may also include a first active region on the first layer of the second semiconductor material and configured to emit light of a first color, and a second active region on the second layer of the second semiconductor material and configured to emit light of a second color different from the first color. The first active region may include an In$_x$Ga$_{1-x}$N quantum well layer. The second active region may include an In$_y$Ga$_{1-y}$N quantum well layer, where y is different from x, and x may greater than about 0.2. In some embodiments, the first layer of the second semiconductor material and the second layer of the second semiconductor material may include In$_x$Ga$_{1-x}$N, where 0<x≤0.2.

In some embodiments of the engineered wafer, the first mesa structure may include a first distributed Bragg reflector (DBR) that includes the first porous layer, the first DBR configured to reflect light in a first wavelength band. The second mesa structure comprises a second DBR that includes the second porous layer, the second DBR configured to reflect light in a second wavelength band. In some embodiments, the plurality of mesa structures may include a third mesa structure that may include a third porous layer of the first semiconductor material having a third porosity different from the first porosity and the second porosity, and a third layer of the second semiconductor material on the third porous layer.

According to certain embodiments, a light source may include a semiconductor substrate and a plurality of light emitting pixels on the semiconductor substrate. The plurality of light emitting pixels may include a first set of light emitting pixels and a second set of light emitting pixels. Each light emitting pixel of the first set of light emitting pixels may include a first porous layer of a first semiconductor material having a first lattice constant, a first layer of a second semiconductor material on the first porous layer, and a first active region on the first layer of the second semiconductor material. The first porous layer may be characterized by a first porosity. The second semiconductor material may be characterized by a second lattice constant greater than the first lattice constant. The first active region may be configured to emit light in a first color. Each light emitting pixel of the second set of light emitting pixels may include a second porous layer of the first semiconductor material, a second layer of the second semiconductor material on the second porous layer, and a second active region on the second layer of the second semiconductor material. The second porous layer may be characterized by a second porosity different from the first porosity. The second active region may be configured to emit light in a second color.

In some embodiments, the first active region may include an In$_x$Ga$_{1-x}$N quantum well layer, and the second active region includes an In$_y$Ga$_{1-y}$N quantum well layer, where y is different from x. In some embodiments, each light emitting pixel of the first set of light emitting pixels further may include a first distributed Bragg reflector (DBR) that includes the first porous layer and is configured to reflect light in a first wavelength band, and a first mirror, where the first mirror and the first DBR may form a first cavity, and the first active region may be in the first cavity. Each light emitting pixel of the second set of light emitting pixels may include a second DBR that includes the second porous layer and is configured to reflect light in a second wavelength band, and a second mirror that, together with the second DBR, forms a second cavity, where the second active region is in the second cavity. In some embodiments, the plurality of light emitting pixels may include a third set of light emitting pixels. Each light emitting pixel of the third set of light emitting pixels may include a third porous layer of the first semiconductor material, a third layer of the second semiconductor material on the third porous layer, and a third active region on the third layer of the second semiconductor material. The third porous layer may be characterized by a third porosity different from the first porosity and the second porosity. The third active region may be configured to emit light in a third color.

According to certain embodiments, a method may include forming a plurality of mesa structures on a layer of a first semiconductor material having a first lattice constant, performing a first porosity treatment process on a first set of mesa structures of the plurality of mesa structures to form porous layers in the n+-type layers of the first set of mesa structures, performing a second porosity treatment process on a second set of mesa structures of the plurality of mesa structures to form porous layers in the n+-type layers of the second set of mesa structures, and thermally treating the plurality of mesa structures to cause the layer of the second semiconductor material to relax. Each mesa structure of the plurality of mesa structures may include an $n^+$-type layer of the first semiconductor material; and a layer of a second semiconductor material on the $n^+$-type layer, the second semiconductor material having a second lattice constant different from the first lattice constant.

In some embodiments, the method may also include growing a first active region on each mesa structure of the first set of mesa structures, the first active region including an $In_xGa_{1-x}N$ quantum well layer; and growing a second active region on each mesa structure of the second set of mesa structures, the second active region including an $In_yGa_{1-y}N$ quantum well layer, where y is different from x. In some embodiments, performing the first porosity treatment process may include electrochemically etching the $n^+$-type layers of the first set of mesa structures for a first time period, and performing the second porosity treatment process may include electrochemically etching the $n^+$-type layers of the second set of mesa structures for a second time period. In some embodiments, performing the first porosity treatment process may include electrochemically etching the $n^+$-type layers of the first set of mesa structures using a first voltage signal for a time period, and performing the second porosity treatment process may include electrochemically etching the $n^+$-type layers of the second set of mesa structures using a second voltage signal for the time period, where the second voltage signal may be higher than the first voltage signal. In some embodiments, performing the first porosity treatment process may include implanting ions in the $n^+$-type layers of the first set of mesa structures to change a donor density of the $n^+$-type layers of the first set of mesa structures, and electrochemically etching the $n^+$-type layers of the first set of mesa structures.

In some embodiments, each mesa structure of the plurality of mesa structures may include a plurality of layers between the layer of the first semiconductor material and the layer of the second semiconductor material. The plurality of layers may include a first set of unintentionally doped layers of the first semiconductor material, and a second set of $n^+$-type layers of the first semiconductor material, where the second set of $n^+$-type layers includes the $n^+$-type layer of the first semiconductor material. The first set of unintentionally doped layers and the second set of $n^+$-type layers may be interleaved. The first porosity treatment process may form, for each mesa structure of the first set of mesa structures, a respective porous layer in each of the second set of $n^+$-type layers.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4 illustrates an example of an optical see-through augmented reality system including a waveguide display according to certain embodiments.

FIG. 5A illustrates an example of a near-eye display device including a waveguide display according to certain embodiments.

FIG. 5B illustrates an example of a near-eye display device including a waveguide display according to certain embodiments.

FIG. 8A illustrates an example of a micro-LED with a mesa structure.

FIG. 8B illustrates a simplified energy band structure of the active region of the example of micro-LED shown in FIG. 8A.

FIG. 10A illustrates an example of setup for fabricating porous semiconductor material layers using electrochemical etching according to certain embodiments.

FIG. 10B includes a scanning electron microscopy (SEM) image of an example of a layer stack including porous GaN layers according to certain embodiments.

FIG. 10C illustrates an example of redshift of an example of a quantum well grown on a porous GaN layer according to certain embodiments.

FIGS. 11A-11E illustrate an example of a red micro-LED device fabricated on a porous GaN layer and an example of a method of fabricating the red micro-LED according to certain embodiments.

FIGS. 12A-12H illustrate an example of a method of fabricating red micro-LEDs on a porous GaN layer according to certain embodiments.

FIGS. 16A-16F illustrate an example of a method of fabricating the red micro-LED mesa structure shown in FIG. 14B according to certain embodiments.

Figure 1:
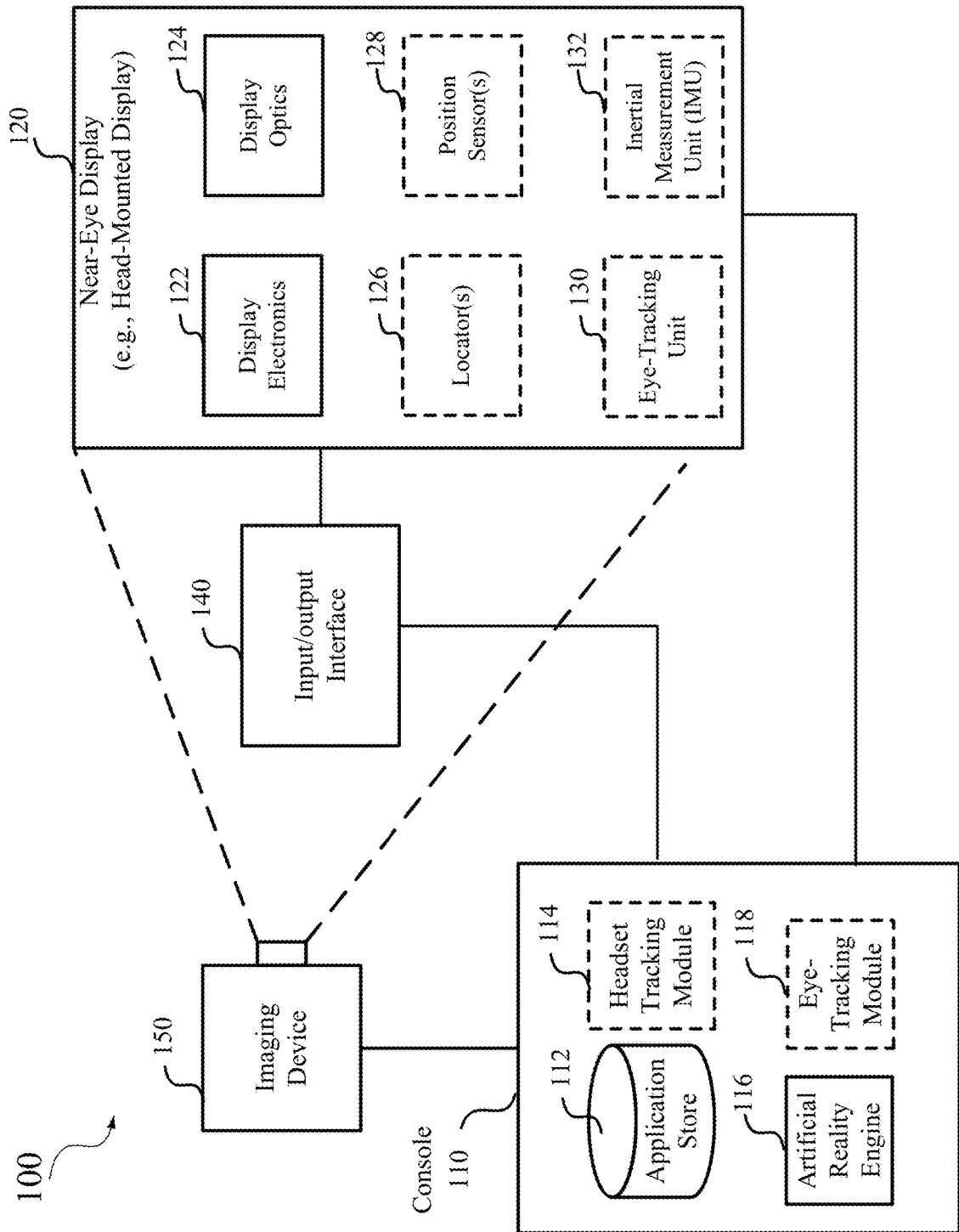
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, techniques disclosed herein relate to high-efficiency micro-LEDs configured to emit light in various colors (e.g., red, green, and/or blue), and the fabrication of the high-efficiency micro-LEDs using, for example, III-nitride semiconductor materials. Various inventive embodiments are described herein, including devices, systems, engineered wafers, bonded wafer/die stacks, packages, methods, processes, materials, and the like.

III-nitride materials, such as alloys of Al, In, Ga, and N, can be used to make LEDs that emit light in different colors. For example, alternating layers of GaN and $In_xGa_{1-x}N$ may be used to form quantum wells in which carriers confined by energy barriers may radiatively recombine to emit light. For blue LEDs, the indium mole fraction x is typically <0.2. Increasing the amount of indium incorporated into the $In_xGa_{1-x}N$ quantum well layers may reduce the bandgap energy, thereby increasing the wavelength of the light emitted by the LED from blue light to green, red, and infrared light.

However, GaN and $In_xGa_{1-x}N$ materials have different lattice constants, and thus alternately growing the GaN and $In_xGa_{1-x}N$ layers may introduce compressive or tensile strain in the active region. Increasing the amount of indium incorporated into the $In_xGa_{1-x}N$ quantum well layers may also increase the lattice constant of the $In_xGa_{1-x}N$ quantum well layers, thereby increasing the lattice constant mismatch between the GaN and $In_xGa_{1-x}N$ layers and the strain in the layers. The efficiency of incorporating indium in strained $In_xGa_{1-x}N$ layers is typically low. High In-content $In_xGa_{1-x}N$ layers (e.g., x>0.2) are generally formed using low temperature growth processes that may be prone to phase segregation, which may have detrimental effects on the internal quantum efficiency (IQE) of the LEDs due to the high defect density. Therefore, increasing the indium mole fraction x in $In_xGa_{1-x}N$ above 0.2 to make native green and red LEDs may significantly reduce the efficiency of the LEDs. For example, to form native red LEDs (e.g., LEDs with a peak emission wavelength in a range between 600 nm and 680 nm), the active regions of the LEDs typically need to include $In_xGa_{1-x}N$ layers with indium mole fraction x at least 0.3. Strains in $In_xGa_{1-x}N$ layers with such a high In-content may significantly increase the defect density and reduce the efficiency of the LEDs.

According to one example disclosed herein, a red micro-LED array may include a porous GaN layer that has a porosity greater than, for example, about 50% or about 70%, such that an InGaN layer (e.g., functioning as a buffer layer) on the porous GaN layer may be strain-relaxed. As a result, high-temperature epitaxial growth can be performed to grow high-quality active layers (e.g., InGaN quantum well layers)

on the porous GaN layer and the relaxed InGaN layer, while incorporating more indium into the InGaN layers during the high-temperature epitaxial growth. Therefore, high quality (e.g., low strain and low defect density) InGaN layers with high indium concentration may be grown on the porous GaN layer and the relaxed InGaN layer, and thus a large red shift of the wavelength of the emitted light into the red color region and a high quantum efficiency may be achieved. Furthermore, the current path between the n-contact and the active region is made to bypass the high-resistance porous GaN layer, and thus a low resistance path between the n-contact and the active region may be created in each micro-LED in the micro-LED array. In addition, the sidewall overgrowth regions at the sidewalls of the active region that have more defects and undesired crystalline orientations and thus can cause high leakage may be etched away in the processes disclosed herein. Therefore, the leakage at the mesa sidewalls may be reduced and the efficiency of the micro-LEDs may be improved.

According to one example of the processes disclosed herein, a red micro-LED array may be fabricated using three mesa etching steps. In the first mesa etching step, a layer stack that includes an n-GaN layer, a porous GaN layer, and a relaxed InGaN layer grown on a substrate may be etched to form large mesa structures. Each large mesa structure (also referred to herein as precursor mesa structure) may have a lateral dimension larger than the lateral dimension of an individual micro-LED to be formed. For example, each large mesa structure may be used to form multiple micro-LEDs, such as 4, 6, 8, 9, or more micro-LEDs. The formation of the large mesa structures may create space for InGaN layer relaxation and expansion to avoid bowing of the InGaN layer during the relaxation in a thermal treatment process. The large mesa structures with the relaxed InGaN layer at the growth surface may be used to regrow the active regions of the micro-LEDs, where the active regions grown on the large mesa structures may have a high indium concentration in the InGaN quantum well layers that may also have a low strain and a low defect density. The active regions may include sidewall overgrowth regions that may cause high leakage as described above. A second mesa etching step may be performed to remove the sidewall overgrowth regions. The second mesa etching step may also etch the large mesa structures including the overgrown active regions (and a p-contact layer) into individual mesa structures (also referred to herein as pixel mesa structures) for individual micro-LEDs. A dielectric layer may then be formed on the sidewalls of the active region (and sidewalls of the p-contact layer) of each pixel mesa structure. A third mesa etching step may include self-aligned etching of the pixel mesa structures down to the n-GaN layer. An n-contact layer may then be formed on the sidewalls of etched pixel mesa structure, where the n-contact layer may in physical contact with the relaxed InGaN layer, thereby bypassing the high-resistance porous GaN layer and forming a low-resistance current path between the n-contact layer and the active region in each micro-LED.

Therefore, techniques disclosed herein can achieve high quality epitaxial layers with high indium concentration and can provide a low-resistance current path to the active region. As such, high-efficiency red micro-LEDs may be achieved using III-nitride materials, such as InGaN/GaN. For example, the external quantum efficiency (EQE) of a 5-um InGaN red micro-LED may be improved from about 1.5% to about 3.5% or higher using techniques disclosed herein, and the peak-efficiency current density of the 5-um InGaN red micro-LED may be reduced from about 20 A/cm$^2$ to about 1 A/cm$^2$ or lower.

To display color images using micro-LEDs, micro-LEDs that can emit light in different colors (e.g., red, green, and blue) may be needed, where each pixel of a color image may be generated by, for example, a red micro-LED pixel, a green micro-LED pixel, and a blue micro-LED pixel. In general, micro-LEDs manufactured on a same wafer or die may only emit light in a same color. Therefore, to display color images, three micro-LED dies or three display panels may generally be used. The number of micro-LED dies or display panels may be reduced using some techniques.

For example, shorter-wavelength light (e.g., blue light) generated by a light source may be converted to longer-wavelength light (e.g., green or red light) using, for example, color phosphors or quantum dots. Therefore, a display panel may use an array of blue micro-LEDs and different phosphors or quantum dots to convert some blue micro-LEDs into green and red micro-LEDs. However, these color conversion techniques may have a low lifetime, such as a poor quantum dot lifetime. In addition, it is difficult to achieve small pixel pitches, such as pixel pitches less than about 5 µm, using these color conversion techniques. Furthermore, the color conversion efficiency for small pixel pitch displays may be very low. In some cases, distributed Bragg reflector (DBR) structures may also be needed to block the leakage of unconverted blue light. Therefore, these color conversion techniques may not be suitable for displays with small pixel pitches.

In some micro-LED devices, green quantum wells may be grown on top of or beside blue quantum wells, for example, using a regrowth process. However, the quality and quantum efficiencies of such micro-LED devices may be very low. In addition, red micro-LEDs may not be incorporated into the micro-LED devices using the same techniques.

According to certain embodiments, an engineered wafer may include a porous semiconductor (e.g., GaN) layer that has different porosities in different regions. The different porosities in different regions of the porous semiconductor layer may cause different amounts of strain relaxation of a buffer layer (e.g., an InGaN layer) on the porous semiconductor layer. As such, different amounts of indium may be incorporated into the active regions grown on different regions of the porous semiconductor layer and the strain-relaxed buffer layer. The different amounts of indium in the active regions may cause different red shifts of the light emitted in the active regions. Therefore, the engineered wafer may be used to grow active regions of micro-LEDs that emit light in two or more different colors. As such, micro-LEDs that may emit light in different colors may be fabricated on a same wafer or in a same die, such that one or two micro-LED dies or display panels, rather than three micro-LED dies or display panels, can be used to generate color images.

The different porosities in different regions of the porous semiconductor layer may be achieved through selective porosification of a doped semiconductor layer grown on the substrate of the engineered wafer. For example, different regions of the doped semiconductor layer may be subjected to a porosity treatment process (e.g., an electrochemical etching process) for different durations. In another example, different regions of the doped semiconductor layer may have different doping densities, and thus may have different porosities after a same porosity treatment process.

Techniques disclosed herein can also be used to make other devices that are in a same die or on a same wafer but have different optical properties. For example, DBRs may be made using porous semiconductor layers and other layers. The refractive index of a porous semiconductor layer in a DBR may be a function of the porosity of the porous semiconductor layer. Therefore, DBRs for different wavelength bands may be formed on a same wafer or a same die by selective porosification of doped semiconductor layers in different regions to achieve desired porosities and refractive indexes in the porosified semiconductor layers. The DBRs for different wavelength bands may be used to make resonant-cavity micro-LEDs that emit light in different colors, or may be used to form cavities for converting light emitted in the active regions into light of different colors. The DBRs for different wavelength bands may also be used to make multi-color vertical-cavity surface-emitting lasers (VCSELs) in a same die or on a same wafer.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "LED array precursor" refers to an LED die or wafer that does not have the opposing electrical contacts and/or the associated driver circuitry for each LED such that a driving voltage or current may be applied to the LED for the LED to emit light. For example, an LED array precursor may be a wafer or die with an epitaxial layer stack that may or may not include the light emitting regions, a wafer or die with mesa structures formed in the epitaxial layer stack, a wafer or die with LED arrays and metal contacts formed thereon but without the driver circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor.

The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
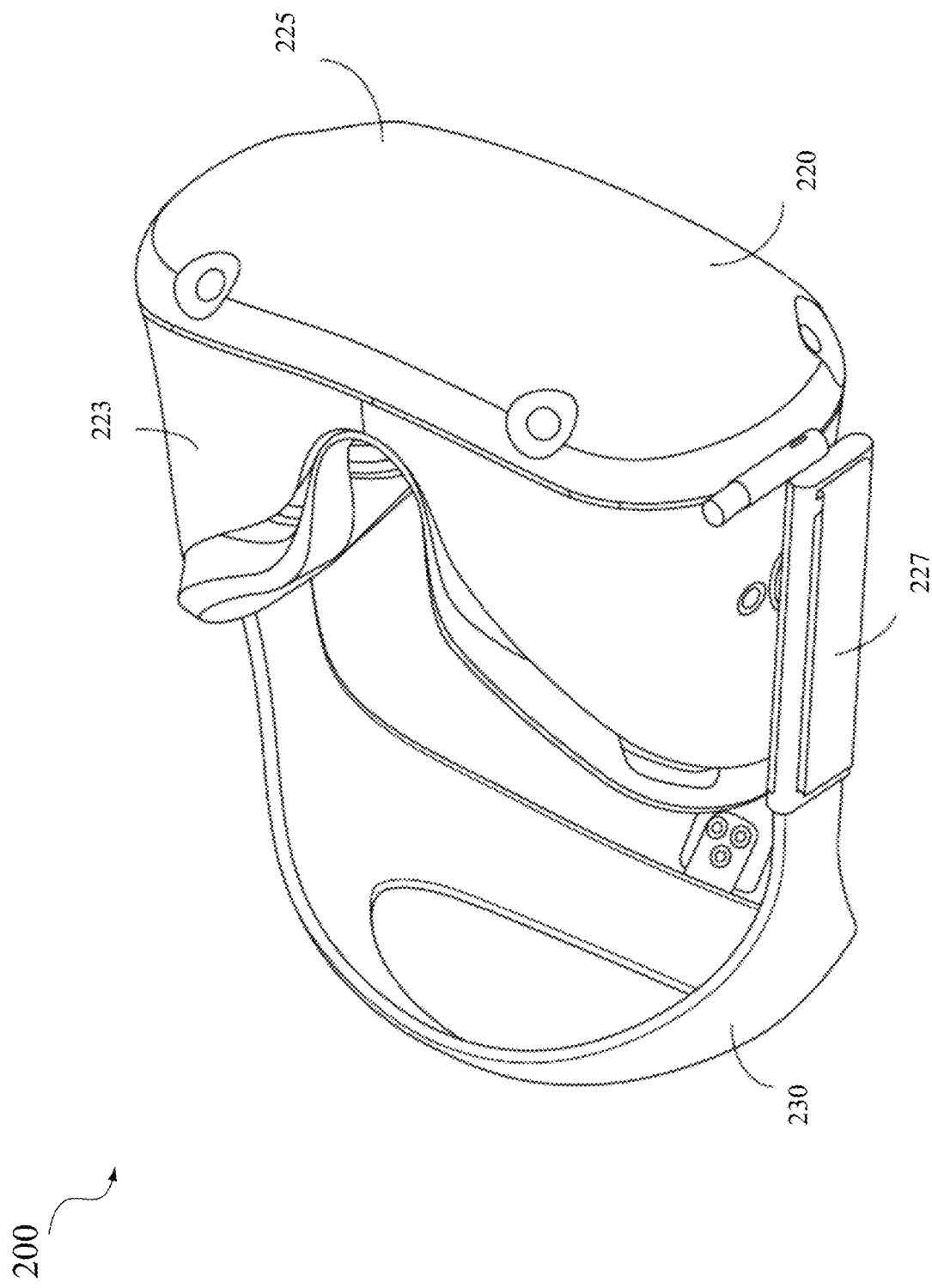
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
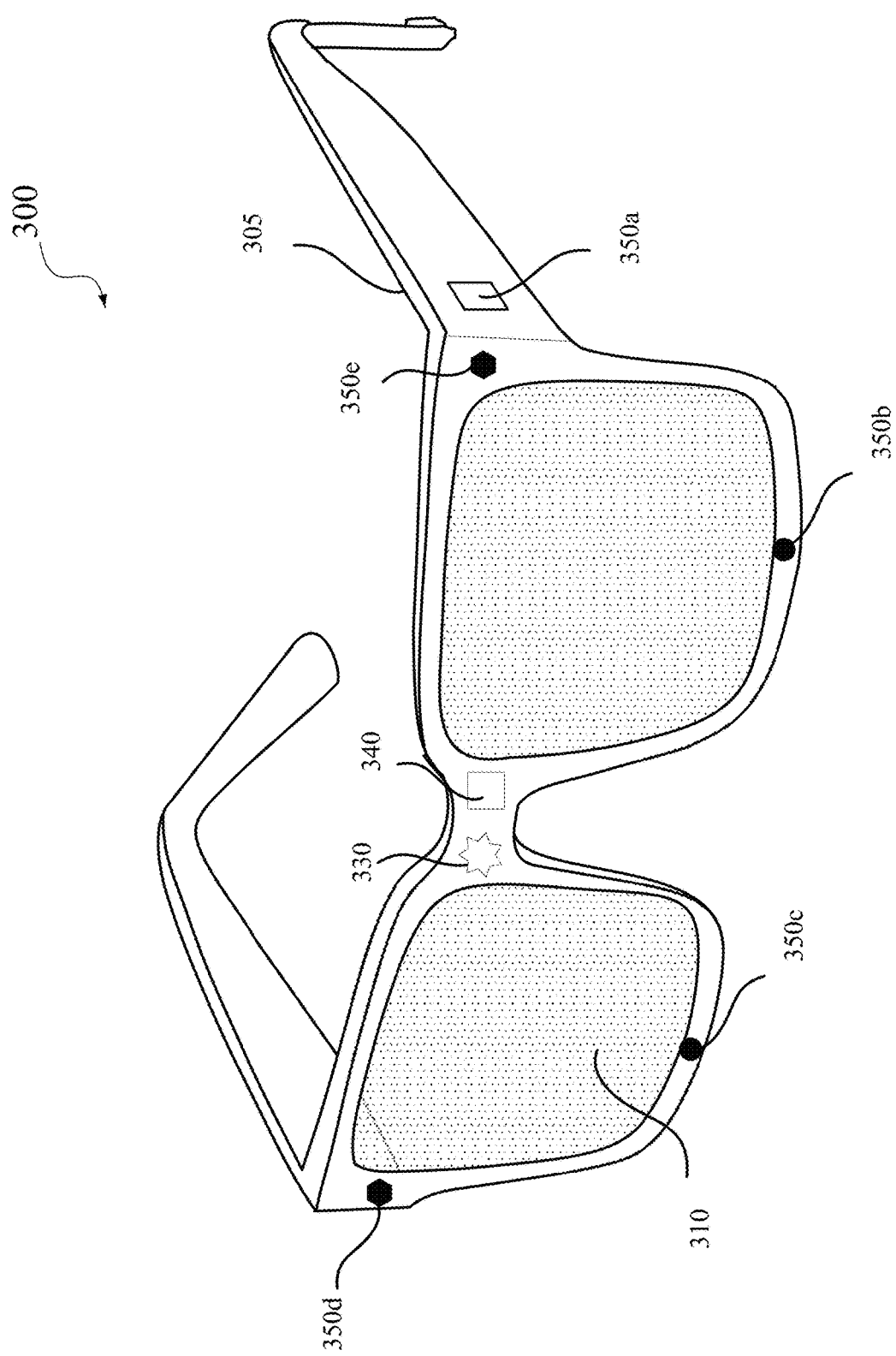
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
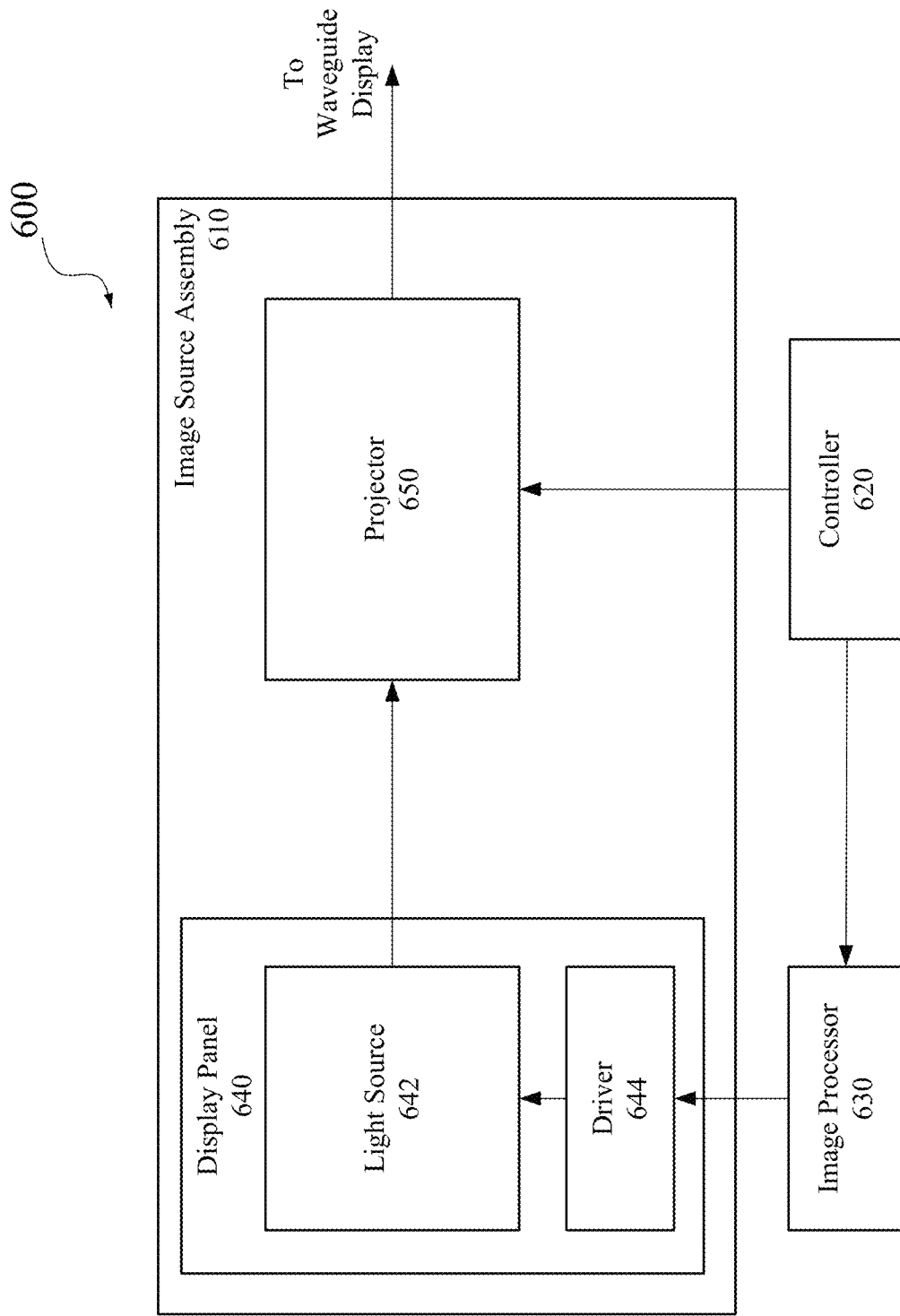
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
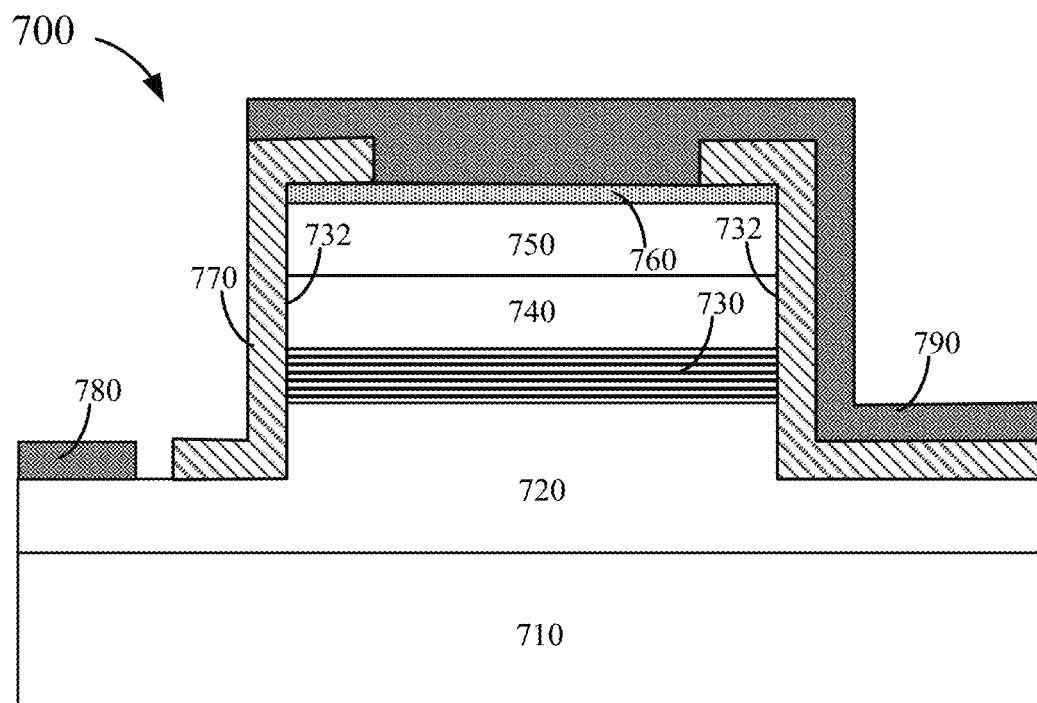
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
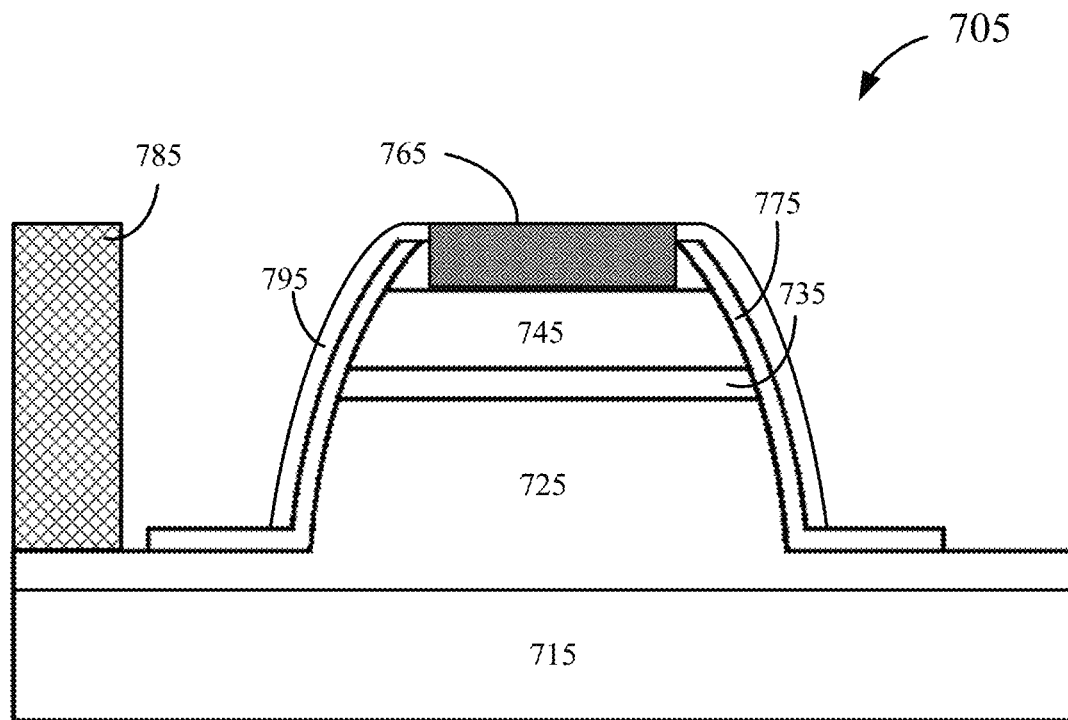
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

The quantum efficiency of LEDs may depend on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites, and electron-electron-hole (eeh) and/or electron-hole-hole (ehh) Auger recombination that involves three carriers. At the mesa sidewalls, the defect density of the active region may be very high due to the abrupt ending of the lattice structure, chemical contamination, structural damages (e.g., due to dry etch), and the like. Therefore, the non-radiative recombination rate may be high at the mesa sidewalls. In small LEDs, a larger proportion of the injected carriers may diffuse to regions near the mesa sidewalls and may be subject to a higher SRH recombination rate. This may cause the peak efficiency of the LED to decrease and/or cause the peak efficiency operating current to increase. Increasing the current injection may cause the efficiencies of the micro-LEDs to drop due to the higher eeh or ehh Auger recombination rate at a higher current density.

For traditional, broad area LEDs used in lighting and backlighting applications (e.g., with a lateral device area about 0.1 mm$^2$ to about 1 mm$^2$), the sidewalls are at the far ends of the devices. The devices can be designed such that little or no current is injected into regions within a minority carrier diffusion length from the mesa sidewalls, and thus the sidewall surface area to volume ratio and the overall rate of SRH recombination may be low. However, in micro-LEDs where the lateral size (e.g., a diameter or side) of the mesa structure of each micro-LED may be comparable to the minority carrier diffusion length, a larger proportion of the active region may be within a distance less than the minority carrier diffusion length from the mesa sidewalls. The increased surface area to volume ratio may lead to a high carrier surface recombination rate, because a greater proportion of the total active region may fall within the minority carrier diffusion length from the LED sidewalls. Therefore, more injected carriers may be subject to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 µm×100 µm×2 µm mesa, the side-wall surface area to volume ratio may be about 0.04. However, for a second LED with a 5 µm×5 µm×2 µm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be significantly lower than the first LED.

FIG. 8A illustrates an example of a micro-LED 800 with a mesa structure 805. Micro-LED 800 may be an example of LED 700 or 705. Micro-LED 800 may include an n-type semiconductor layer 820 epitaxially grown on a substrate 810 that may be similar to substrate 710 or 715. In one example, substrate 810 may include a GaN substrate or a sapphire substrate with a buffer layer, and n-type semiconductor layer 820 may include a GaN layer doped with, for example, Si or Ge. In another example, substrate 810 may include a GaAs substrate. In the illustrated example, n-type semiconductor layer 820 may be partially etched during a mesa formation process after the epitaxially layers are grown, where mesa structure 805 may include at least a portion 830 of n-type semiconductor layer 820. One or more epitaxial layers, such as GaN barrier layers and InGaN quantum well layers, or AlGaInP barrier layers and GaInP quantum well layers, may be grown on n-type semiconductor layer 820 to form active layers 840 that includes one or more quantum wells. A p-type semiconductor layer 850 may be grown on active layers 840. P-type semiconductor layer 850 may be doped with, for example, Mg, Ca, Zn, or Be. The layer stack may then be etched to form individual mesa structures 805 that each include a p-type semiconductor region, an active region that includes active layers 840, and an n-type semiconductor region. Mesa structure 805 may have a lateral linear dimension less than about 100 µm, less than about 50 µm, less than about 20 µm, less than about 10 µm, less than about 5 µm, less than about 3 µm, less than about 2 µm, or smaller. P-contacts 860 and n-contacts 870 may be formed on the p regions and the exposed n regions of n-type semiconductor layer 820. Each p-contact 860 may include, for example, a metal layer (e.g., Al, Au, Ni, Ti, or any combination thereof), or an indium tin oxide (ITO) and/or Al/Ni/Au film. In some embodiments, p-contact 860 may form a metal reflector to reflect emitted light towards n-type semiconductor layer 820. Each n-contact 870 may also include a layer of a metal material, such as Al, Au, Ni, Ti, or any combination thereof.

Even though not shown in FIG. 8A, a passivation layer, such as an oxide layer (e.g., a SiO$_2$ layer) or another dielectric layer, may be formed on sidewalls of mesa structure 805. The passivation layer may have a lower refractive index than the active region and may function as a reflector (e.g., due to total internal reflection) to reflect certain emitted light out of micro-LED 800 as described above. As described above, in some embodiments, a metal layer may be formed on the passivation layer to form a sidewall metal reflector. Even though FIG. 8A shows a vertical mesa structure 805, micro-LED 800 may have a different mesa shape, such as a conical, parabolic, inward-tilted, or outward-tilted mesa shape.

When a voltage or current signal is applied to p-contact 860 and n-contact 870, holes and electrons may be injected into active layers 840 from p-type semiconductor layer 850 and portion 830 of n-type semiconductor layer 820, respectively. The electrons and holes may recombine in the quantum wells of active layers 840, where the recombination of electrons and holes may cause photon emission. The emitted photons may be reflected by the passivation layer and/or the metal reflector, and may exit micro-LED 800 from the bottom (e.g., n-type semiconductor layer 820 side) or the top (e.g., p-contact 860 side). At the sidewalls of the mesa structure, active layers 840 may have a higher density of defects, such as dislocations, dangling bonds, pores, grain boundaries, vacancies, inclusion of precipitates, and the like, due to the abrupt ending of the lattice structure and the etching. Thus, holes and electrons injected into the quantum wells of active layers 840 may recombine at the defect sites, without generating photons. As such, there may be a high leakage at the mesa side wall, and the internal/external quantum efficiency of micro-LED 800 may be low, at least due to the losses caused by the non-radiative surface recombination.

FIG. 8B illustrates a simplified energy band structure of the active layers in the active region of the example of micro-LED 800 shown in FIG. 8A. A curve 880 in FIG. 8B shows the conduction band of the active region and a curve 890 shows the valence band of the active region. The active region of micro-LED 800 may include multiple quantum well layers each sandwiched by two barrier layers. In the example shown in FIG. 8B, the conduction band and the valence band of a barrier layer are shown by a level 882 and a level 892, respectively, and the conduction band and the valence band of a quantum well layer are shown by a level 884 and a level 894, respectively. As illustrated, the quantum well layer may have a lower bandgap between the conduction band and the valence band than the barrier layer. Thus, carriers (electrons and holes) injected into the active region may be confined by the energy barriers to the quantum well layers, where the electrons and holes may recombine to emit light. The wavelength of the emitted light may depend on the bandgap of the light emitting layers (e.g., the quantum well layers). For example, in an InGaN LED, the energy bandgap of the barrier layers (e.g., GaN layer) may be higher than the energy bandgap of the quantum well layers (e.g., InGaN layers), which may decrease (and thus the wavelength of the emitted light may increase) as the proportion of Indium in InGaN increases.

Figure 9:
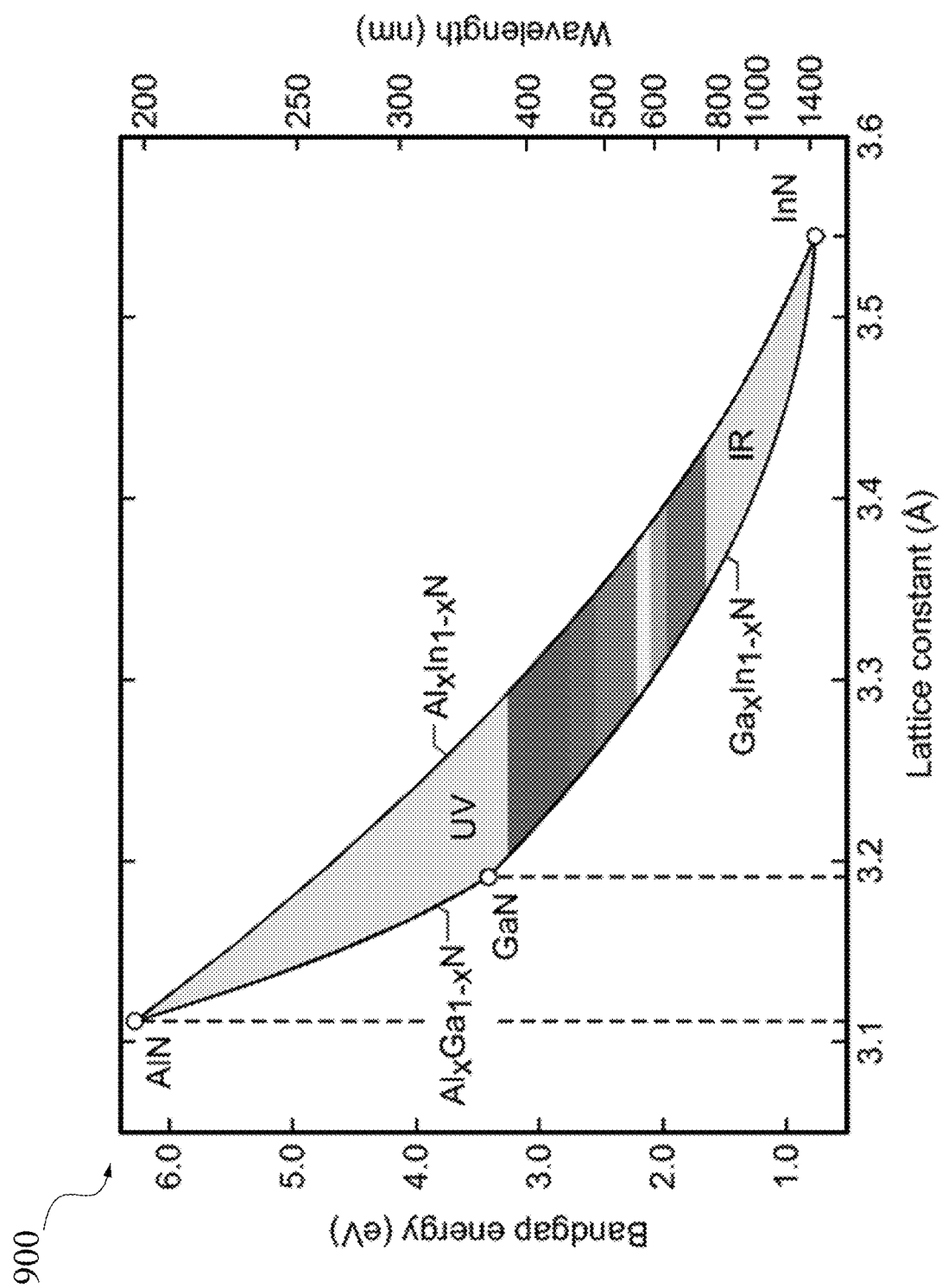
FIG. 9 illustrates lattice constants and bandgap energy of examples of III-V semiconductor materials.

FIG. 9 includes a chart 900 illustrating lattice constants and bandgap energy of examples of III-nitride semiconductor materials. The horizontal axis of chart 900 represents the lattice constants (in Angstroms) of different III-nitride semiconductor materials, such as InN, GaN, AlN, $Ga_xIn_{1-x}N$, $Al_xGa_{1-x}N$, and $Al_xIn_{1-x}N$. The primary vertical axis of chart 900 represents the bandgap energy of the different III-nitride semiconductor materials, while the secondary axis of chart 900 represents the corresponding wavelengths of the light emitted by the different III-nitride semiconductor materials.

As illustrated, $Ga_xIn_{1-x}N$ materials with different Indium concentration levels may have different lattice constants and bandgap energy, and thus may emit light of different wavelengths or colors. A $Ga_xIn_{1-x}N$ material with a higher proportion of Indium (smaller x) may have a lower bandgap energy. Therefore, the $Ga_xIn_{1-x}N$ material with a higher proportion of Indium may emit light with a longer wavelength. As such, to emit red light, a $Ga_xIn_{1-x}N$ material with a high proportion of Indium may be used.

As also illustrated in FIG. 9, $Ga_xIn_{1-x}N$ material with a higher proportion of indium (smaller x) may also have a larger lattice constant, and thus a larger lattice constant mismatch with the GaN material that may be used as the barrier layer. The lattice constant mismatch may cause strain in the materials and may make it difficult to grow crystalline structures with high quality (e.g., low defect density). Thus, the growth of InGaN alloys may be challenging due to the trade-off between the quality of the epitaxial layer and the amount of indium incorporated into the alloy. The indium incorporation in InGaN materials may be enhanced by decreasing the growth temperatures, for example, from about 850° C. to about 500° C. However, InGaN materials may need to be grown at a high temperature, for example, about 800° C. or higher, to achieve high crystalline quality. But a low amount of indium may be incorporated into the InGaN materials at the high temperature because of the high volatility of nitrogen over InN. These difficulties may be caused by, for example, the difference in inter-atomic spacing or lattice constants between GaN and InN.

According to certain embodiments, to improve the quality of the InGaN alloys grown on a GaN layer, the GaN layer may be etched to become porous to relax the strain in the InGaN layers caused by the lattice constant mismatch. The relaxation of strain may enable higher indium incorporation. The GaN layer may be made porous through, for example, an electrochemical (EC) etching or photo-electrochemical etching (PEC) process. For example, a process for forming porous gallium nitride may include exposing heavily-doped gallium nitride to an electrolyte that includes an etchant, such as an acid or alkali solution (e.g., $HNO_3$, HF, HCl, $H_2O_2$, $H_2SO_4$, NaOH, or KOH). The heavily-doped gallium nitride may have an n-type (e.g., Si or Ge) doping density between, for example, about $5 \times 10^{19}$ cm$^{-3}$ and to about $2 \times 10^{20}$ cm$^{-3}$. An electrical bias may then be applied between the etchant and the heavily-doped gallium nitride. The heavily-doped gallium nitride may be etched, for example, according to $2GaN + 6 h^+ \rightarrow 2Ga^{3+} + N_2$, where the $Ga^{3+}$ ions may dissolve in the electrolyte.

FIG. 10A illustrates an example of a setup 1000 for fabricating porous semiconductor material layers using electrochemical etching (EC) according to certain embodiments. Setup 1000 may include a container 1010 that contains an electrolyte 1020, such as an acid or alkali solution including, for example, Oxalic acid ($C_2H_2O_4$), $HNO_3$, HF, HCl, $H_2O_2$, $H_2SO_4$, NaOH, or KOH. A layer stack including a substrate 1030, heavily doped n$^+$-GaN layers 1032, and non-intentionally doped GaN layers 1034 may be placed in electrolyte 1020. An anode 1042 (e.g., a platinum layer) may be formed on or attached to the layer stack, and a cathode 1044 (such as a platinum foil) may be immersed in electrolyte 1020. A DC bias may be applied to the layer stack by a power supply 1040 through anode 1042, cathode 1044, and electrolyte 1020. Thus, the EC etching process may be carried out in a constant voltage mode (e.g., with a DC bias of a few volts), and may controlled by monitoring the etching current using a current meter 1050. The EC etching process can be carried at room temperature without using UV illumination.

The EC etching process may include the oxidation of n$^+$-GaN layers 1032 by the localized injection of holes due to the application of a positive DC bias. The oxide layer may be locally dissolved in an acid-based electrolyte, thereby forming the mesoporous structure. The etching may primarily occur at the electrolyte-semiconductor interfaces. The etching process may end when the current monitored by current meter 1050 drops to a base line level, indicating that the n$^+$-GaN layers have been etched and transformed into mesoporous GaN layers. The density and size of the porosity may be controlled by, for example, varying the concentration of the solution, the applied current, the etching duration, the n-type doping density, the thickness of the n$^+$-GaN layers, and the like.

FIG. 10B includes a scanning electron microscopy (SEM) image 1002 of an example of a layer stack including porous GaN layers after the EC etching process described above according to certain embodiments. The layer stack may include n$^+$-GaN layers 1032 and non-intentionally doped GaN layers 1034 as described above. The cross-sectional SEM image 1002 shows the morphology of the porous n$^+$-GaN layer 1032 after the EC etching process. SEM image 1002 shows that the porosification process can proceed uniformly across the entire area immersed in the etching solution and the etched layer morphology is mesoporous. SEM image 1002 also shows that only n$^+$-GaN layers 1032 are selectively etched and transformed into mesoporous layers, while non-intentionally doped GaN layers 1034 may stay approximately intact during the electrochemical etching.

FIG. 10C includes a chart 1004 illustrating an example of redshift of an example of a quantum well grown on a porous GaN layer according to certain embodiments. In FIG. 10C, a curve 1060 shows the emission spectrum of an InGaN quantum well grown on a GaN layer, where the central wavelength of the emission spectrum may be about 500 nm. A curve 1062 in FIG. 10C shows the emission spectrum of an InGaN quantum well grown on a porous GaN layer, where the central wavelength of the emission spectrum may be close to 550 nm. With a higher porosity of the porous GaN layer, more indium may be incorporated into the InGaN quantum well grown on the porous GaN layer, and thus the central wavelength of the emission spectrum may be further shifted towards the longer wavelength.

GaN materials may have a much lower surface recombination velocity (e.g., less than about $0.5 \times 10^5$ cm/s) than phosphide semiconductor materials such as AlGaInP material (e.g., with a surface recombination velocity about $10^6$ cm/s). In addition, nitride LEDs can operate at non-equilibrium carrier concentrations much higher than phosphide LEDs, which may result in considerably shorter carrier lifetime in nitride LEDs. Therefore, the carrier diffusion lengths in the active regions of III-nitride LEDs may be considerably shorter than the carrier diffusion lengths in phosphide LEDs. As such, III-nitride LEDs, such as InGaN micro-LEDs, may have both lower surface recombination velocities and shorter carrier diffusion lengths, and thus may have much lower surface recombination and efficiency reduction than phosphide LEDs, such as AlGaInP-based red micro-LEDs. For at least these reasons, InGaN red micro-LEDs (e.g., grown on porous GaN templates) may have higher efficiencies than phosphide LEDs, especially for devices with lateral sizes less than about 20 μm, such as less than about 10 μm, less than about 5 μm, or less than about 3 μm.

FIGS. 11A-11E illustrate an example of a red micro-LED device fabricated on a porous GaN layer and an example of a method of fabricating the red micro-LED according to certain embodiments. FIG. 11A shows a layer stack 1100 including a substrate 1110 and multiple epitaxial layers grown on substrate 1110. Substrate 1110 may be a substantially planar substrate. Substrate 1110 may have an in-plane lattice constant that is close to the in-plane lattice constants of the epitaxial layers to be grown on the substrate, in order to reduce the lattice mismatch. For example, as described above, substrate 1110 may be a sapphire substrate or a silicon substrate. In the illustrated example, a buffer layer 1120 may be formed on substrate 1110 to provide a substrate surface suitable for the formation of III-nitride layers. In one example, substrate 1110 and buffer layer 1120 may be configured such that a (0001) crystal plane of an epitaxial layer grown on the substrate may be aligned with the broad surface of substrate 1110. As such, the epitaxial layer may have a (0001) crystal plane orientation. As illustrated in FIG. 11A, an n-GaN layer 1130 may be epitaxially grown on buffer layer 1120, using any suitable process such as an MOCVD process or an MBE process described above. In the illustrated example, n-GaN layer 1130 may have an n-doping (e.g., Si or Ge doping) density about $5 \times 10^{18}$ cm$^{-3}$.

An n$^+$-GaN layer 1140 may then be epitaxially grown on n-GaN layer 1130. The n$^+$-GaN layer 1140 may be formed using any suitable process, such as a MOCVD process or a MBE processes. The n$^+$-GaN layer 1140 may have a doping density (i.e., donor density due to the n-doping) greater than the donor density of n-GaN layer 1130. In some embodiments, the donor density of n$^+$-GaN layer 1140 may be greater than about $1 \times 10^{19}$ cm$^{-3}$, greater than about $3 \times 10^{19}$ cm$^{-3}$, greater than about $5 \times 10^{19}$ cm$^{-3}$, greater than about $7 \times 10^{19}$ cm$^{-3}$, or greater than about $1 \times 10^{20}$ cm$^{-3}$. In the illustrated example, n$^+$-GaN layer 1140 may have a doping density greater than about $5 \times 10^{19}$ cm$^{-3}$. The n$^+$-GaN layer 1140 may include any suitable donor dopants, such as Si and/or Ge. The n$^+$-GaN layer 1140 is provided with a relatively high donor density in order to allow for targeted formation of pores in the porosity treatment process described below. In some embodiments, n$^+$-GaN layer 1140 may have a thickness in the direction normal to the substrate of at least 50 nm, such as 100 nm or higher. In some embodiments, n$^+$-GaN layer 1140 may have a thickness less than about 2 μm.

Following the formation of n$^+$-GaN layer 1140, an intrinsic InGaN layer 1150 may be epitaxially grown on a major surface of n$^+$-GaN layer 1140. An in-plane lattice constant of an unstrained thin film having the composition of intrinsic InGaN layer 1150 may be greater than an in-plane lattice constant of an unstrained thin film having the composition of n$^+$-GaN layer 1140. As such, the difference in composition and lattice constant between n$^+$-GaN layer 1140 and intrinsic InGaN layer 1150 may result in compressive strain in intrinsic InGaN layer 1150. In the illustrated example, intrinsic InGaN layer 1150 may include In$_x$Ga$_{1-x}$N, where $0<X \leq 1$. In some embodiments, intrinsic InGaN layer 1150 may include In$_x$Ga$_{1-x}$N with $0.03<X \leq 0.2$. The indium content of intrinsic InGaN layer 1150 may be selected to provide an mesa surface with a desired in-plane lattice constant for growing active layers. Intrinsic InGaN layer 1150 may be formed without any intentional doping. Intrinsic InGaN layer 1150 may have a thickness of, for example, equal to or greater than about 50 nm but less than 10 μm, such as about 100 nm or about 1 μm.

FIG. 11B shows that, after the formation of intrinsic InGaN layer 1150, n$^+$-GaN layer 1140 may be subjected to a porosity treatment process (e.g., an electrochemical etching process) as described above to increase an areal porosity of n$^+$-GaN layer 1140 to at least 15%. In some embodiments, layer stack 1100 may be etched to form trenches or mesa structures in layer stack 1100 such that n$^+$-GaN layer 1140 may be accessible to the electrolyte and there may be room for intrinsic InGaN layer 1150 to relax (e.g., expand). During the electrochemical etching, n$^+$-GaN layer 1140, which may have a donor density greater than $5 \times 10^{18}$ cm$^{-3}$, may be subjected to the porosity treatment to increase the areal porosity. As described above, the high donor density of n$^+$-GaN layer 1140 allows the porosity treatment process to selectively increase the porosity of n$^+$-GaN layer 1140.

The porosity treatment may include subjecting layer stack 1100 to an electrochemical etching process. The electrochemical etching process may include submerging the monolithic layer stack 1100 in a bath of, for example, oxalic acid. Electrical connections may be made between the bath of oxalic acid and layer stack 1100. An electric current may pass between the electrical contacts, the oxalic acid bath, and the layer stack 1100, in order to electrochemically form pores within n$^+$-GaN layer 1140. In some embodiments, the oxalic acid bath may include an oxalic acid solution having a concentration of between 0.03M and 0.3M. In other embodiments, the oxalic acid bath may be substituted by other electrolytes, such as KOH or HCl. The level of electrical bias applied to the electrochemical etching process may depend on the electrochemical solution used and the relative dimensions of the bath and layer stack 1100. The electrochemical etching process may stop when the donor concentration of n$^+$-GaN layer 1140 is close to the donor concentration of n-GaN layer 1130 or after a certain time (e.g., about 30 minutes).

The porosity treatment process results in the formation, or an increase in the size of, pores present in n$^+$-GaN layer 1140 to form a porous GaN layer 1142. The porosity of porous GaN layer 1142 may be characterized by an areal porosity, which is the area fraction of pores present in a cross-section of the material (e.g., porous GaN layer 1142). In some embodiments, porous GaN layer 1142 may have an areal porosity of at least 15%. In some embodiments, porous GaN layer 1142 may have an areal porosity of at least 30%, at least 50%, at least 70%, or higher. Following the porosity treatment process, layer stack 10 may be subjected to a heat treatment process in order to relax intrinsic InGaN layer 1150.

FIG. 11C illustrates that the forming of porous GaN layer 1142 with a high porosity causes intrinsic InGaN layer 1150 to strain-relax to a greater degree during a subsequent thermal treatment process to become a relaxed InGaN layer 1152. For example, the intrinsic InGaN layer 1150 may expand by about 1% to about 2%. Thus, after the porosity treatment process and the thermal treatment process, layer stack 1100 may include n-GaN layer 1130, porous GaN layer 1142, and relaxed InGaN layer 1152 formed on buffer layer 1120 and substrate 1110. Layer stack 1100 may be used as a template or precursor for growing micro-LED devices. In some embodiments as shown in FIG. 11C, layer stack 1100, more specifically, n-GaN layer 1130, porous GaN layer 1142, and relaxed InGaN layer 1152, may be selectively etched to form individual mesa structures. For example, a masking layer may be selectively formed on the top surface of layer stack 10 to selectively etch layer stack 1100 to form mesa structures with desired sizes and pitches.

A growth mask layer may then be formed on sidewalls of the mesa structures formed in layer stack 1100 to prevent the growth on the sidewalls of the mesa structures in the subsequent epitaxial growth steps for growing the red micro-LED layers. The growth mask layer may include, for example, a dielectric layer, such as a SiO$_2$ layer. The growth mask layer may include apertures aligned with the top surface of each mesa structure. As such, the growth mask layer may cover the sidewall surfaces of each mesa structure, but may not cover the top surface of each mesa structure. Therefore, the growth mask layer may restrict the growth of the red micro-LED layers to the exposed top surface of each mesa structure. The growth mask layer may be formed by conformingly depositing the dielectric layer on surface of the mesa structures and then selectively etching the dielectric layer on the top surface of each mesa structure, or may be formed by forming a mask layer on the top surface of each mesa structure and depositing the dielectric layer, where the mask layer may block the deposition of dielectric layer on the top surface of each mesa structure and may be removed after the deposition to expose the top surface.

FIG. 11D shows a growth mask layer 1160 formed on mesa sidewalls and regions between the mesa structures. Growth mask layer 1160 may be formed as described above. The top surface of layer stack 1100, more specifically, the top surface of relaxed InGaN layer 1152, may be exposed to regrow red micro-LED layers thereon. Growth mask layer 1160 may include, for example, SiO$_2$, SiN, or any other suitable masking material such as a dielectric material. In the illustrated example, growth mask layer 1160 may include SiO$_2$, and may be formed on the sidewall surfaces of n-GaN layer 1130, porous GaN layer 1142, and relaxed InGaN layer 1152. Growth mask layer 1160 may have any desired thickness. In some embodiments, growth mask layer 1160 may have a thickness greater than about 50 nm and lower than about 500 nm in a surface normal direction of mesa sidewall surfaces.

After the formation of growth mask layer 1160, active layers of red micro-LEDs may be formed on the regrowth surface of layer stack 1100, such as the exposed top surface of each mesa structure. Due to the growth mask layer 1160, the regrowth may be restricted to the top surface of each mesa structure.

FIG. 11E shows that a monolithic active region 1170 is formed on the top surface of relaxed InGaN layer 1152 of each mesa structure. As illustrated, monolithic active region 1170 cover the top surface of each mesa structure. As described above, monolithic active region 1170 may include a plurality of layers, such as one or more barrier layers and one or more quantum well layers. Each layer of monolithic active region 1170 may include a III-nitride material, such as AlInGaN, AlGaN, InGaN, or GaN.

It is noted that, even though the mesa structures shown in FIGS. 11C-11E have a substantially vertical shape, the mesa structures may have other shapes, such as a parabolic shape, a conic shape, an inward-tilted shape, an outward-tilted shape, or the like.

As illustrated in FIG. 11E, the micro-LED devices formed using the processes described above may have sidewall growth in monolithic active region 1170, where the sidewall overgrowth region 1172 may have an undesired crystalline orientation and a high defect density, and may draw high leakage as described above. In addition, the drive current may need to pass through relaxed InGaN layer 1152, porous GaN layer 1142, and n-GaN layer 1130, which may be connected to an n-contact. Porous GaN layer 1142 may have a high resistance, and thus may significantly reduce the voltage and/or current applied to the active regions and the efficiency of the micro-LEDs.

According to certain embodiments, a red micro-LED array may include a porous GaN layer that has a porosity greater than, for example, about 50% or about 70%, such that an InGaN layer (e.g., functioning as a buffer layer) on the porous GaN layer may be strain-relaxed. As a result, high-temperature epitaxial growth can be performed to grow high-quality active layers (e.g., InGaN quantum well layers) on the porous GaN layer and the relaxed InGaN layer, while incorporating more indium into the InGaN layers during the high-temperature epitaxial growth. Therefore, high quality (e.g., low strain and low defect density) InGaN layers with high indium concentration may be grown on the porous GaN layer and the relaxed InGaN layer, and thus a large red shift of the wavelength of the emitted light into the red color region and a high quantum efficiency may be achieved. Furthermore, the current path between the n-contact and the active region is made to bypass the high-resistance porous GaN layer, and thus a low resistance path between the n-contact and the active region may be created in each micro-LED in the micro-LED array. In addition, the sidewall overgrowth regions at the sidewalls of the active region that have more defects and undesired crystalline orientations and thus can cause high leakage may be etched away in the processes disclosed herein. Therefore, the leakage at the mesa sidewalls may be reduced and the efficiency of the micro-LEDs may be improved.

According to one example of the processes disclosed herein, a red micro-LED array may be fabricated using three mesa etching steps. In the first mesa etching step, a layer stack (e.g., layer stack 1100) that includes an n-GaN layer (e.g., n-GaN layer 1130), a porous GaN layer (e.g., porous GaN layer 1142), and a relaxed InGaN layer (e.g., relaxed InGaN layer 1152) grown on a substrate may be etched to form large mesa structures. Each large mesa structure (also referred to herein as precursor mesa structure) may have a lateral dimension larger than the lateral dimension of an individual micro-LED to be formed. For example, each large mesa structure may be used to form multiple micro-LEDs, such as 4, 6, 8, 9, or more micro-LEDs. The formation of the large mesa structures may create space for InGaN layer relaxation and expansion to avoid bowing and subsequent buckling of the InGaN layer during the relaxation in a thermal treatment process. The large mesa structures with the relaxed InGaN layer at the growth surface may be used to regrow the active regions of the micro-LEDs, where the active regions grown on the large mesa structures may have a high indium concentration in the InGaN quantum well layers that may also have a low strain and a low defect density. The active regions may include sidewall overgrowth regions that may cause high leakage as described above. A second mesa etching step may be performed to remove the sidewall overgrowth regions. The second mesa etching step may also etch the large mesa structures including the overgrown active regions (and a p-contact layer) into individual mesa structures (also referred to herein as pixel mesa structures) for individual micro-LEDs. A dielectric layer may then be formed on the sidewalls of the active region (and sidewalls of the p-contact layer) of each pixel mesa structure. A third mesa etching step may include self-aligned etching of the pixel mesa structures down to the n-GaN layer. An n-contact layer may then be formed on the sidewalls of etched pixel mesa structure, where the n-contact layer may in physical contact with the relaxed InGaN layer, thereby bypassing the high-resistance porous GaN layer and forming a low-resistance current path between the n-contact layer and the active region in each micro-LED. More details of the structures of the micro-LEDs and the method of forming the micro-LEDs according to certain embodiments are described below.

Figure 12G:
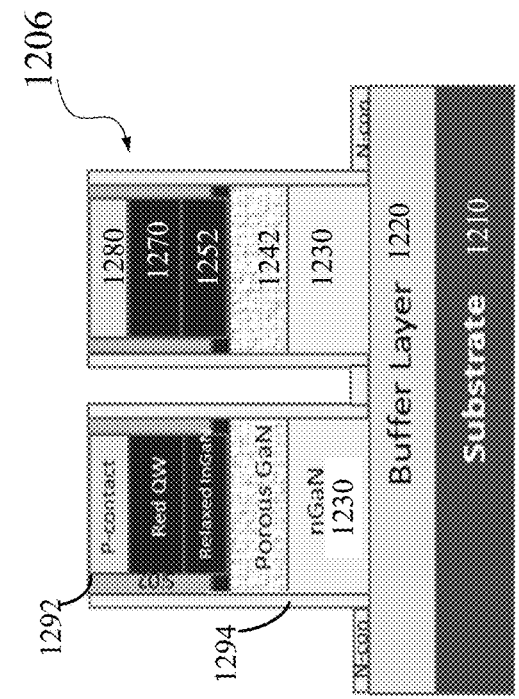

FIGS. 12A-12H illustrate an example of a method of fabricating red micro-LEDs on a porous GaN layer according to certain embodiments. FIG. 12A shows the layer stack of a mesa structure 1200. FIG. 12B shows the side view and the top view of mesa structure 1200. Mesa structure 1200 may be larger than the structure shown in FIG. 11D and may be used to form one or more smaller mesa structures for one or more micro-LEDs. Thus, mesa structure 1200 may be referred to herein as a precursor mesa structure, while the smaller mesa structure for a micro-LED may be referred to herein as pixel mesa structure. Mesa structure 1200 may include a substrate 1210, a buffer layer 1220, an n-GaN layer 1230, a porous GaN layer 1242, a relaxed InGaN layer 1252, and a dielectric layer 1260, which may be similar to substrate 1110, buffer layer 1120, n-GaN layer 1130, porous GaN layer 1142, relaxed InGaN layer 1152, and growth mask layer 1160, respectively, and may be formed by a process similar to the process described above with respect to FIGS. 11A-11D. For example, mesa structure 1200 may be formed by growing epitaxial layers on buffer layer 1220 on substrate 1210 (e.g., a sapphire wafer), forming porous GaN layer 1242 before or after a first mesa etching process that form large mesa structures, and forming dielectric layer 1260 on sidewalls of the large mesa structure. However, compared with the structure shown in FIG. 11D, mesa structure 1200 may have a size that is larger than a micro-LED to be fabricated. For example, as shown by the top view shown in FIG. 12B, mesa structure 1200 may have a rectangular shape or a square shape, and may have an area that may be used to make 2, 4, 6, 8, 9, or more micro-LEDs, such as an array of micro-LEDs that includes hundreds or thousands of micro-LEDs.

FIG. 12C shows the layer stack of a mesa structure 1202 that includes an active region 1270 formed on mesa structure 1200. FIG. 12D shows the side view and the top view of mesa structure 1202. Mesa structure 1202 may be similar to but may be larger than the structure shown in FIG. 11E, and may be formed by a process similar to the process described above with respect to FIG. 11A-11E. Compared with the structure shown in FIG. 11D, mesa structure 1202 may have a size that is larger than a micro-LED to be fabricated. For example, as shown by the top view shown in FIG. 12B, mesa structure 1200 may have a rectangular shape or a square shape, and may have an area that may be used to make 2, 4, 6, 8, 9, or more micro-LEDs, such as an array of micro-LEDs that includes hundreds or thousands of micro-LEDs. As shown in FIG. 12C, active region 1270 regrown on mesa structure 1200 that includes porous GaN layer 1242 and relaxed InGaN layer 1252 may have sidewall overgrowth regions 1272 that may have a high defect density and certain semi-polar lattice orientations.

Figure 12H:
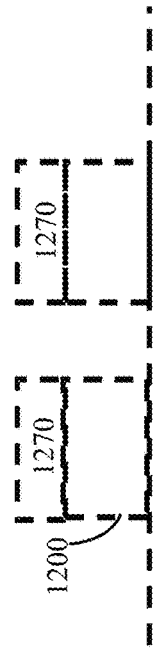
Figure 12E:
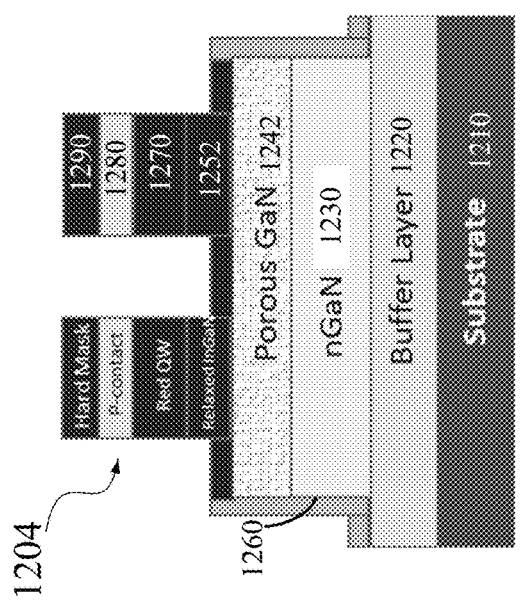
Figure 12F:
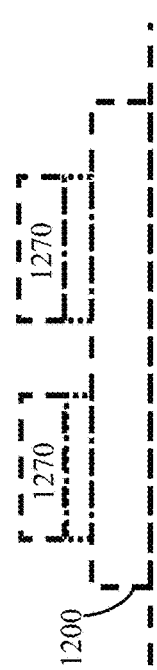

FIG. 12E shows multiple individual mesa structures 1204 formed in mesa structure 1202 described above. FIG. 12F shows the side view and the top view of individual mesa structures 1204 formed in mesa structure 1202. In the example shown in FIG. 12E, each individual mesa structure 1204 (also referred to as a pixel mesa structure) may also include a p-contact layer 1280, which may be formed (e.g., deposited) on active region 1270 of mesa structure 1202 after the growth of active region 1270 on mesa structure 1200. Each mesa structure 1204 may be used to fabricate one micro-LED. Individual mesa structures 1204 may be formed by selectively etching mesa structure 1202 in a second mesa etching process using a patterned etch mask layer 1290 to remove portions of mesa structure 1202. For example, as shown in FIG. 12F, a mesa structure 1202 may be etched to remove the sidewall overgrowth regions 1272 at the sidewalls of mesa structure 1202 and certain regions within mesa structure 1202 to form four mesa structures 1204 that may be arranged in a 2×2 array. In the example shown in FIG. 12E, each individual mesa structure 1204 may also include a p-contact layer 1280, but does not have the n-contact.

FIG. 12G shows multiple micro-LEDs 1206 formed in mesa structure 1202 described above. FIG. 12H shows the side view and the top view of micro-LEDs 1206 formed in mesa structure 1202. Each individual micro-LED 1206 may be formed from a mesa structure 1204. For example, a dielectric layer 1292 may be deposited on the surfaces of mesa structures 1204, and portions of dielectric layer 1292 on top of mesa structures 1204 may be etched away. A third mesa etching step may be performed using the patterned etch mask layer 1290 to etch through porous GaN layer 1242 and n-GaN layer 1230 to form individual mesa structures for individual micro-LEDs. An n-contact metal layer 1294 may be formed on sidewalls of the mesa structures and the regions between the mesa structures to form individual micro-LEDs 1206. Dielectric layer 1292 may isolate n-contact metal layer 1294 from p-contact layer 1280 and active region 1270.

As shown in FIG. 12G, each micro-LED 1206 may not include the sidewall overgrowth region 1272 described above. In addition, n-contact metal layer 1294 may provide a low resistance current path to active region 1270 by making sidewall contacts with relaxed InGaN layer 1252 that is next to active region 1270. Thus, little or no current may pass through the high resistance porous GaN layer 1242. It is noted that, even though the mesa structures shown in FIGS. 12A-12H have a substantially vertical shape, the mesa structures may have other shapes, such as a parabolic shape, a conic shape, an inward-tilted shape, an outward-tilted shape, or the like.

Figure 13C:
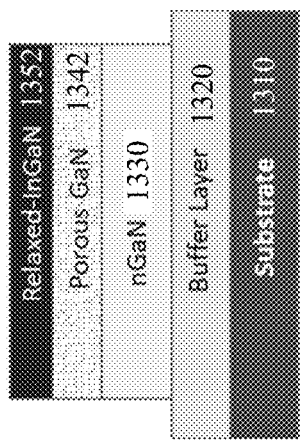
FIGS. 13A-13P illustrate an example of a method of fabricating red micro-LEDs on a porous GaN layer according to certain embodiments.
Figure 13F:
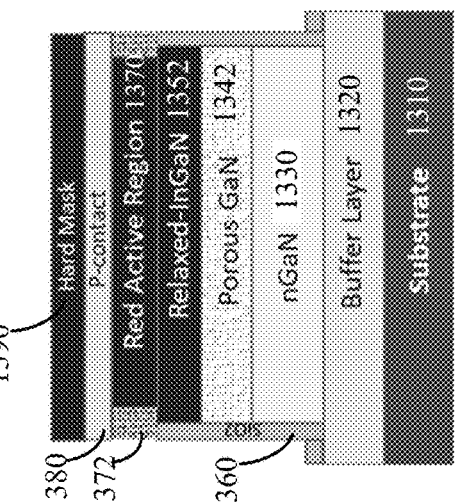
Figure 13B:
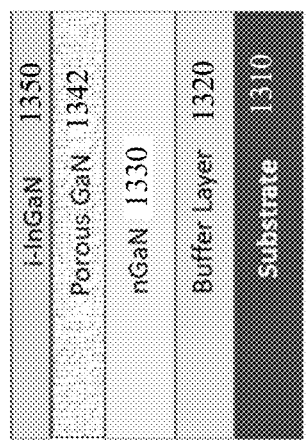
Figure 13E:
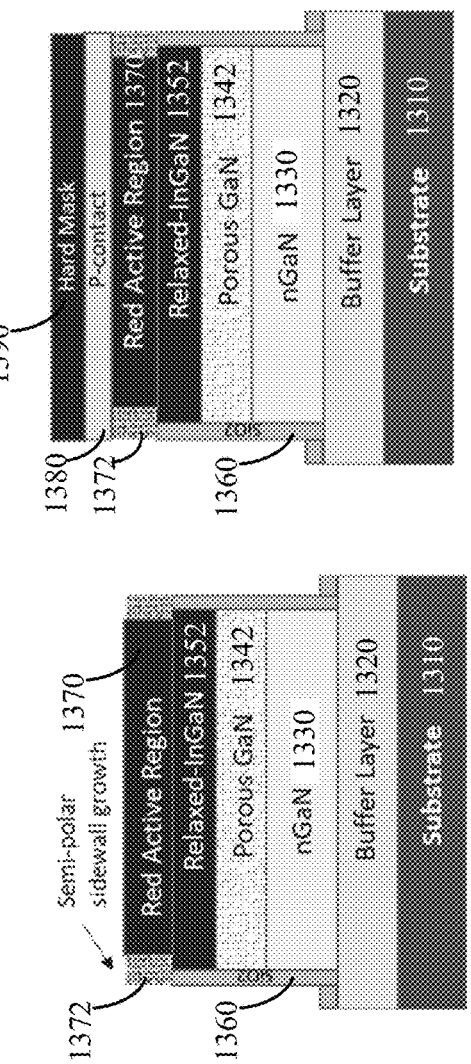
Figure 13A:
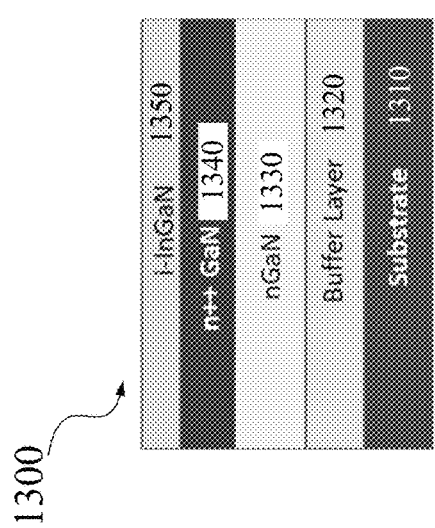
Figure 13D:
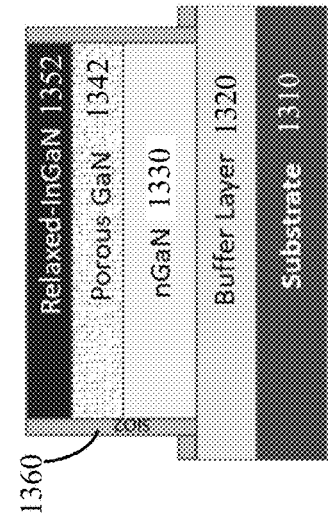
Figure 13M:
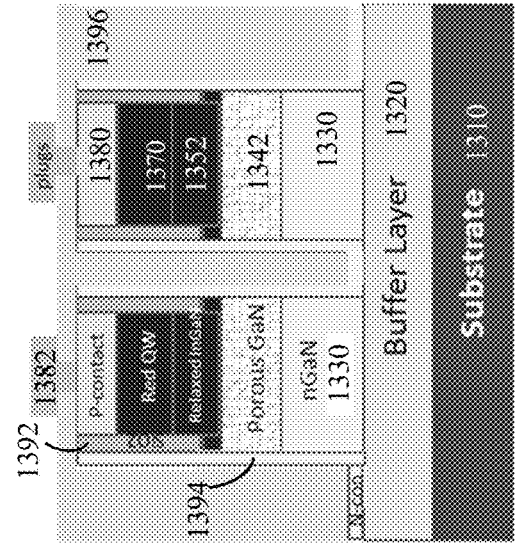
Figure 13N:
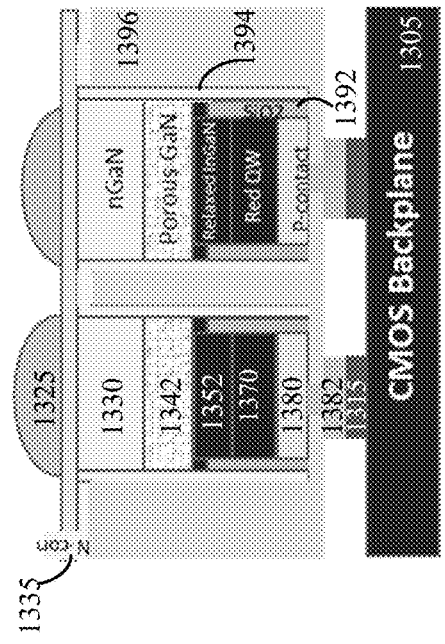
Figure 13O:
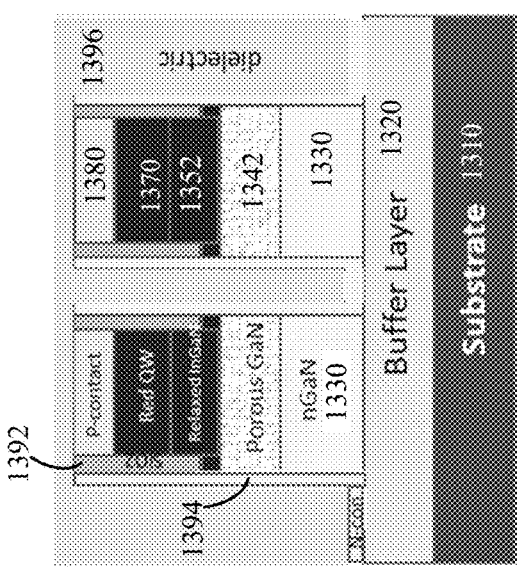
Figure 13P:
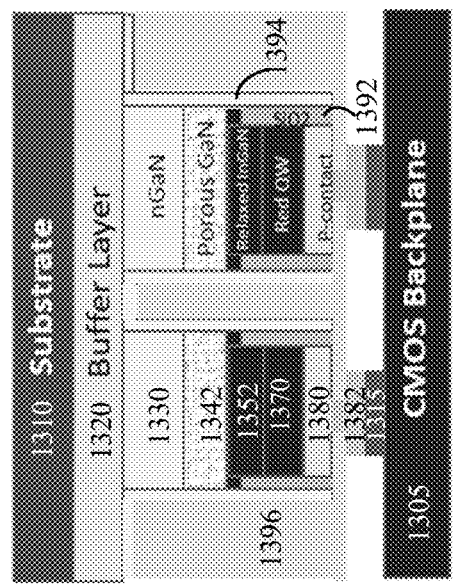

FIGS. 13A-13P illustrate more details of the example of the method of fabricating red micro-LEDs on a porous GaN layer shown in FIGS. 12A-12H according to certain embodiments. FIG. 13A shows a layer stack 1300 including a substrate 1310 and multiple epitaxial layers grown on substrate 1310. As substrate 1110, substrate 1310 may be a substantially planar substrate and may have an in-plane lattice constant that may be close to the in-plane lattice constants of the epitaxial layers to be grown, in order to reduce the lattice mismatch. For example, as described above, substrate 1310 may be a sapphire substrate or a silicon substrate. In the illustrated example, a buffer layer 1320 may be formed on substrate 1310 to provide a substrate surface suitable for the formation of III-nitride layers. As illustrated in FIG. 13A, an n-GaN layer 1330 may be epitaxially grown on buffer layer 1320, using any suitable process such as an MOCVD process or an MBE process as described above. In the illustrated example, n-GaN layer 1330 may have an n-doping (e.g., Si or Ge doping) density about $5 \times 10^{18}$ cm$^{-3}$.

An n$^+$-GaN layer 1340 may then be epitaxially grown on n-GaN layer 1330. The n$^+$-GaN layer 1340 may be formed using any suitable process, such as an MOCVD process or an MBE processes. The n$^+$-GaN layer 1340 may have a doping density greater than the doping density of n-GaN layer 1330. In some embodiments, the donor density of n$^+$-GaN layer 1340 may be greater than about $1 \times 10^{19}$ cm$^{-3}$, greater than about $3 \times 10^{19}$ cm$^{-3}$, greater than about $5 \times 10^{19}$ cm$^{-3}$, greater than about $7 \times 10^{19}$ cm$^{-3}$, or greater than about $1 \times 10^{20}$ cm$^{-3}$. In the illustrated example, n$^+$-GaN layer 1340 may have a doping density greater than about $5 \times 10^{19}$ cm$^{-3}$. The n$^+$-GaN layer 1340 may include any suitable donor dopants, such as Si and/or Ge. The n$^+$-GaN layer 1340 is provided with a relatively high donor density in order to allow for targeted formation of pores in the porosity treatment step described below. In some embodiments, n$^+$-GaN layer 1340 may have a thickness in the direction normal to the substrate of at least 50 nm or at least 100 nm. In some embodiments, n$^+$-GaN layer 1340 may have a thickness of less than about 2 μm. The thickness of n$^+$-GaN layer 1340 may affect the porosity of the porous GaN layer formed after the electrochemical etching.

Following the formation of n$^+$-GaN layer 1340, an intrinsic InGaN layer 1350 may be epitaxially grown on n$^+$-GaN layer 1340. The difference in composition between n$^+$-GaN layer 1340 and intrinsic InGaN layer 1350 may result in compressive strain in intrinsic InGaN layer 1350. In the illustrated example, intrinsic InGaN layer 1350 may include In$_x$Ga$_{1-x}$N, where 0<x≤1. In some embodiments, intrinsic InGaN layer 1350 may include In$_x$Ga$_{1-x}$N with 0.03<x≤0.2. The indium content of intrinsic InGaN layer 1350 may be selected to provide an mesa surface with a desired in-plane lattice constant. Intrinsic InGaN layer 1350 may be formed without any intentional doping. Intrinsic InGaN layer 1350 may have a thickness of, for example, greater than about 50 nm, 100 nm, or 200 nm but less than 10 μm, such as about 1 μm.

FIG. 13B shows that, after the formation of intrinsic InGaN layer 1350, n$^+$-GaN layer 1340 may be subjected to a porosity treatment process (e.g., an electrochemical etching process) in order to increase an areal porosity of n$^+$-GaN layer 1340 to at least 15%, such as at least 30%, at least 50%, at least 70%, or higher. In some embodiments, layer stack 1300 may be etched to form trenches or mesa structures in layer stack 1300 such that n$^+$-GaN layer 1340 may be accessible to the electrolyte and there may be room for intrinsic InGaN layer 1350 to relax (e.g., expand). During the electrochemical etching, n$^+$-GaN layer 1340, which may have a donor density greater than $5 \times 10^{18}$ cm$^{-3}$, may be subjected to the porosity treatment to increase an areal porosity of the second semiconducting layer. As described above, the high donor density of n$^+$-GaN layer 1340 allows the porosity treatment process to selectively increase the porosity of n$^+$-GaN layer 1340.

As describe above with respect to, for example, FIG. 10A, the porosity treatment may include subjecting layer stack 1300 to an electrochemical etching process. The electrochemical etching process may include submerging layer stack 1300 in a bath of, for example, oxalic acid. Electrical connections may be made between the bath of oxalic acid and layer stack 1300. An electric current may pass between the electrical contact in the oxalic acid bath and the electrical contact on layer stack 1300 in order to electrochemically form pores within n$^+$-GaN layer 1340. In some embodiments, the oxalic acid bath may include an oxalic acid solution having a concentration of between 0.03M and 0.3M. In other embodiments, the oxalic acid bath may be substituted by other electrolytes, such as KOH or HCl. The level of electrical bias applied to the electrochemical process may depend on the electrochemical solution used and the relative dimensions of the bath and layer stack 1300.

The porosity treatment process results in the formation, or an increase in the size of, pores present in n$^+$-GaN layer 1340 to form a porous GaN layer 1342. In some embodiments, porous GaN layer 1342 may have an areal porosity of at least 15%. In some embodiments, porous GaN layer 1342 may have an areal porosity of at least 30%, at least 50%, or at least 70%. Following the porosity treatment process, layer stack 1300 may be subjected to a heat treatment process in order to strain-relax intrinsic InGaN layer 1350.

FIG. 13C shows that the forming of porous GaN layer 1342 with a high porosity may cause intrinsic InGaN layer 1350 to strain-relax to a greater degree during a subsequent thermal treatment process to become a relaxed InGaN layer 1352. Thus, after the thermal treatment and relaxation, layer stack 1300 may include n-GaN layer 1330, porous GaN layer 1342, and relaxed InGaN layer 1352 formed on buffer layer 1320 and substrate 1310. Layer stack 1300 may be used as a template or precursor for growing micro-LED devices. In some embodiments as shown in FIG. 13C, layer stack 1300, more specifically, n-GaN layer 1330, porous GaN layer 1342, and relaxed InGaN layer 1352, may be selectively etched to form large mesa structures (also referred to as precursor mesa structures) in a first mesa etching process. For example, a masking layer may be selectively formed on the top surface of layer stack 1300 to selectively etch layer stack 1300 to form large mesa structures with desired sizes and pitches. As described above with respect to FIG. 12A, each large mesa structure may have a size that is larger than a micro-LED to be fabricated. For example, each large mesa structure may have a rectangular shape or a square shape, and may have an area that may be used to make 2, 4, 6, 8, 9, or more micro-LEDs, such as an array of micro-LEDs that includes hundreds or thousands of micro-LEDs.

FIG. 13D shows a growth mask layer 1360 formed on mesa sidewalls and regions between the large mesa structures. Growth mask layer 1360 may be formed as described above, and the top surface of layer stack 1300, more specifically, the top surface of relaxed InGaN layer 1352, may be exposed to regrow red micro-LED layers thereon. Growth mask layer 1360 may include, for example, SiO$_2$, SiN, or any other suitable growth masking material. In the illustrated example, growth mask layer 1360 may include SiO$_2$, and may be formed on the sidewall surfaces of n-GaN layer 1330, porous GaN layer 1342, and relaxed InGaN layer 1352. Growth mask layer 1360 may have any desired thickness. In some embodiments, growth mask layer 1360 may have a thickness greater than about 50 nm and lower than about 500 nm in a surface normal direction of the mesa sidewall surfaces. Growth mask layer 1360 may be formed by, for example, conformingly depositing a dielectric layer on surfaces of the large mesa structures and then selectively etching the dielectric layer on the top surface of each large mesa structure. After the formation of growth mask layer 1360, active layers of red micro-LEDs may be formed on the exposed top surface of each large mesa structure, such as the top surface of relaxed InGaN layer 1352. Due to the growth mask layer 1360, the regrowth may be restricted to the top surface of each large mesa structure.

FIG. 13E shows that a monolithic active region 1370 is formed on the top surface of relaxed InGaN layer 1352 of each large mesa structure. As illustrated, monolithic active region 1370 cover the top surface of each large mesa structure. As described above, monolithic active region 1370 may include a plurality of layers, such as an optional n-type semiconductor layer, one or more barrier layers, one or more quantum well layers, and an optional p-type semiconductor layer. Each layer of monolithic active region 1370 may include a III-nitride material, such as AlInGaN, AlGaN, InGaN, or GaN. As illustrated in FIG. 13E, the structure formed using the processes described above may have sidewall growth in monolithic active region 1370, where the sidewall overgrowth regions 1372 may have a semi-polar orientation and may have a high defect high density and high leakage as described above.

FIG. 13F shows that a p-contact layer 1380 may be formed on monolithic active region 1370. P-contact layer 1380 may include a transparent conducting oxide (e.g., ITO) and/or a metal layer, such as Al, Pt, Au, Ag, Ni, Ti, Cu, W, or any combination thereof (e.g., ITO/Ag/Pt/Au, Ag/Pt/Au, or Al/Ni/Au). P-contact layer 1380 may also form a light reflector for reflecting light emitted in monolithic active region 1370. An etch mask layer 1390 may be formed on p-contact layer 1380. Etch mask layer 1390 may include, for example, a photoresist layer or a dielectric layer, such as SiO$_2$ or SiN.

FIG. 13G shows that etch mask layer 1390 may be patterned using a lithography process to form an etch mask for etch individual mesa structures (also referred to as pixel mesa structures) for individual micro-LEDs. P-contact layer 1380 may be etched using etch mask layer 1390 to pattern p-contacts for individual micro-LEDs.

FIG. 13H shows that etch mask layer 1390 may be used to etch through active region 1370 and at least a portion of relaxed InGaN layer 1352 in a second mesa etching process. The etching may remove the sidewall overgrowth regions 1372 and form individual mesa structures. As described above, 2, 4, 6, 8, 9, or more mesa structures may be formed in each large mesa structures. Each individual mesa structure may include relaxed InGaN layer 1352, active region 1370, and p-contact layer 1380.

FIG. 13I shows that a dielectric layer 1392 may be conformally deposited on surfaces of the mesa structures (including patterned etch mask layer 1390) formed after the second mesa etching process. Dielectric layer 1392 may include, for example, SiO$_2$ or SiN. Dielectric layer 1392 may be formed on sidewalls of active region 1370 and may function as a passivation layer for active region 1370. Dielectric layer 1392 may also isolate patterned p-contact layer 1380.

FIG. 13J shows that dielectric layer 1392 on top surfaces of the individual mesa structures and on horizontal surfaces of relaxed InGaN layer 1352 may be etched away by an anisotropic vertical oxide etching process. Dielectric layer 1392 on side wall of the mesa structures may remain after the vertical oxide etching process.

FIG. 13K shows that a self-aligned anisotropic third mesa etching process may be performed using patterned etch mask layer 1390. The self-aligned third mesa etching process may vertically etch through relaxed InGaN layer 1352 and porous GaN layer 1342, and at least a portion of n-GaN layer 1330, such that growth mask layer 1360 on sidewalls of porous GaN layer 1342 and n-GaN layer 1330 may fall off or can be selectively removed. After the self-aligned third mesa etching process, etch mask layer 1390 may be removed, and individual mesa structures that each include n-GaN layer 1330, porous GaN layer 1342, relaxed InGaN layer 1352, active region 1370, p-contact layer 1380, and dielectric layer 1392 may be formed.

FIG. 13L shows that an n-contact layer 1394 may be formed on sidewalls of the mesa structures shown in FIG. 13K. N-contact layer 1394 may include a transparent conducting oxide (e.g., ITO) and/or a metal layer, such as Al, Pt, Au, Ag, Ni, Ti, Cu, W, or any combination thereof (e.g., ITO/Al, Ag/Pt/Au, or Al/Ni/Au). N-contact layer 1394 may be formed on sidewalls of the mesa structures by depositing n-contact layer 1394 on surfaces of the mesa structures and then remove the n-contact layer 1394 on the top surface of the mesa structures. As a result, individual micro-LEDs including n-contact layer 1394, relaxed InGaN layer 1352, active region 1370, and p-contact layer 1380 may be formed.

As shown in FIG. 13L, the micro-LEDs may not include the sidewall overgrowth regions 1372 described above. In addition, n-contact layer 1394 may provide a low resistance current path to active region 1370 by making sidewall contacts with relaxed InGaN layer 1352. Thus, little or no current may pass through the high resistance porous GaN layer 1242. As described above, active region 1370 grown on porous GaN layer 1342 and relaxed InGaN layer 1352 may incorporate more indium while achieving a good quality in the InGaN quantum well layers (e.g., low strain and low defect density). Thus, the micro-LEDs may emit red light with a high efficiency. It is noted that, even though the mesa structures shown in FIGS. 13C-13L have a substantially vertical shape, the mesa structures may have other shapes, such as a parabolic shape, a conic shape, an inward-tilted shape, an outward-tilted shape, or the like.

FIG. 13M shows that a dielectric layer 1396 may be coated on the micro-LEDs shown in FIG. 13L. Dielectric layer 1396 may include, for example, an oxide, such as SiO$_2$. Dielectric layer 1396 may fill the gaps between individual micro-LEDs.

FIG. 13N shows that metal plugs 1382 may be formed in dielectric layer 1396 to form p-electrodes and bonding pads for the p-electrodes, and/or n-electrodes and bonding pads for the n-electrodes. Metal plugs 1382 may be formed by etching trenches in dielectric layer 1396 and deposit a metal material in the trenches.

FIG. 13O shows that the wafer or die including the micro-LEDs formed on substrate 1310 may be bonded to a CMOS backplane 1305. CMOS backplane 1305 may include driving circuits formed thereon for controlling and driving the micro-LEDs. CMOS backplane 1305 may have bonding pads 1315 formed thereon. Bonding pads 1315 on CMOS backplane 1305 and metal plugs 1382 on the micro-LEDs may be bonded together. In some embodiments, the gap between the wafer or die including the micro-LEDs and the CMOS backplane 1305 may be filled with a non-conductive material, such as a dielectric material or an organic material (e.g., an epoxy or a resin). In some embodiments, the surface of CMOS backplane 1305 and the surface of the micro-LEDs may each include a dielectric layer and the two dielectric layers may also be bonded together in a hybrid bonding process that also bonds bonding pads 1315 on CMOS backplane 1305 and metal plugs 1382 on the micro-LEDs.

FIG. 13P shows that substrate 1310 may be removed (or thinned) from the bonded device and light extraction structures 1325 (e.g., micro-lenses) may be formed on top of n-GaN layer 1330. In some embodiments, light extraction structures 1325 may be etched in buffer layer 1320 or n-GaN layer 1330. In some embodiments, light extraction structures 1325 may be formed in a dielectric material layer (e.g., a $SiO_2$ or SiN layer) deposited on n-GaN layer 1330 after the removal of substrate 1310. In some embodiments, ITO-based transparent conducting n-contacts 1335 (e.g., n-electrodes) may be formed from the side of n-GaN layer 1330 to connect to n-contact layer 1394.

Figures 14A, 14B:
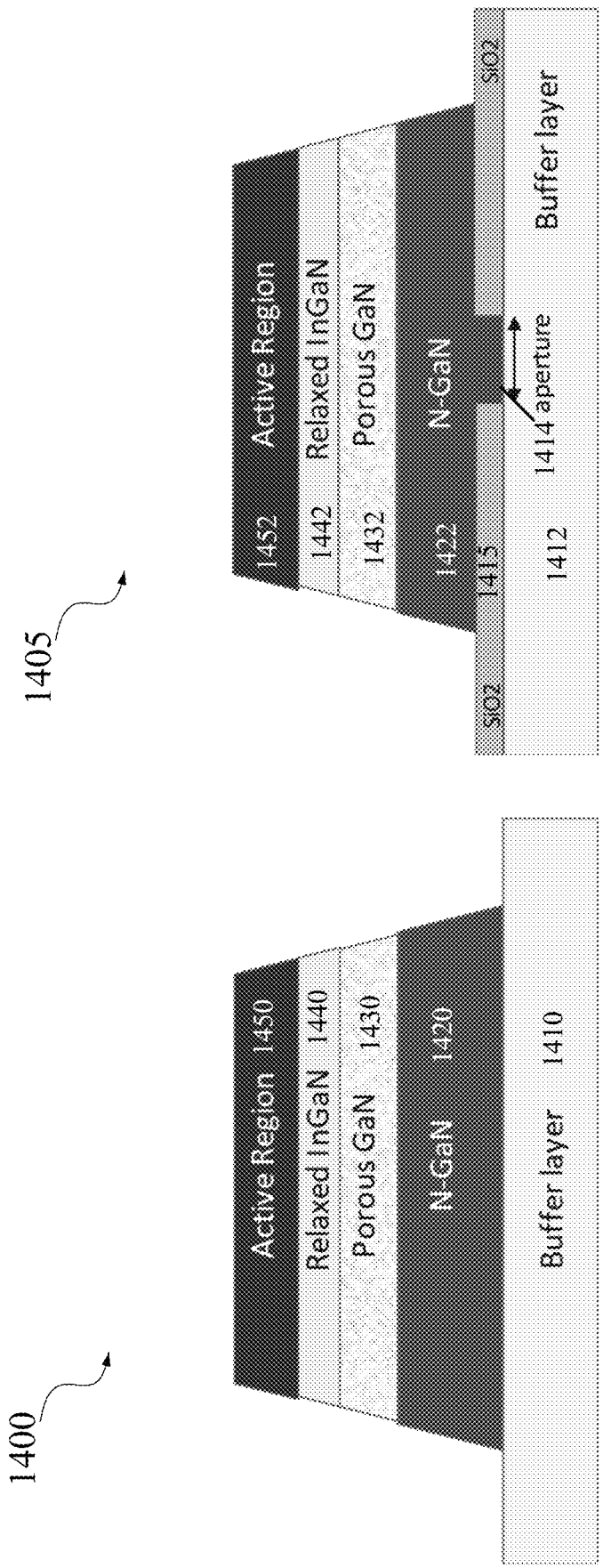
FIG. 14A illustrates an example of a red micro-LED mesa structure on a porous GaN layer according to certain embodiments.
FIG. 14B illustrates an example of a red micro-LED mesa structure on a porous GaN layer according to certain embodiments.

FIG. 14A illustrates another example of a red micro-LED mesa structure 1400 including a porous GaN layer 1430 according to certain embodiments. Red micro-LED mesa structure 1400 may be an example of a precursor mesa structure, and may include a buffer layer 1410, an n-GaN layer 1420, a porous GaN layer 1430, a relaxed InGaN layer 1440, and an active region 1450, which may be similar to buffer layer 1320, n-GaN layer 1330, porous GaN layer 1342, relaxed InGaN layer 1352, and active region 1370, respectively. In red micro-LED mesa structure 1400, active region 1450 may be grown on porous GaN layer 1430 and relaxed InGaN layer 1440 without using a growth mask layer (e.g., growth mask layer 1360) on sidewalls of porous GaN layer 1430 and relaxed InGaN layer 1440.

FIG. 14B illustrates another example of a red micro-LED mesa structure 1405 including a porous GaN layer 1432 according to certain embodiments. Red micro-LED mesa structure 1400 may be another example of a precursor mesa structure. In red micro-LED mesa structure 1405, a patterned dielectric layer 1415 may be formed on a buffer layer 1412. Patterned dielectric layer 1415 may include, for example, $SiO_2$ or SiN. Patterned dielectric layer 1415 may have a plurality of apertures 1414 formed therein. An n-GaN layer 1422, porous GaN layer 1432, a relaxed InGaN layer 1442, and an active region 1452 may be formed on buffer layer 1412 through an aperture 1414 to form a truncated pyramid-shaped mesa structure. For example, the epitaxial layers of n-GaN, $n^+$-GaN, and InGaN may be grown on buffer layer 1412 through aperture 1414. The epitaxial growth through individual apertures 1414 may form individual mesa structures. The $n^+$-GaN layer in each of the mesa structures may be electrochemically etched to form porous GaN layer 1432, such that the InGaN layer 1442 on porous GaN layer 1432 may be relaxed to reduce strain. Active region 1452 may then be grown on the relaxed InGaN layer 1442. In red micro-LED mesa structure 1405, active region 1452 may be grown on porous GaN layer 1432 and relaxed InGaN layer 1442 without using a growth mask layer on sidewalls of porous GaN layer 1432 and relaxed InGaN layer 1442.

In both red micro-LED mesa structure 1400 and red micro-LED mesa structure 1405, the porosification process may be a controlled etching process (e.g., based on the bias current measured by current meter 1050), where the electrochemical etching process may be stopped after the conductivity of the porous GaN layer formed by etching the $n^+$-GaN layer is approximately equal to the conductivity of the n-GaN layer beneath (e.g., n-GaN layer 1420 or 1422). It is noted that, even though the mesa structures shown in FIGS. 14A-14B have a certain shape, the mesa structures may have other shapes, such as a parabolic shape, a conic shape, a truncated pyramid shape, an inward-tilted shape, an outward-tilted shape, or the like. The processes for fabricating red micro-LED mesa structure 1400 and red micro-LED mesa structure 1405 are described in details below.

Figure 15A:
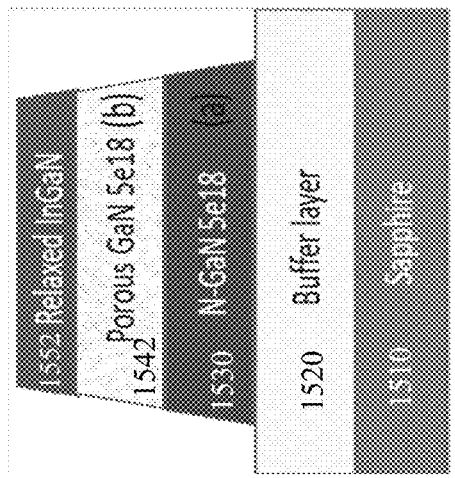
FIGS. 15A-15F illustrate an example of a method of fabricating the red micro-LED mesa structure shown in FIG. 14A according to certain embodiments.

FIGS. 15A-15F illustrate an example of a method of fabricating red micro-LED mesa structure 1400 shown in FIG. 14A according to certain embodiments. FIG. 15A shows a layer stack including a substrate 1510 and multiple epitaxial layers grown on substrate 1510. Substrate 1510 may be a substantially planar substrate and may have an in-plane lattice constant that is close to the in-plane lattice constants of the epitaxial layers to be grown, in order to reduce the lattice mismatch. For example, in the illustrated example, substrate 1510 may be a sapphire substrate. A buffer layer 1520 may be formed on substrate 1510 to provide a substrate surface suitable for the formation of III-nitride layers. As illustrated in FIG. 15A, an n-GaN layer 1530 may be epitaxially grown on buffer layer 1520 using any suitable process such as an MOCVD process or an MBE process as described above. In the illustrated example, n-GaN layer 1530 may have an n-doping (e.g., Si or Ge doping) density about $5 \times 10^{18}$ $cm^{-3}$.

An $n^+$-GaN layer 1540 may then be epitaxially grown on n-GaN layer 1530. The $n^+$-GaN layer 1540 may be formed using any suitable process, such as an MOCVD process or MBE processes. The $n^+$-GaN layer 1540 may have a donor density greater than the doping density of n-GaN layer 1530. In some embodiments, the donor density of $n^+$-GaN layer 1540 may be greater than about $1 \times 10^{19}$ $cm^{-3}$, greater than about $3 \times 10^{19}$ $cm^{-3}$, greater than about $5 \times 10^{19}$ $cm^{-3}$, greater than about $7 \times 10^{19}$ $cm^{-3}$, or greater than about $1 \times 10^{20}$ $cm^{-3}$. In the illustrated example, $n^+$-GaN layer 1540 may have a doping density greater than about $5 \times 10^{19}$ $cm^{-3}$. The $n^+$-GaN layer 1540 may include any suitable donor dopants, such as Si and/or Ge. The $n^+$-GaN layer 1540 may have a relatively high donor density in order to allow for the formation of pores in the porosity treatment step. In some embodiments, $n^+$-GaN layer 1540 may have a thickness greater than about 50 nm, such as about 100 nm or higher. In some embodiments, $n^+$-GaN layer 1540 may have a thickness less than about 2 μm. The thickness of $n^+$-GaN layer 1540 may affect the porosity of the porous GaN layer formed after the electrochemical etching.

Following the formation of $n^+$-GaN layer 1540, an InGaN layer 1550 may be epitaxially grown on $n^+$-GaN layer 1540. The difference in composition between $n^+$-GaN layer 1540 and InGaN layer 1550 may result in compressive strain in InGaN layer 1550. In the illustrated example, InGaN layer 1550 may include $In_xGa_{1-x}N$, where $0 < x \le 1$. In some embodiments, InGaN layer 1550 may include $In_xGa_{1-x}N$ with $0.03 < x \le 0.2$. The indium content of InGaN layer 1550 may be selected to provide an mesa surface with a desired in-plane lattice constant. InGaN layer 1550 may be formed without any intentional doping. InGaN layer 1550 may have a thickness of, for example, greater than about 50 nm, 100 nm, or 200 nm but less than 10 μm, such as about 1 μm.

Figure 15B:
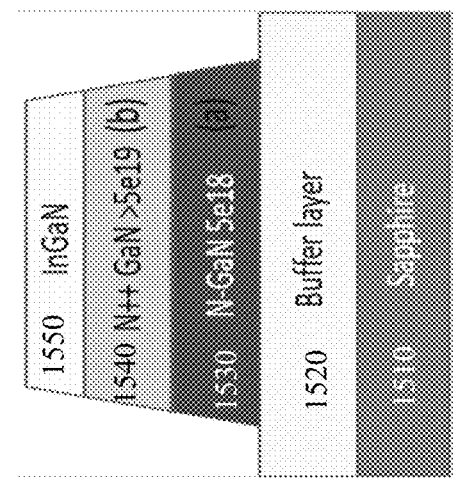

FIG. 15B shows that the layer stack shown in FIG. 15A has been etched to form mesa structures in at least InGaN layer 1550, $n^+$-GaN layer 1540, and n-GaN layer 1530. As described above, the mesa structures may have any suitable shape and may be a precursor mesa structure that has a lateral size greater than the lateral size of one or more micro-LED pixels, such as one, 4, 6, 8, 9, or more micro-LED pixels. The etching may be performed using an etch mask and may include a dry or wet etching process.

Figure 15C:
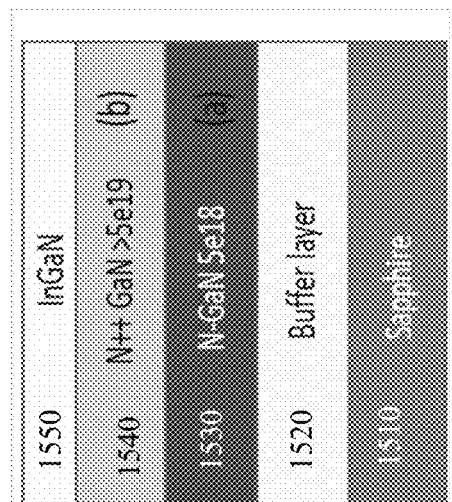

FIG. 15C shows that an electrochemical etching process has been performed to etch $n^+$-GaN layer 1540 to form a porous GaN layer 1542, and a thermal treatment process has been performed to relax InGaN layer 1550 to form a relaxed InGaN layer 1552. As described above, a DC voltage signal may be applied to the layer stack that may be immersed in an electrolyte. The current may mainly flow through n+-GaN layer 1540 due to the low resistance of n+-GaN layer 1540. As n+-GaN layer 1540 is etched, the effective n-doping density in n+-GaN layer 1540 may reduce and the resistance of n+-GaN layer 1540 may increase. When the resistance of n+-GaN layer 1540 is similar to the resistance of n-GaN layer 1530 (e.g., when the effective doping density in n+-GaN layer 1540 is about the same as the doping density of n-GaN layer 1530), the current flowing through the circuit shown in FIG. 10A may reduce significantly due to the resistance increase, the etching process may transition to a much slower etch rate, and both n-GaN layer 1530 and n+-GaN layer 1540 may be etched at the much slower etch rate. Thus, the selective etching of n+-GaN layer 1540 may self-stop. Upon detection of the abrupt change (e.g., reduction) in the current by, for example, current meter 1050, the etching process may be stopped (e.g., by disconnecting the DC bias from power supply 1040), and porous GaN layer 1542 may be formed. InGaN layer 1550 may expand and relax during the subsequent thermal treatment process, and may have a low strain.

Figure 15D:
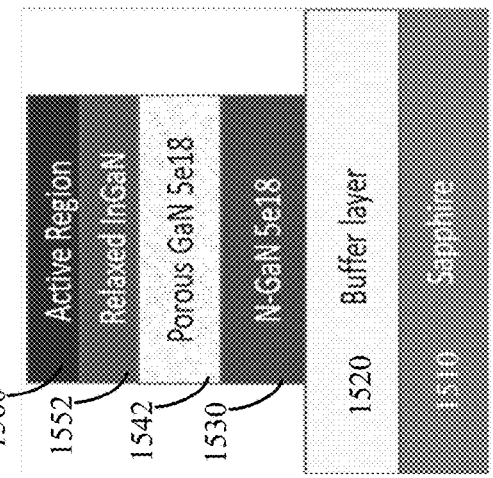

FIG. 15D shows that an active region 1560 that includes one or more active layers is epitaxially grown on relaxed InGaN layer 1552. No growth masks may be used for the growth of active region 1560. Thus, the one or more active layers may also be grown on sidewalls of the mesa structure shown in FIG. 15C. As described above, active region 1560 grown on top of relaxed InGaN layer 1552 can have a high quality (e.g., low defect density and low strain) and high indium concentration, and thus may emit red light with a high efficiency.

Figure 15E:
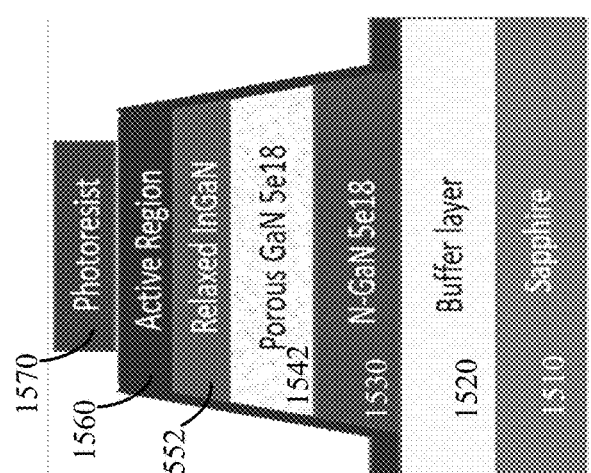

FIG. 15E shows that a patterned photoresist layer 1570 is formed on active region 1560. Patterned photoresist layer 1570 may be used to etch the mesa structure to remove the active layers grown on sidewalls of the mesa structure. A dry etch process may be performed using patterned photoresist layer 1570.

Figure 15F:
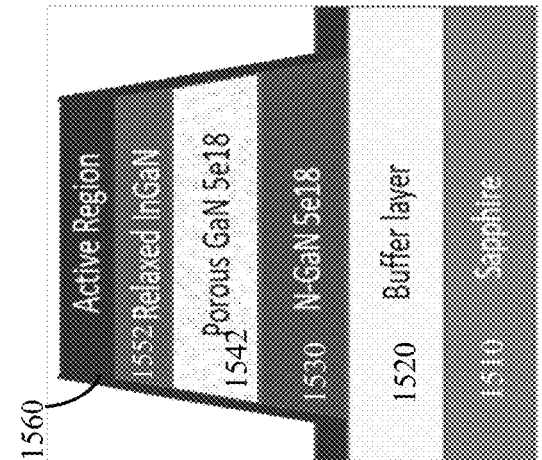

FIG. 15F shows a mesa structure after the etching using patterned photoresist layer 1570 and the removal of the patterned photoresist layer 1570. The mesa structure may include n-GaN layer 1530, porous GaN layer 1542, relaxed InGaN layer 1552, and active region 1560. As described above, the mesa structures may have any suitable shapes, such as a parabolic shape, a conic shape, a truncated pyramid shape, an inward-tilted shape, an outward-tilted shape, or the like. In addition, the mesa structure may have the size for a single micro-LED pixel or multiple micro-LED pixels.

Even though not shown in FIGS. 15A-15F, other processes may also be performed to form micro-LED devices that include arrays of micro-LEDs. For example, as described above with respect to FIGS. 12E-12H and 13G-13N, the mesa structures may be etched to form smaller mesa structures (e.g., pixel mesa structures) for individual micro-LED pixel. A p-contact layer may be formed on active region 1560. A passivation layer may be formed on sidewalls of the mesa structure. An n-contact may be formed at the sidewalls of the pixel mesa structure to make contact with sidewalls of relaxed InGaN layer 1552. Bonding pads or contact pads for connecting the p-contacts and the n-contacts to a driver circuit may also be formed. In addition, as described above with respect to, for example, FIGS. 13O-13P above and FIGS. 19-21 below, the micro-LED die or wafer including the micro-LEDs formed thereon may be bonded to a CMOS backplane that may drive the micro-LEDs, and light extract structures (e.g., micro-lenses) may be formed on the light emitting surface of the micro-LED die or wafer.

FIGS. 16A-16F illustrate an example of a method of fabricating red micro-LED mesa structure 1405 shown in FIG. 14B according to certain embodiments. FIG. 16A shows a substrate 1610 and a buffer layer 1620 formed on substrate 1610. Substrate 1610 may be a substantially planar substrate and may have an in-plane lattice constant that is close to the in-plane lattice constants of the epitaxial layers to reduce lattice mismatch. For example, in the illustrated example, substrate 1610 may be a sapphire substrate. Buffer layer 1620 may be formed on substrate 1610 to provide a substrate surface suitable for the formation of III-nitride layers. FIG. 16A also shows a patterned dielectric layer 1625 formed on buffer layer 1620. Patterned dielectric layer 1625 may include, for example, $SiO_2$ or SiN. Patterned dielectric layer 1625 may have a plurality of apertures 1622 formed therein to expose portions of the top surface of buffer layer 1620.

FIG. 16B shows that an n-GaN layer 1630, an n+-GaN layer 1640, and an InGaN layer 1650 have been grown on buffer layer 1620 through one aperture 1622 using any suitable process such as an MOCVD process or an MBE process as described above. In the illustrated example, n+-GaN layer 1640 may have an n-doping (e.g., Si or Ge doping) density greater than about $5 \times 10^{19}$ $cm^{-3}$, in order to allow for the formation of pores in the porosity treatment step. In some embodiments, n+-GaN layer 1640 may have a thickness greater than about 50 nm or greater than about 100 nm. In some embodiments, n+-GaN layer 1640 may have a thickness less than 2 μm. The thickness of n+-GaN layer 1640 may affect the porosity of the porous GaN layer formed after the electrochemical etching. InGaN layer 1650 may have a composition (and thus a lattice constant) different from the composition (and thus the lattice constant) of n+-GaN layer 1640. The difference in composition and lattice constant between n+-GaN layer 1640 and InGaN layer 1650 may result in compressive strain in InGaN layer 1650. In the illustrated example, InGaN layer 1650 may include $In_xGa_{1-x}N$, where $0<x\leq1$. In some embodiments, InGaN layer 1650 may include $In_xGa_{1-x}N$ with $0.03<x\leq0.2$. The indium content of InGaN layer 1650 may be selected to provide an mesa surface with a desired in-plane lattice constant. InGaN layer 1650 may be formed without any intentional doping. InGaN layer 1650 may have a thickness of, for example, greater than about 50 nm, 100 nm, or 200 nm but less than 10 μm, such as about 1 μm. The epitaxial growth on the exposed region of buffer layer 1620 through aperture 1622 may naturally form a truncated pyramid-shaped mesa structure as shown in FIG. 16B. The mesa structure may have a size greater than the size of one or more micro-LED pixels, such as one, 4, 6, 8, 9, or more micro-LED pixels.

FIG. 16C shows that an electrochemical etching has been performed to etch n+-GaN layer 1640 to form a porous GaN layer 1642, and a thermal treatment may be performed to relax InGaN layer 1650 to form a relaxed InGaN layer 1652. As described above, a voltage signal may be applied to the layer stack that may be immersed in an electrolyte. The current may mainly flow through n+-GaN layer 1640 due to the low resistance of n+-GaN layer 1640. As n+-GaN layer 1640 is etched, the effective n-doping density in n+-GaN layer 1640 may reduce and the resistance of n+-GaN layer 1640 may increase. When the resistance of n+-GaN layer 1640 is similar to the resistance of n-GaN layer 1630 (e.g., when the effective doping density in n+-GaN layer 1640 is about the same as the doping density of n-GaN layer 1630), the current flowing through the circuit shown in FIG. 10A may reduce significantly due to the resistance increase, and the etching process may transition to a much slower etch rate, where both n-GaN layer 1630 and n⁺-GaN layer 1640 may be etched at the much slower etch rate. Thus, the selective etching of n⁺-GaN layer 1640 may self-stop. Upon detection of the abrupt change (e.g., reduction) in the current (e.g., by current meter 1050), the electrochemical etching process may be stopped (e.g., by disconnecting the DC bias from power supply 1040) and porous GaN layer 1642 may be formed. InGaN layer 1650 may then expand and relax during the subsequent thermal treatment, and may have a low strain after the relaxation.

FIG. 16D shows that an active region 1660 that includes one or more active layers is epitaxially grown on relaxed InGaN layer 1652. No growth mask may be used for the growth of active region 1660. Thus, the one or more active layers may also be grown on sidewalls of the mesa structure shown in FIG. 16C. As described above, active region 1660 grown on top of relaxed InGaN layer 1652 can have a high quality (e.g., low strain and low defect density) and high indium concentration, and therefore may emit red light with a high efficiency.

FIG. 16E shows that a patterned photoresist layer 1670 is formed on active region 1660. Patterned photoresist layer 1670 may be used to etch the mesa structure to remove the active layers grown on sidewalls of the mesa structure. A dry etch process may be performed using patterned photoresist layer 1670.

FIG. 16F shows a mesa structure after the etching using patterned photoresist layer 1670 and the removal of the patterned photoresist layer 1670. The mesa structure may include n-GaN layer 1630, porous GaN layer 1642, relaxed InGaN layer 1652, and active region 1660. As described above, the mesa structures may have any suitable shapes, such as a parabolic shape, a conic shape, a truncated pyramid shape, an inward-tilted shape, an outward-tilted shape, or the like. In addition, the mesa structure may have the lateral size for a single micro-LED pixel or multiple micro-LED pixels.

Figure 17:
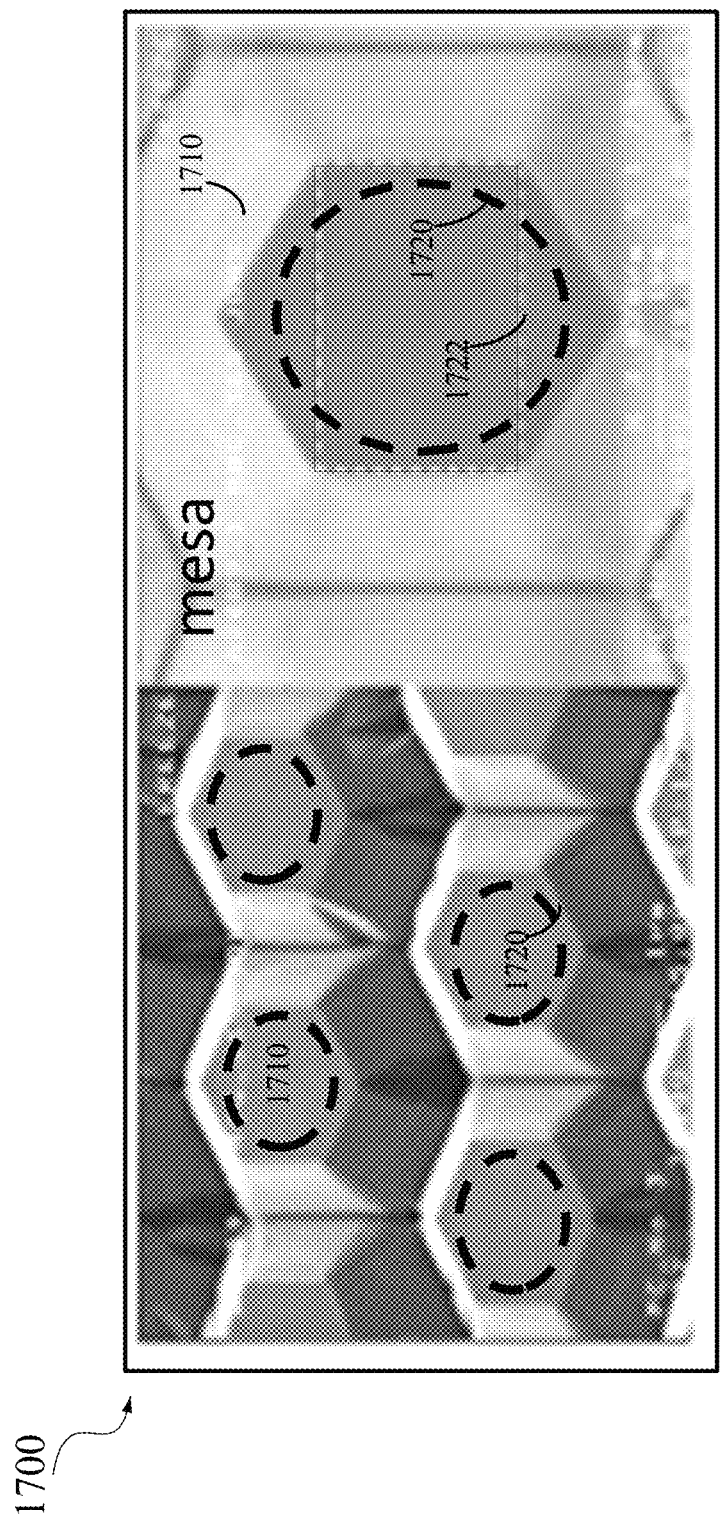
FIG. 17 illustrates an example of an array of red micro-LED mesa structures fabricated using the method shown in FIGS. 16A-16F according to certain embodiments.

FIG. 17 illustrates an example of an array of red micro-LED mesa structures 1710 fabricated using the method shown in FIGS. 16A-16F according to certain embodiments. FIG. 17 also shows a zoom-in view of a red micro-LED mesa structure 1710. Each red micro-LED mesa structure 1710 may include an n-GaN layer 1630, a porous GaN layer 1642, a relaxed InGaN layer 1652, and an active region 1660, as shown in FIG. 16D. As illustrated, each red micro-LED mesa structures 1710 may have a truncated pyramid shape. An area 1720 on each red micro-LED mesa structures 1710 shows the area for a micro-LED pixel, where regions of red micro-LED mesa structures 1710 outside area 1720 may be etched using patterned photoresist layer 1670 as shown in FIGS. 16E and 16F. In some embodiments, the cross-section of each micro-LED may have a circular shape, a rectangular shape (as shown by a rectangular area 1722), a square shape, or the like.

Even though not shown in FIGS. 16A-16F, other processes may also be performed to form micro-LED devices that include arrays of micro-LEDs. For example, as described above with respect to FIGS. 12E-12H and 13G-13N, the mesa structures may be etched to form smaller mesa structures (e.g., pixel mesa structures) for individual micro-LED pixel. A p-contact layer may be formed on active region 1660. A passivation layer may be formed on sidewalls of the mesa structure. An n-contact may be formed at the sidewalls of the pixel mesa structure to make contact with sidewalls of relaxed InGaN layer 1652. Bonding pads or contact pads for connecting the p-contacts and the n-contacts to a driver circuit may also be formed. In addition, as described above with respect to, for example, FIGS. 13O-13P above and FIGS. 19-21 below, the micro-LED die or wafer including the micro-LEDs formed thereon may be bonded to a CMOS backplane that may drive the micro-LEDs, and light extract structures (e.g., micro-lenses) may be formed on the light emitting surface of the micro-LED die or wafer.

Figure 18:
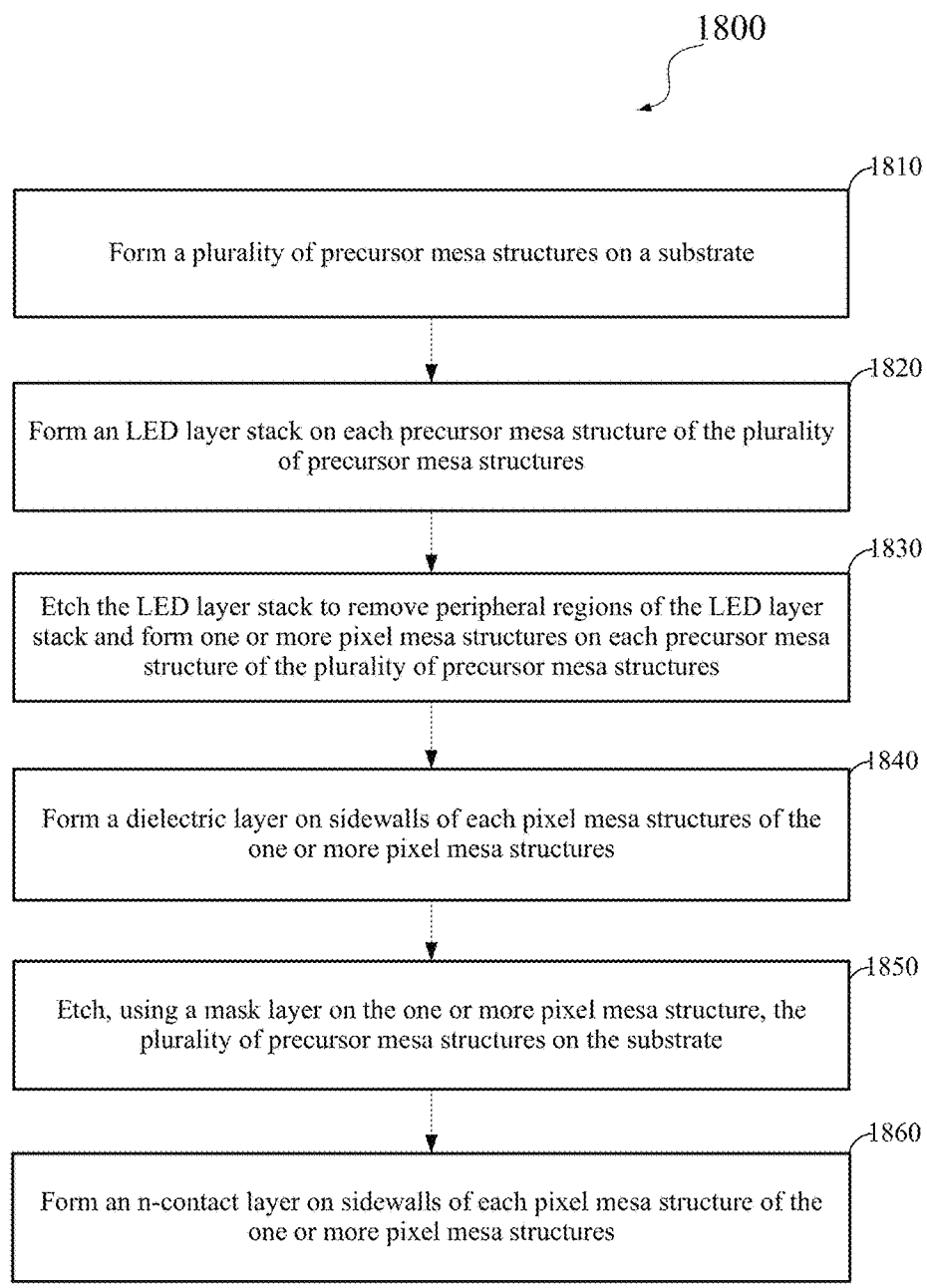
FIG. 18 includes a simplified flowchart illustrating an example of a method of fabricating red micro-LEDs according to certain embodiments.

FIG. 18 includes a simplified flowchart 1800 illustrating an example of a method of fabricating red micro-LEDs according to certain embodiments. It is noted that the operations illustrated in FIG. 18 provide particular processes for fabricating red micro-LEDs. Other sequences of operations can also be performed according to alternative embodiments. For example, alternative embodiments may perform the operation in a different order. Moreover, the individual operations illustrated in FIG. 18 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 1810 of flowchart 1800 may include forming a plurality of precursor mesa structures on a substrate. Each precursor mesa structure of the plurality of precursor mesa structures may include a layer of a first semiconductor material grown on the substrate, a porous layer of the first semiconductor material on the layer of the first semiconductor material and characterized by an areal porosity equal to or greater than 15% (e.g., between about 30% and 90%, such as 70%), and a layer of a second semiconductor material on the porous layer. The second semiconductor material is characterized by a lattice constant greater than a lattice constant of the first semiconductor material. The substrate may include, for example, a buffer layer and a sapphire layer. The first semiconductor material may include a first III-nitride semiconductor material, and the second semiconductor material may include a second III-nitride semiconductor material. In one example, the first semiconductor material may include GaN and the second semiconductor material may include InGaN. The layer of the first semiconductor material may be n-doped with a doping density less than about $1 \times 10^{19}$ cm$^{-3}$, such as about $5 \times 10^{18}$ cm$^{-3}$. The layer of the second semiconductor material may include $In_xGa_{1-x}N$, where $0<x\leq0.2$. The layer of the second semiconductor material may have a lower resistance than the porous layer. A thickness of the porous layer may be greater than about 100 nm.

As described above with respect to, for example, FIGS. 11A-11C, 13A-13C, and 15A-15C, in some embodiments, forming the plurality of precursor mesa structures on the substrate may include growing an epitaxial layer stack on the substrate, where the epitaxial layer stack may include the layer of the first semiconductor material, an n⁺-type layer of the first semiconductor material, and the layer of the second semiconductor material on the n⁺-type layer. The n⁺-type layer of the first semiconductor material may be electrochemically etched to form the porous layer. The epitaxial layer stack may be etched to form the plurality of precursor mesa structures. The plurality of precursor mesa structures may be thermally treated to cause the layer of the second semiconductor material to relax and expand to reduce the strain.

As described above with respect to, for example, FIGS. 16A-16C, in some embodiments, forming the plurality of precursor mesa structures on the substrate may include forming a patterned dielectric layer on the substrate, where the patterned dielectric layer may include a plurality of apertures to expose portions of the substrate. A respective epitaxial layer stack may be grown, through a respective aperture of the plurality of apertures, on each exposed portion of the exposed portions of the substrate. The respective epitaxial layer stack may include the layer of the first semiconductor material, an $n^+$-type layer of the first semiconductor material, and the layer of the second semiconductor material on the $n^+$-type layer. The $n^+$-type layer of the first semiconductor material may be electrochemically etched to form the porous layer. The plurality of precursor mesa structures may be thermally treated to cause the layer of the second semiconductor material to relax and expand.

In some embodiments, the layer of the first semiconductor material is n-doped with a doping density less than $1\times10^{19}$ $cm^{-3}$, such as about $5\times10^{18}$ $cm^{-3}$. The $n^+$-type layer of the first semiconductor material may have a higher doping density than the layer of the first semiconductor material. For example, the $n^+$-type layer of the first semiconductor material may have a doping density greater than about $1\times10^{19}$ $cm^{-3}$, such as about $3\times10^{19}$ $cm^{-3}$, about $5\times10^{19}$ $cm^{-3}$, about $7\times10^{19}$ $cm^{-3}$, or about $1\times10^{20}$ $cm^{-3}$. As described above, the electrochemically etching may be stopped when the resistance of the $n^+$-type layer approximately equals to the resistance of the layer of the first semiconductor material, such as when a difference between a doping density of the $n^+$-type layer and a doping density of the layer of the first semiconductor material is less than about 5%.

Operations at block 1820 may include forming an LED layer stack on each precursor mesa structure of the plurality of precursor mesa structures as shown in, for example, FIGS. 11E, 12C, 13E, 13F, 15D, and 16D. The LED layer stack may include an active region on the relaxed layer of the second semiconductor material (e.g., relaxed InGaN) and a p-contact layer on the active region, where the active region may be configured to emit red light. In some embodiments, forming the LED layer stack may include forming a growth mask layer on sidewalls of each precursor mesa structure of the plurality of precursor mesa structures as shown in, for example, FIGS. 11D and 13D, growing the active region on the relaxed layer of the second semiconductor material, and forming the p-contact layer on the active region. As described above, due to the relaxation of the layer of the second semiconductor material (e.g., InGaN), the active region grown on the layer of the second semiconductor material may incorporate more indium in the $In_xGa_{1-x}N$ layers in the active region, such as the quantum well layers, where x may be greater than 0.2, such as between about 0.2 and about 0.5. In addition, the active region may have a low strain and a low defect density, and thus may emit light with a high efficiency.

At block 1830, the LED layer stack may be etched to remove peripheral regions of the LED layer stack and to form one or more pixel mesa structures on each precursor mesa structure of the plurality of precursor mesa structures as shown in, for example, FIGS. 12E, 13G-13H, 15E-15F, and 16E-16F. As described above, the parasitic sidewall overgrowth regions may be removed by the etching. In some embodiments, the etching may form multiple pixel mesa structures on each precursor mesa structure, such as 2, 4, 6, 8, 9, or more pixel mesa structures on each precursor mesa structure. The etching may etch through the p-contact layer, the active region, and at least a portion of the relaxed layer of the second semiconductor material.

At block 1840, a dielectric layer may be formed on sidewalls of each pixel mesa structures of one or more pixel mesa structures as shown in, for example, FIG. 13I. The dielectric layer may isolate the p-contact layer and may act as a passivation layer at the sidewalls of the active region. The dielectric layer may also be on a portion of the sidewalls of the relaxed layer of the second semiconductor material. The dielectric layer may include, for example, $SiO_2$ or $Si_3N_4$.

At block 1850, the plurality of precursor mesa structures on the substrate may be etched using a mask layer on the one or more pixel mesa structure as shown in, for example, FIGS. 13J and 13K. The mask layer may be the mask layer used to etch the LED layer stack to form the one or more pixel mesa structures at block 1830. The etching may etch through the relaxed layer of the second semiconductor material, the porous layer, and at least a portion of the layer of the first semiconductor layer (e.g., n-GaN layer 1330).

At block 1860, an n-contact layer may be formed on sidewalls of each pixel mesa structure of the one or more pixel mesa structures formed after the operations at block 1850 to form a micro-LED array, as shown in, for example, FIGS. 12G and 13L. The n-contact layer may be in physical contact with the dielectric layer, at least a portion of sidewalls of the relaxed layer of the second semiconductor material, and sidewalls of the porous layer. The dielectric layer may be between the n-contact layer and the sidewalls of the p-contact layer and the active region. The n-contact layer may also be on at least a portion of sidewalls of the layer of the first semiconductor material (e.g., n-GaN layer 1330).

In some embodiments, a dielectric layer may be coated on the micro-LED array formed at block 1860. The dielectric layer may include, for example, an oxide, such as $SiO_2$, and may fill the gaps between individual pixel mesa structures. Metal plugs may be formed in the dielectric layer to form p-electrodes and bonding pads for the p-electrodes, and/or n-electrodes and bonding pads for the n-electrodes. The wafer or die including the micro-LED array may be bonded to a CMOS backplane. The CMOS backplane may include driving circuits formed thereon for controlling and driving the micro-LEDs. The CMOS backplane may have bonding pads formed thereon. Bonding pads on the CMOS backplane and metal plugs on the wafer or die including the micro-LED array may be bonded together. In some embodiments, the gap between the wafer or die including the micro-LED array and the CMOS backplane may be filled with a non-conductive material, such as a dielectric material or an organic material (e.g., an epoxy or a resin). In some embodiments, the surface of the CMOS backplane and the surface of the wafer or die including the micro-LED array may each include a dielectric layer and the two dielectric layers may also be bonded together in a hybrid bonding process. The substrate of the micro-LED array may then be removed from the bonded device and light extraction structures (e.g., micro-lenses) may be formed on the light emitting side of the bonded structure.

Figure 19:
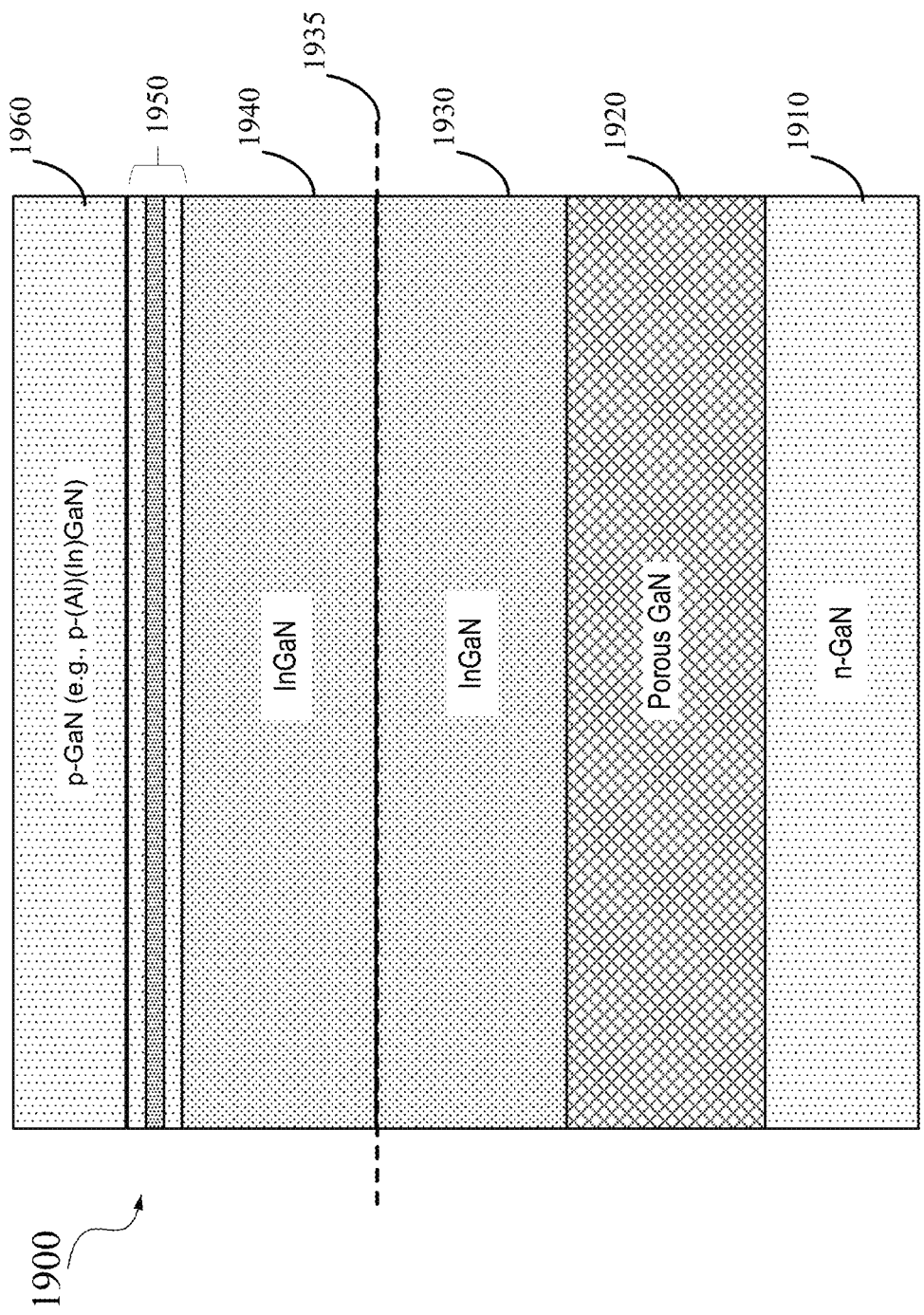
FIG. 19 illustrates an example of a layer stack in a micro-LED according to certain embodiments.

FIG. 19 illustrates an example of a layer stack 1900 in a micro-LED according to certain embodiments. Layer stack 1900 may include an n-GaN layer 1910, which may be similar to, for example, n-GaN layer 1230, 1330, 1420, 1530, or 1630 described above. For example, n-GaN layer 1910 may be grown on a buffer layer formed on a substrate, and may be doped with donors such Si or Ge at a donor density less than about $1\times10^{19}$ $cm^{-3}$, such as about $5\times10^{18}$ cm$^{-3}$. A porous GaN layer 1920 may be formed on n-GaN layer 1910 using techniques described above. For example, porous GaN layer 1920 may be formed by epitaxially growing an n$^+$-GaN layer and an intrinsic or lightly doped InGaN layer 1930 on n-GaN layer 1910, and then etching the n$^+$-GaN layer using an electrochemical etching process. A thermal treatment may then be performed to strain-relax InGaN layer 1930. The n$^+$-GaN layer may have a doping density greater than about 1×10$^{19}$ cm$^{-3}$, such as about 5×10$^{19}$ cm$^{-3}$ or higher. The n$^+$-GaN layer may have a thickness greater than about 50 nm, such as about 100 nm or higher. Intrinsic InGaN layer 1930 may have a thickness greater than about 50 nm, such as 100 nm or thicker. Intrinsic InGaN layer 1930 may have a lower indium concentration (e.g., In$_x$Ga$_{1-x}$N with x less than about 0.2 or 0.1, such as about 0.06). Intrinsic InGaN layer 1930 may be used as a buffer layer for growing high-quality high-indium concentration InGaN layers. FIG. 19 shows a regrowth surface 1935 on intrinsic InGaN layer 1930 that has been strain-relaxed. Regrowth surface 1935 may have a low strain and a low defect density, and may be suitable for growing high-quality InGaN layers with higher indium concentration.

In the illustrated example, an InGaN layer 1940 may first be grown on regrowth surface 1935. InGaN layer 1940 may have a thickness greater than about 50 nm, such as about 100 nm, and may have a higher indium concentration, such as In$_x$Ga$_{1-x}$N with x greater than about 0.1 or 0.2. In one example, InGaN layer 1940 may have the indium mole fraction x about 0.12. InGaN layer 1940 may be a buffer layer or an intermediate layer for growing active layers. One or more quantum wells 1950 (including quantum well layers and barrier layers) may be grown on InGaN layer 1940 to form an active region. Quantum wells 1950 may include In$_x$Ga$_{1-x}$N quantum well layers with x≥0.2, and may have a high quality and a low strain and defect density. Therefore, quantum wells 1950 may emit green or red light at a high efficiency. For example, the external quantum efficiency (EQE) of a 5-μm InGaN red micro-LED may be improved from about 1.5% to about 3.5% or higher using techniques disclosed herein, and the peak-efficiency current density of the 5-μm InGaN red micro-LED may be reduced from about 20 A/cm$^2$ to about 1 A/cm$^2$ or lower. A p-type GaN layer 1960 (e.g., including (Al)(In)GaN) may be grown on quantum wells 1950.

As described above, to display color images using micro-LEDs, red, green, and blue micro-LEDs may need to be used, where each pixel of a color image may be generated by, for example, a red micro-LED pixel, a green micro-LED pixel, and a blue micro-LED pixel. In general, micro-LEDs manufactured on a same wafer or die may only emit light in a same color. Therefore, to display color images, three micro-LED dies or three display panels may generally be used. The number of micro-LED dies or display panels may be reduced using some techniques, such as color conversion using color phosphors or quantum dots, or regrowth processes to form quantum wells for different colors. However, these techniques may have low efficiencies and/or may not be able to achieve small pixel pitches for high resolution displays.

According to certain embodiments, an engineered wafer may include a porous semiconductor (e.g., GaN) layer that has different porosities in different regions. The different porosities in different regions of the porous semiconductor layer may cause different amounts of strain relaxation of a buffer layer (e.g., an InGaN layer) on the porous semiconductor layer. As such, different amounts of indium may be incorporated into the active regions grown on different regions of the porous semiconductor layer and the strain-relaxed buffer layer. The different amounts of indium in the active regions may cause different red shifts of the light emitted in the active regions. Therefore, the engineered wafer may be used to grow active regions of micro-LEDs that emit light in two or more different colors. As such, micro-LEDs that may emit light in different colors may be fabricated on a same wafer or in a same die, so that one or two micro-LED dies or display panels may be able to generate the desired color images.

Figure 20:
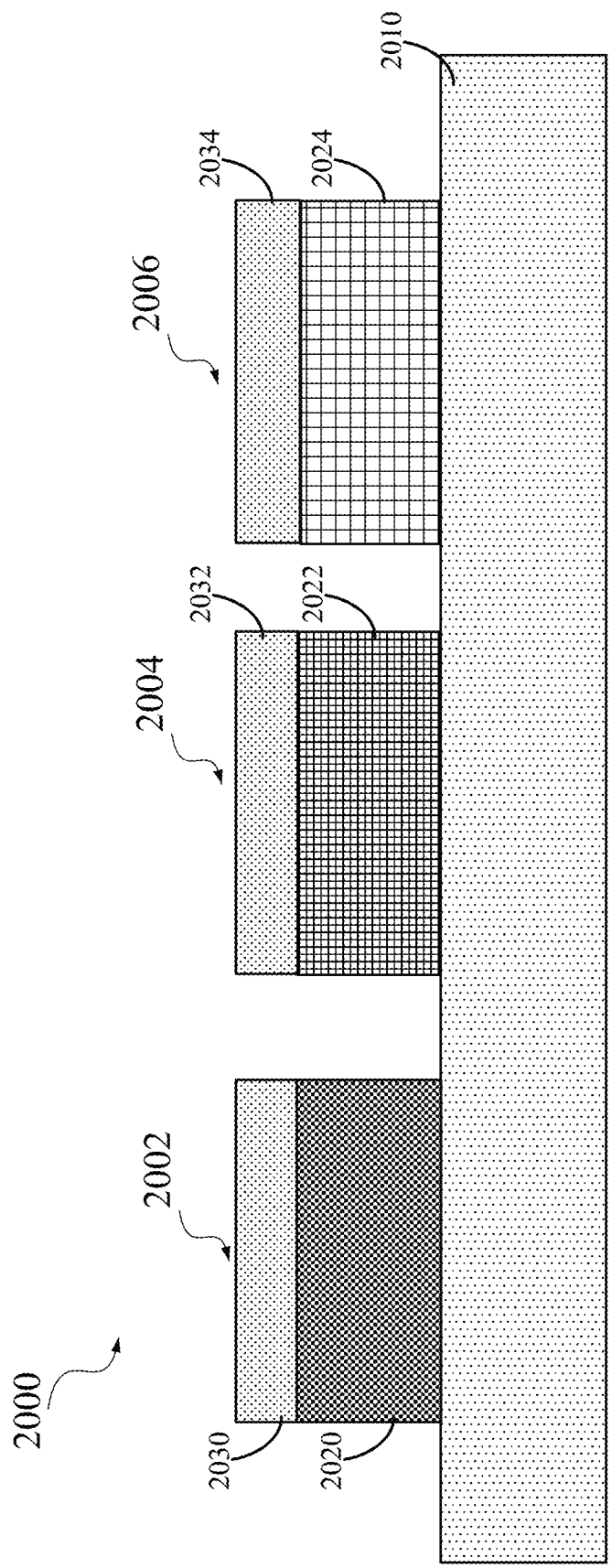
FIG. 20 illustrates an example of an engineered wafer including precursor mesa structures for growing micro-LEDs that emit light of different colors according to certain embodiments.

FIG. 20 illustrates an example of an engineered wafer 2000 including precursor mesa structures for growing micro-LEDs that emit light of different colors according to certain embodiments. Engineered wafer 2000 includes an n-GaN layer 2010 and precursor mesa structures 2002, 2004, and 2006 formed on n-GaN layer 2010. As described above, n-GaN layer 2010 may be grown on a buffer layer formed on a substrate (not shown in FIG. 20), and may be doped with donors (e.g., Si or Ge) at a donor density less than about 1×10$^{19}$ cm$^{-3}$, such as about 5×10$^{18}$ cm$^{-3}$. In the illustrated example, precursor mesa structure 2002 may include a GaN layer 2020 and an InGaN layer 2030. Precursor mesa structure 2004 may include a porous GaN layer 2022 and a relaxed InGaN layer 2032. Precursor mesa structure 2006 may include a porous GaN layer 2024 and a relaxed InGaN layer 2034. InGaN layer 2030 and relaxed InGaN layers 2032 and 2034 may be used as buffer layers for growing active regions of micro-LEDs. GaN layer 2020 and porous GaN layers 2022 and 2024 may have a thickness greater than about 50 nm, such as about 100 nm or higher. InGaN layer 2030 and relaxed InGaN layers 2032 and 2034 may have an indium mole fraction x in In$_x$Ga$_{1-x}$N no greater than 0.2, and may have a thickness greater than about 50 nm, such as 100 nm or thicker.

As illustrated, GaN layer 2020 and porous GaN layers 2022 and 2024 may have different porosities. For example, GaN layer 2020 may not be porosified, porous GaN layer 2022 may have an areal porosity greater than about 30%, while porous GaN layer 2024 may have an areal porosity greater than about 70%. Therefore, InGaN layer 2030 may have a higher strain than relaxed InGaN layer 2032, which may in turn have a higher strain than relaxed InGaN layer 2034. As such, active InGaN layers grown on relaxed InGaN layer 2034 may incorporate more indium than active InGaN layers grown on relaxed InGaN layer 2032, which may incorporate more indium than active InGaN layers grown on InGaN layer 2030. As a result, active InGaN layers grown on InGaN layer 2030 may emit blue light, active InGaN layers grown on relaxed InGaN layer 2032 may emit green light, while active InGaN layers grown on relaxed InGaN layer 2034 may emit red light.

Each of precursor mesa structures 2002, 2004, and 2006 may be formed on n-GaN layer 2010 using techniques described above and below. For example, each of precursor mesa structures 2002, 2004, and 2006 may be formed by epitaxially growing an n$^+$-GaN layer and an intrinsic InGaN layer on n-GaN layer 2010. The n$^+$-GaN layer may have a doping density greater than about 1×10$^{19}$ cm$^{-3}$, such as about 5×10$^{19}$ cm$^{-3}$ or higher. The n$^+$-GaN layer and the intrinsic InGaN layer may be etched to form individual precursor mesa structures. The n$^+$-GaN layers of the individual precursor mesa structures may be selectively porosified using electrochemical etching techniques. The precursor mesa structures may then be thermally treated to strain-relax the intrinsic InGaN layer by different amounts.

The selective porosification of different regions of a doped semiconductor layer, such as the n$^+$-GaN layer, to achieve the different porosities in different regions may be performed using various techniques. For example, different regions of the doped semiconductor layer may be subjected to a porosity treatment process (e.g., an electrochemical etching process) for different durations. In another example, different regions of the doped semiconductor layer may have different doping densities (e.g., selectively modified by selective ion implantation or grown in separate steps), and thus may have different porosities after a same porosity treatment process. In yet another example, different regions of the doped semiconductor layer may have different doping densities and may also be subjected to a porosity treatment process for different durations.

Figure 21B:
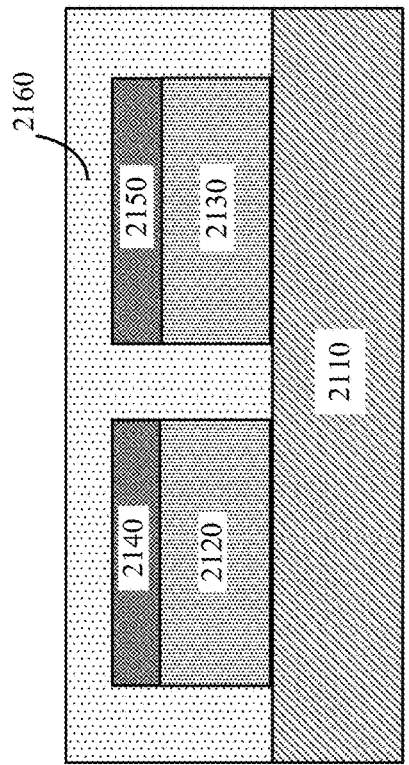
FIGS. 21A-21E illustrate an example of a method of selective porosification of different regions of a doped semiconductor layer in an engineered wafer according to certain embodiments.
Figure 21D:
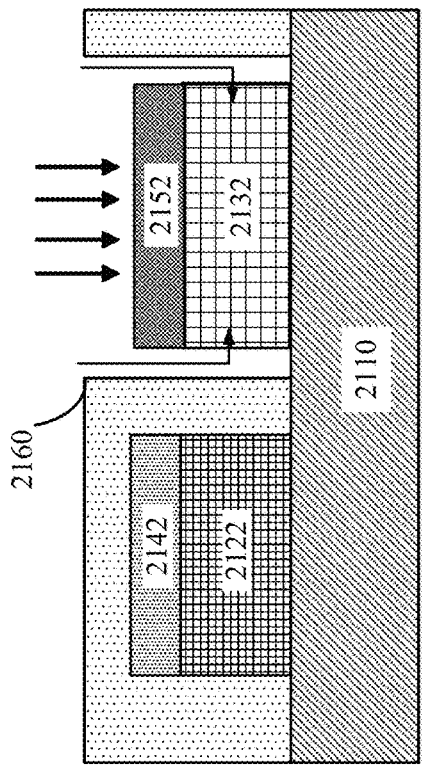
Figure 21A:
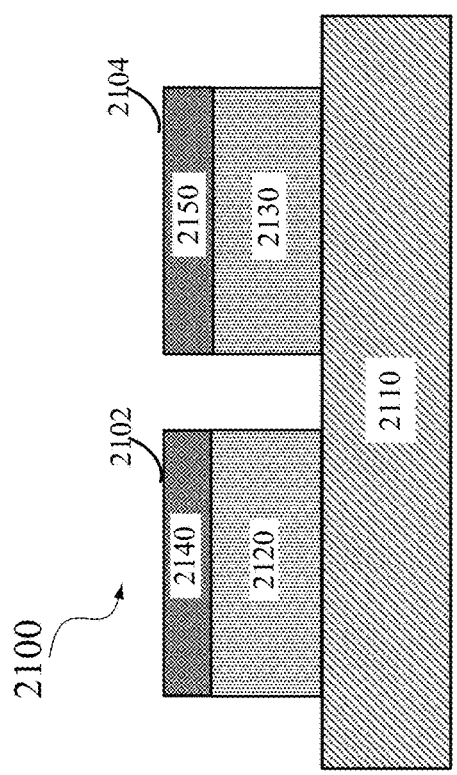

FIGS. 21A-21E illustrate an example of a method of selective porosification of different regions of a doped semiconductor layer in an engineered wafer, such as engineered wafer 2000, according to certain embodiments. FIG. 21A shows a structure 2100 (e.g., an engineered wafer) including two precursor mesa structures 2102 and 2104 formed on an n-GaN layer 2110. As described above, structure 2100 may be formed by growing n-GaN layer 2110, an n$^+$-GaN layer, and an InGaN layer on a substrate and/or a buffer layer (not shown) and then etching the n$^+$-GaN layer and the InGaN layer to form precursor mesa structures 2102 and 2104. N—GaN layer 2110, the n$^+$-GaN layer, and the InGaN layer may be similar to the corresponding layers described above with respect to, for example, FIGS. 11A, 13A, and 15A. Precursor mesa structure 2102 may include an n$^+$-GaN layer 2120 and an InGaN layer 2140. Precursor mesa structure 2104 may include an n$^+$-GaN layer 2130 and an InGaN layer 2150. The n$^+$-GaN layers 2120 and 2130 may have a doping density greater than about $1 \times 10^{19}$ cm$^{-3}$, such as greater than about $5 \times 10^{19}$ cm$^{-3}$ or higher.

Figure 21C:
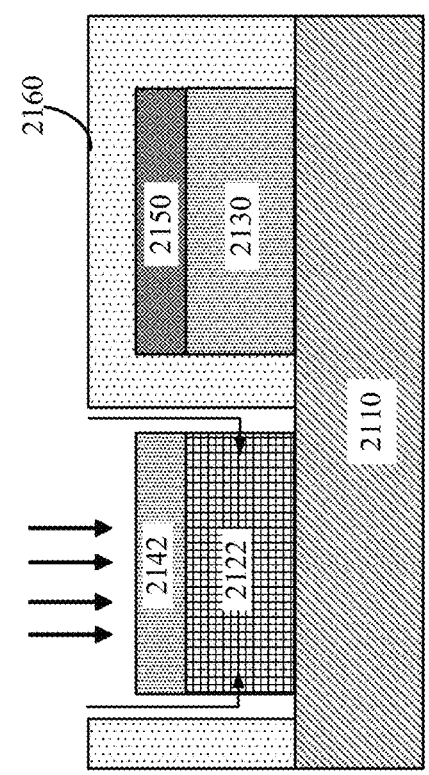

FIG. 21B shows that structure 2100 may be coated with a thick dielectric layer 2160, such as a SiO$_2$ layer, to cover the two precursor mesa structures 2102 and 2104. FIG. 21C shows that dielectric layer 2160 may be selectively etched (e.g., using a patterned etch mask layer) in some regions to expose the InGaN layer in some regions. For example, the dielectric material on top of InGaN layer 2140 may be removed by the selective etching to expose InGaN layer 2140 and/or sidewalls of GaN layer 2120. A porosity treatment process as described above may be performed to porosify n$^+$-GaN layer 2120 from the sidewalls to form a porous GaN layer 2122. For example, precursor mesa structure 2102 may be subjected to an electrochemical etching process for about 10 minutes and/or under a lower DC bias voltage (e.g., applied by power supply 1040). Precursor mesa structure 2102 may then be thermally treated such that InGaN layer 2140 may relax and expand to form a relaxed InGaN layer 2142. After the thermal treatment process, a dielectric material (e.g., SiO$_2$) may be deposited on top of relaxed InGaN layer 2142 to cover precursor mesa structure 2102.

FIG. 21D shows that dielectric layer 2160 may be selectively etched (e.g., using a patterned etch mask layer) in some regions to expose the InGaN layer in some regions. For example, the dielectric material on top of InGaN layer 2150 may be removed by the selective etching to expose InGaN layer 2150 and the sidewalls of GaN layer 2130. A porosity treatment process as described above may be performed to porosify n$^+$-GaN layer 2130 from the sidewalls to form a porous GaN layer 2132. For example, precursor mesa structure 2104 may be subjected to an electrochemical etching process for about 30 minutes and/or under a higher DC bias voltage. Thus, porous GaN layer 2132 may have a higher porosity than porous GaN layer 2122. Precursor mesa structure 2104 may then be thermally treated such that InGaN layer 2150 may relax and expand to form a relaxed InGaN layer 2152. Due to different porosities of porous GaN layers 2122 and 2132, relaxed InGaN layers 2142 and 2152 may relax by different amounts and may have different internal strain and different lattice structures and lattice dimensions.

Figure 21E:
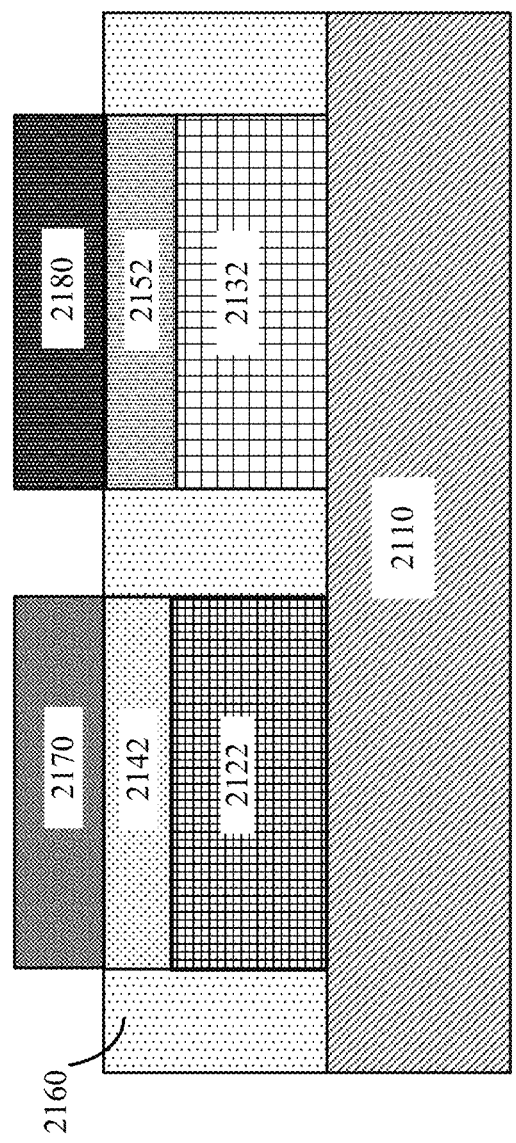

FIG. 21E shows that the dielectric material of dielectric layer 2160 above the top surface of relaxed InGaN layers 2142 and 2152 may be removed to expose relaxed InGaN layers 2142 and 2152, on which active regions 2170 and 2180, respectively, may be grown. Dielectric layer 2160 may prevent the growth of the semiconductor materials on sidewalls of the two precursor mesa structures 2102 and 2104. Due to the different relaxation of relaxed InGaN layers 2142 and 2152, active regions 2170 and 2180 may incorporate different amounts of indium and thus may emit light of different colors. More specifically, active region 2180 may incorporate more indium than active region 2170 and thus may emit light at a longer wavelength than active region 2170. For example, active region 2180 may emit red light, while active region 2170 may emit green light.

Figure 22A:
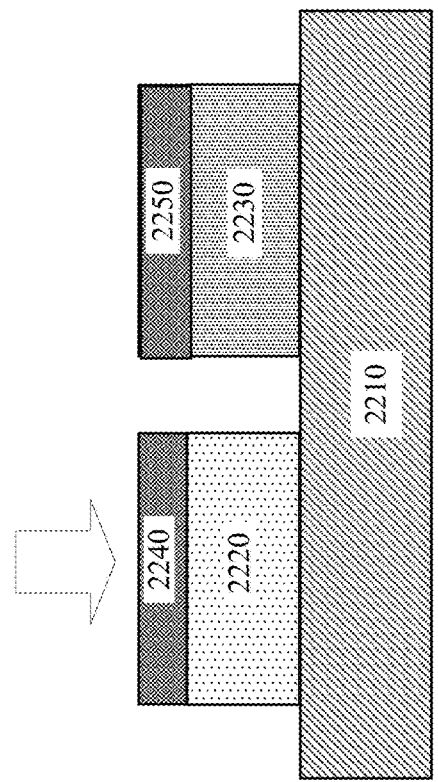
FIGS. 22A-22D illustrate another example of a method of selective porosification of different regions of a doped semiconductor layer in an engineered wafer according to certain embodiments.

FIGS. 22A-22D illustrate another example of a method of selective porosification of different regions of a doped semiconductor layer in an engineered wafer, such as engineered wafer 2000, according to certain embodiments. FIG. 22A shows a structure 2200 (e.g., an engineered wafer) including two precursor mesa structures 2202 and 2204 formed on an n-GaN layer 2210. As described above, structure 2200 may be formed by growing n-GaN layer 2210, an n$^+$-GaN layer, and an InGaN layer on a substrate and/or a buffer layer (not shown) and then etching the n$^+$-GaN layer and the InGaN layer to form precursor mesa structures 2202 and 2204. N—GaN layer 2210, the n$^+$-GaN layer, and the InGaN layer may be similar to the corresponding layers described above with respect to, for example, FIGS. 11A, 13A, and 15A. The n$^+$-GaN layer may have a doping density greater than $1 \times 10^{19}$ cm$^{-3}$, such as greater than about $5 \times 10^{19}$ cm$^{-3}$ or higher. Precursor mesa structure 2202 may include an n$^+$-GaN layer 2220 and an InGaN layer 2240. Precursor mesa structure 2204 may include an n$^+$-GaN layer 2230 and an InGaN layer 2250.

Figure 22B:
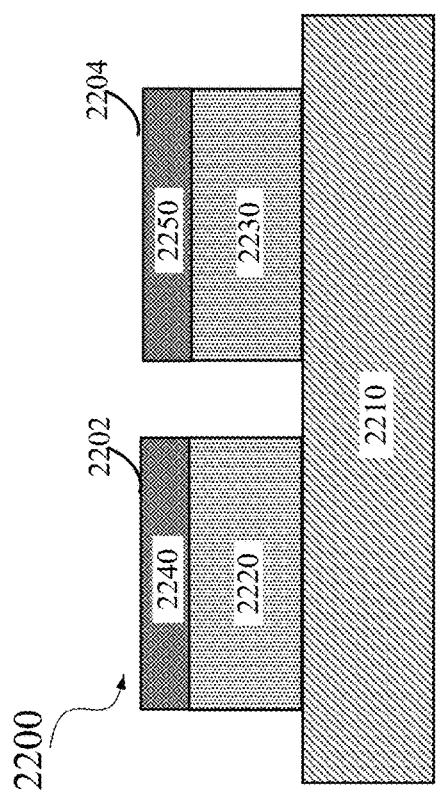

FIG. 22B shows that ion implantation may be performed on some precursor mesa structures, such as precursor mesa structure 2202 but not precursor mesa structure 2204. The ion implantation may increase or decrease the donor density and the conductivity of n$^+$-GaN layer 2220 in precursor mesa structure 2202. For example, the ion implantation may decrease the donor density (e.g., <about $1 \times 10^{19}$ cm$^{-3}$, such as about $5 \times 10^{18}$ cm$^{-3}$) and the conductivity of n$^+$-GaN layer 2220. Because no implantation is performed on precursor mesa structure 2204, the donor density of n$^+$-GaN layer 2230 may remain unchanged, such as greater than $1 \times 10^{19}$ cm$^{-3}$, about $5 \times 10^{19}$ cm$^{-3}$, or higher. In some embodiments, different amounts and/or types of ion implantation may be performed on precursor mesa structure 2202 and precursor mesa structure 2204 to modify the donor densities of n$^+$-GaN layer 2220 and n$^+$-GaN layer 2230 differently.

Figure 22C:
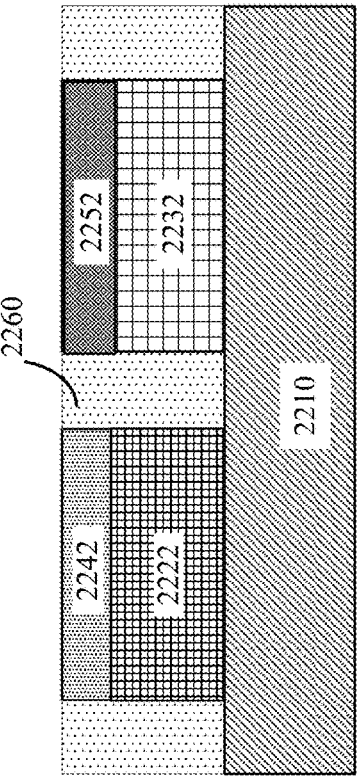

FIG. 22C shows that a porosity treatment process (e.g., an electrochemical etching process) may be performed on precursor mesa structure 2202 and precursor mesa structure 2204. Due to the different donor densities of n$^+$-GaN layers 2220 and 2230, the electrochemical etching process may start first on the n$^+$-GaN layer with the higher donor density and higher conductivity. Thus, the resultant porous GaN layers 2222 and 2232 may have different porosities. More specifically, porous GaN layer 2232 may have a higher porosity than porous GaN layer 2222.

Figure 22D:
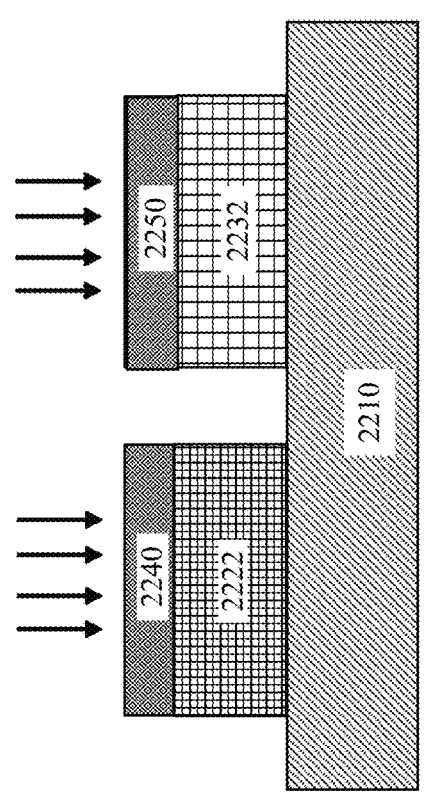

FIG. 22D shows that precursor mesa structures 2202 and 2204 may be thermally treated to cause InGaN layers 2240 and 2250 to relax and expand and form relaxed InGaN layers 2242 and 2252. Because porous GaN layer 2232 may have a higher porosity than porous GaN layer 2222, InGaN layer 2250 may relax more than InGaN layer 2240. A dielectric layer 2260 may be coated on precursor mesa structures 2202 and 2204 and then planarized. Dielectric layer 2260 may be used to prevent the growth of semiconductor materials on sidewalls of the two precursor mesa structures 2202 and 2204 in the subsequent active layer growth processes.

Active regions may be grown on relaxed InGaN layers 2242 and 2252 as described above with respect to FIG. 21E. Due to the different amounts of relaxation of relaxed InGaN layers 2242 and 2252, the active regions may incorporate different amounts of indium and thus may emit light of different colors. More specifically, the active region grown on relaxed InGaN layer 2252 may incorporate more indium than the active region grown on relaxed InGaN layer 2242, and thus may emit light at a longer wavelength.

Even though not shown in FIGS. 21A-22D, processes described above with respect to, for example, FIGS. 13F-13P, may be performed on the structures shown in FIG. 21E or 22D to form a micro-LED die or wafer (or a packaged device or wafer stack including an electrical backplane) that includes micro-LEDs configured to emit light of different colors. Thus, one or two dies or display panels, rather than three dies or display panels, may be able to generate color images.

Figure 23:
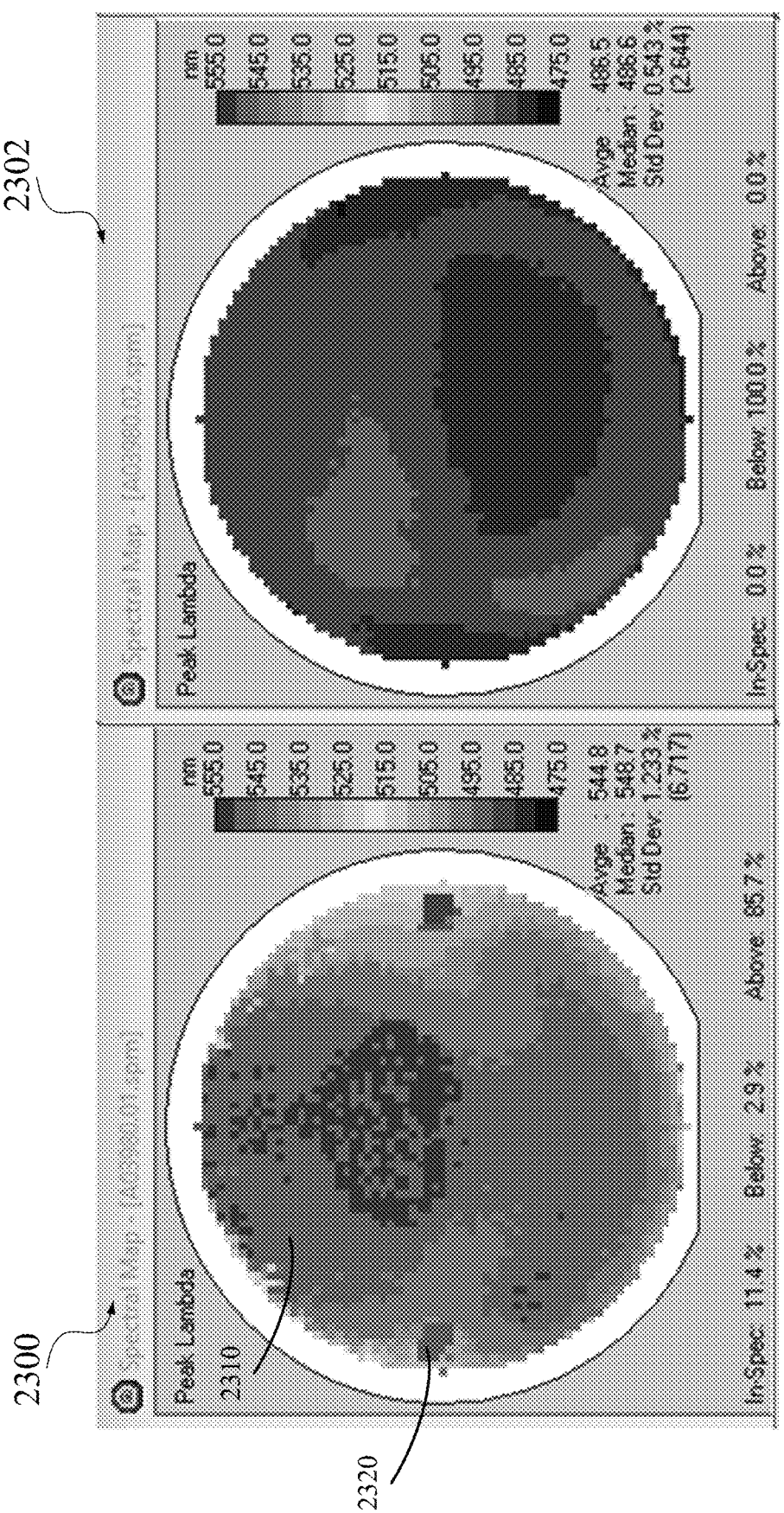
FIG. 23 illustrates the wavelength shift of micro-LEDs fabricated on engineered wafers including buffer layers that include a porous GaN layer and a relaxed InGaN layer according to certain embodiments.

FIG. 23 illustrates the wavelength shift of micro-LEDs fabricated on engineered wafers including buffer layers that include a porous GaN layer and a relaxed InGaN layer according to certain embodiments. A spectral map 2300 in FIG. 23 shows the wavelengths of micro-LEDs fabricated on an engineered wafer including a porous GaN layer and a relaxed InGaN layer, while a spectral map 2302 shows the wavelengths of micro-LEDs fabricated on a wafer that does not include a porous GaN layer or a relaxed InGaN layer. The micro-LEDs fabricated on the engineered wafer may have a layer stack similar to layer stack 1900 shown in FIG. 19.

Spectral map 2302 shows that the average central wavelength of the micro-LEDs fabricated using conventional techniques may be about 486 nm (blue light), while spectral map 2300 shows the average central wavelength of micro-LEDs fabricated on the engineered wafer including the porous GaN layer and the relaxed InGaN layer may be about 545 nm (green light), which indicates a red shift about 60 nm. Most regions 2310 of spectral map 2300 show central wavelengths of emitted light around 545 nm, but two regions 2320 of spectral map 2300 corresponding to alignment mark regions that have not been porosified show central wavelengths of emitted light around 485 nm. Thus, this example shows that micro-LEDs on the same wafer can naturally emit blue light and green light as a result of the selective porosification techniques disclosed herein.

Techniques disclosed herein can be used for other applications. For example, it may be easier to remove individual micro-LEDs on porous semiconductor layers. Techniques disclosed herein can also be used to make other devices that are in a same die or on a same wafer but have different optical properties. For example, DBRs may be made using porous semiconductor layers and other semiconductor layers. The refractive index of a porous semiconductor layer in a DBR may be a function of the porosity of the porous semiconductor layer. Therefore, DBRs for different wavelength bands may be formed on a same wafer or a same die by selective porosification of doped semiconductor layers to achieve desired porosities and refractive indexes in the porosified semiconductor layers. The DBRs for different wavelength bands may be used to make resonant-cavity micro-LEDs that emit light in different colors, or may be used to form cavities for converting light emitted in the active regions into light of different colors. The DBRs for different wavelength bands may also be used to make multi-color vertical-cavity surface-emitting lasers (VCSELs) in a same die or on a same wafer.

Figure 24:
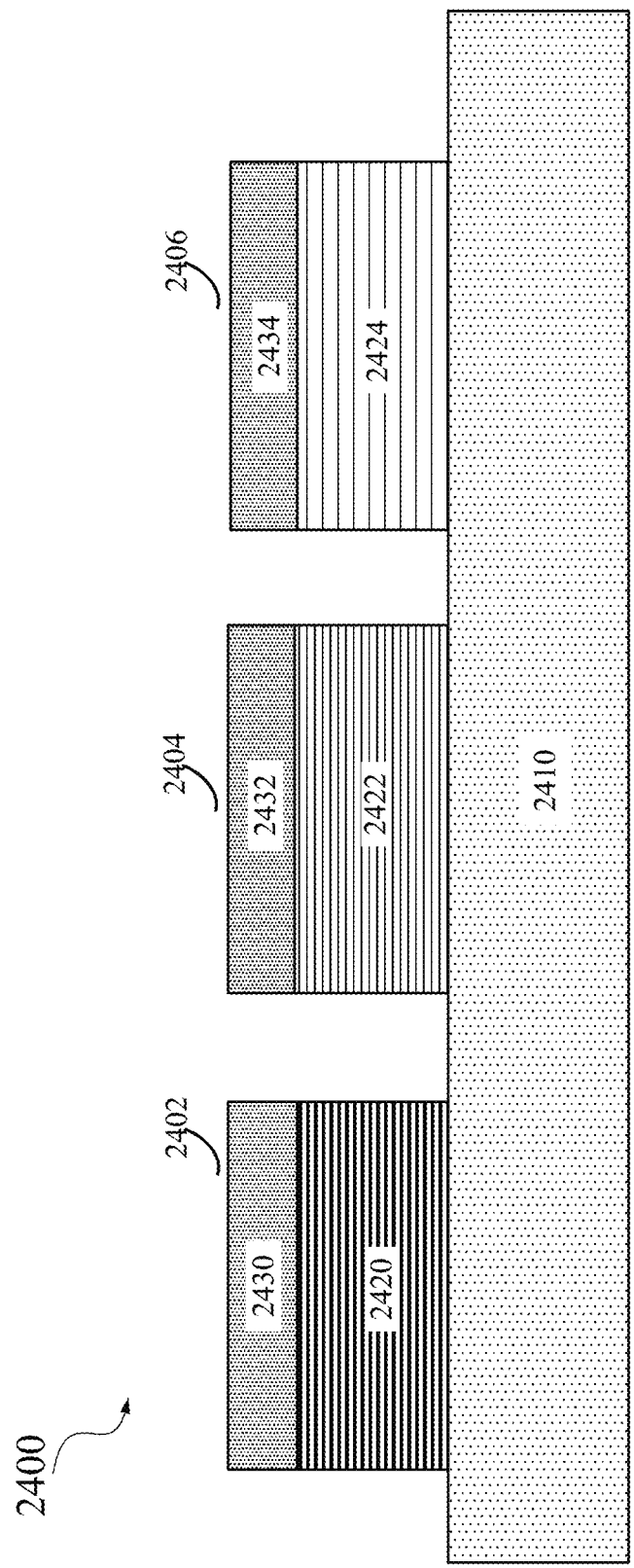
FIG. 24 illustrates an example of an engineered wafer including DBRs for different wavelength bands according to certain embodiments.

FIG. 24 illustrates an example of an engineered wafer 2400 including DBRs for different wavelength bands according to certain embodiments. Engineered wafer 2400 includes an n-GaN layer 2410 and mesa structures 2402, 2404, and 2406 formed on n-GaN layer 2410. N—GaN layer 2410 may be grown on a buffer layer formed on a substrate (not shown in FIG. 24), and may be doped with donors such as Si or Ge at a donor density less than about $1 \times 10^{19}$ cm$^{-3}$, such as about $5 \times 10^{18}$ cm$^{-3}$. Mesa structures 2402, 2404, and 2406 may each include a DBR structure and a buffer layer (e.g., an intrinsic InGaN layer). Each DBR structure may include alternating GaN layers and porous GaN layers.

Each of mesa structures 2402, 2404, and 2406 may be formed by first growing a layer stack including multiple pairs (e.g., >5 pairs, such as 8, 10, 16, or 20 pairs) of GaN layers and an intrinsic InGaN layer, where each pair of GaN layers may include a GaN layer with a low doping density (e.g., $<1 \times 10^{19}$ cm$^{-3}$ or unintentionally doped) and a GaN layer with a high doping density (e.g., $>1 \times 10^{19}$ cm$^{-3}$). Each GaN layer in a pair may have a respective thickness about tens of nanometers, such as about 40, 50, or 60 nm. In some embodiments, the layer stack may be etched to form individual mesa structures. In some embodiments, three epitaxial growth processes may be used to separately grow mesa structures 2402, 2404, and 2406, where the GaN layers in different mesa structures may have different thicknesses, different periodicity, different doping densities, and/or different numbers of layers. The mesa structures may then be subjected to different porosity treatment processes (e.g., different etching durations) as described above with respect to, for example, FIGS. 21A-21D, or may be subjected to different ion implantation processes and then a same porosity treatment process as described above with respect to, for example, FIGS. 22A-22D. In embodiments where mesa structures 2402, 2404, and 2406 are grown in separate growing processes and have different doping densities, a same porosity treatment process may be performed to porosify the doped GaN layer. As such, the doped GaN layers may have different porosities and thus different refractive indexes in different mesa structures.

In the illustrated example, mesa structures 2402 may include a DBR structure 2420 and an InGaN layer 2430, where DBR structure 2420 may include porous GaN layers having a low porosity and a higher refractive index. Mesa structures 2404 may include a DBR structure 2422 and an InGaN layer 2432, where DBR structure 2422 may include porous GaN layers having a medium porosity and a medium refractive index. Mesa structures 2406 may include a DBR structure 2424 and an InGaN layer 2434, where DBR structure 2424 may include porous GaN layers having a high porosity and a lower refractive index. Therefore, each mesa structure 2402, 2404, or 2406 may have a high reflectivity in a respective wavelength band, such as the red, green, or blue light band. The DBRs for different wavelength bands may be used to make resonant-cavity micro-LEDs that emit light in different colors, or may be used to form cavities for converting light emitted in the active regions into light of different colors.

Figure 25:
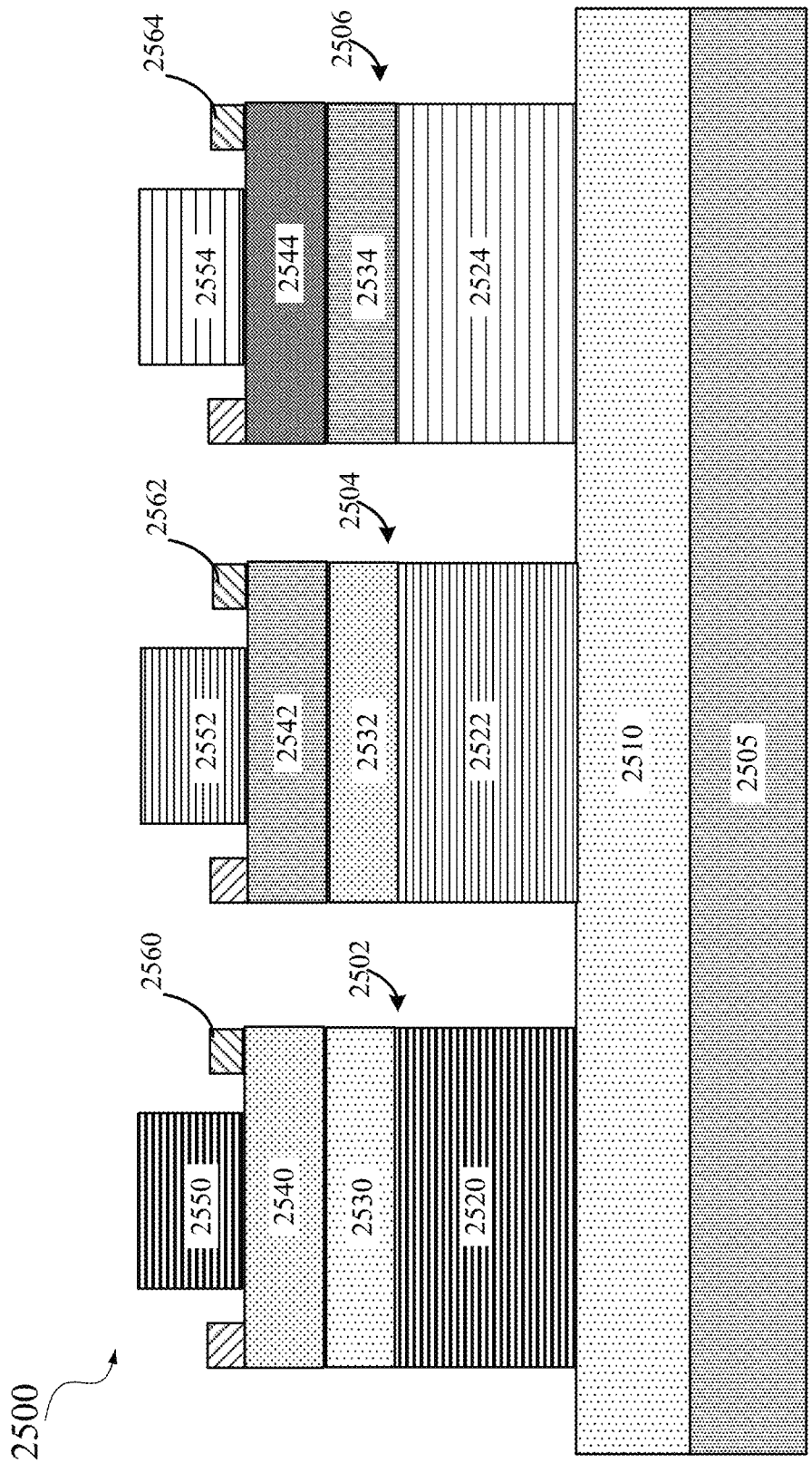
FIG. 25 illustrates an example of a wafer including VCSELs that emit light in different wavelength ranges according to certain embodiments.

FIG. 25 illustrates an example of a wafer 2500 including VCSELs that emit light in different wavelength ranges according to certain embodiments. Engineered wafer 2500 includes an n-GaN layer 2510 and VCSELs 2502, 2504, and 2506 formed on n-GaN layer 2510. N—GaN layer 2510 may be grown on a substrate 2505, and may be doped with donors such as Si or Ge at a donor density less than about $1 \times 10^{19}$ $cm^{-3}$, such as about $5 \times 10^{18}$ $cm^{-3}$, or may be unintentionally doped. VCSELs 2502, 2504, and 2506 may each include a cavity formed by a pair of DBR structures that includes a bottom DBR and a top DBR. One of the two DBRs (e.g., the top DBR) may have a very high reflectivity (e.g., >99%) for a wavelength band, while the other DBR (e.g., the bottom DBR) may allow at least a portion of light in the wavelength band to pass through. Within the cavity, a buffer layer (e.g., an intrinsic InGaN layer) may be formed on the bottom DBR and an active region that can emit light in the wavelength band may be grown on the buffer layer. Each DBR may include alternating GaN layers and porous GaN layers.

In the illustrated example, VCSEL 2502 may include a bottom DBR 2520, a relaxed InGaN layer 2530, an active region 2540 (which may also include the p-GaN layer, not shown in FIG. 25), a top DBR 2550, and an electrical contact 2560. Bottom DBR 2520 may include alternating GaN layers and porous GaN layers having a certain porosity. The periodicity, the thicknesses of the GaN layers and the porous GaN layers, and the porosity of the porous GaN layers in bottom DBR 2520 may be configured such that bottom DBR 2520 may reflect blue light. InGaN layer 2530 may relax by a certain amount due to the porous GaN layers under InGaN layer 2530. Active region 2540 grown on InGaN layer 2530 may include, for example, $In_xGa_{1-x}N$ with low x values and may emit blue light. Top DBR 2550 may include alternating GaN layers and porous GaN layers, or may include other layers having alternating refractive indexes. VCSEL 2502 may either emit blue light through top DBR 2550 or bottom DBR 2520. In embodiments where VCSEL 2502 emits blue light through bottom DBR 2520, top DBR 2550 may be replaced by a metal reflector.

Similarly, VCSEL 2504 may include a bottom DBR 2522, a relaxed InGaN layer 2532, an active region 2542, a top DBR 2552, and an electrical contact 2562. Bottom DBR 2522 may include alternating GaN layers and porous GaN layers having a porosity similar to or different from the porosity of the porous GaN layers in bottom DBR 2520. The periodicity, the thicknesses of the GaN layers and the porous GaN layers, and the porosity of the porous GaN layers in bottom DBR 2522 may be configured such that bottom DBR 2522 may reflect green light. InGaN layer 2532 may relax by a certain amount due to the porous GaN layers under InGaN layer 2532. Active region 2542 grown on InGaN layer 2532 may include, for example, $In_xGa_{1-x}N$ with higher x values and may emit green light. Top DBR 2552 may include alternating GaN layers and porous GaN layers, or may include other layers with alternating refractive indexes. VCSEL 2504 may either emit green light through top DBR 2552 or bottom DBR 2522. In embodiments where VCSEL 2504 emits green light through bottom DBR 2522, top DBR 2552 may be replaced by a metal reflector.

VCSEL 2506 may include a bottom DBR 2524, a relaxed InGaN layer 2534, an active region 2544, a top DBR 2554, and an electrical contact 2564. Bottom DBR 2524 may include alternating GaN layers and porous GaN layers having a porosity similar to or different from the porosity of the porous GaN layers in bottom DBR 2520 or bottom DBR 2522. The periodicity, the thicknesses of the GaN layers and the porous GaN layers, and the porosity of the porous GaN layers in bottom DBR 2524 may be configured such that bottom DBR 2524 may reflect red light. InGaN layer 2534 may relax by a certain amount due to the porous GaN layers under InGaN layer 2534. Active region 2544 grown on InGaN layer 2534 may include, for example, $In_xGa_{1-x}N$ with high x values and may emit red light. Top DBR 2554 may include alternating GaN layers and porous GaN layers, or may include other layers with alternating refractive indexes. VCSEL 2506 may either emit red light through top DBR 2554 or bottom DBR 2524. In embodiments where VCSEL 2506 emits red light through bottom DBR 2524, top DBR 2554 may be replaced by a metal reflector.

In some embodiments, VCSELs 2502, 2504, and 2506 may each be fabricated by first growing a layer stack including multiple pairs (e.g., >5 pairs, such as 8, 10, 16, or 20 pairs) of GaN layers and an intrinsic InGaN layer, where each pair of GaN layers may include a GaN layer with a low doping density (e.g., $<1 \times 10^{19}$ $cm^{-3}$ or unintentionally doped) and a GaN layer with a high doping density (e.g., $>1 \times 10^{19}$ $cm^{-3}$). Each GaN layer in a pair may have a respective thickness about tens of nanometers, such as about 40, 50, or 60 nm. Three epitaxial growth processes may be used to separately grow the layer stacks for VCSELs 2502, 2504, and 2506, where the low doping density and high doping density GaN layers in different layer stacks may have different thicknesses, different periodicity, different doping densities, and/or different numbers of layers.

The layer stacks may then be subjected to different porosity treatment processes (e.g., different etching durations) as described above with respect to, for example, FIGS. 21A-21D, or may be subjected to a same porosity treatment process, to porosify the doped GaN layers. As such, the doped GaN layers may have different porosities. The porous GaN layers may also have different refractive indexes due to the different porosities. Thermal treatment processes as described above may be performed to relax InGaN layers 2530, 2532, and 2534, which may relax by different amounts due to the different porosities of the underlying porous GaN layers. Active regions 2540, 2542, and 2544 may be grown on relaxed InGaN layers 2530, 2532, and 2534, respectively. Active regions 2540, 2542, and 2544 may incorporate different amounts of indium because of the different amounts of relaxation of relaxed InGaN layers 2530, 2532, and 2534, and thus may emit light in different colors. Top DBRs 2550, 2552, and 2554 and electrical contacts 2560, 2562, and 2564 may then be formed on active regions 2540, 2542, and 2544 to form VCSELs 2502, 2504, and 2506. VCSELs 2502, 2504, and 2506 may have higher beam quality than micro-LEDs, such as directional and symmetrical beam profile, low beam divergence, and narrow full-width half-magnitude (FWHM) angular ranges. Therefore, a display including VCSELs 2502, 2504, and 2506 can have a higher efficiency and higher brightness.

In some embodiments, additional or alternative selective porosification processes may be performed after wafer 2500 is bonded to an electrical backplane and after substrate 2505 is removed, to porosify or further porosify the doped GaN layers in bottom DBRs 2520, 2522, and 2524, such that bottom DBRs 2520, 2522, and 2524 may reflect light in different wavelength bands.

Figure 26:
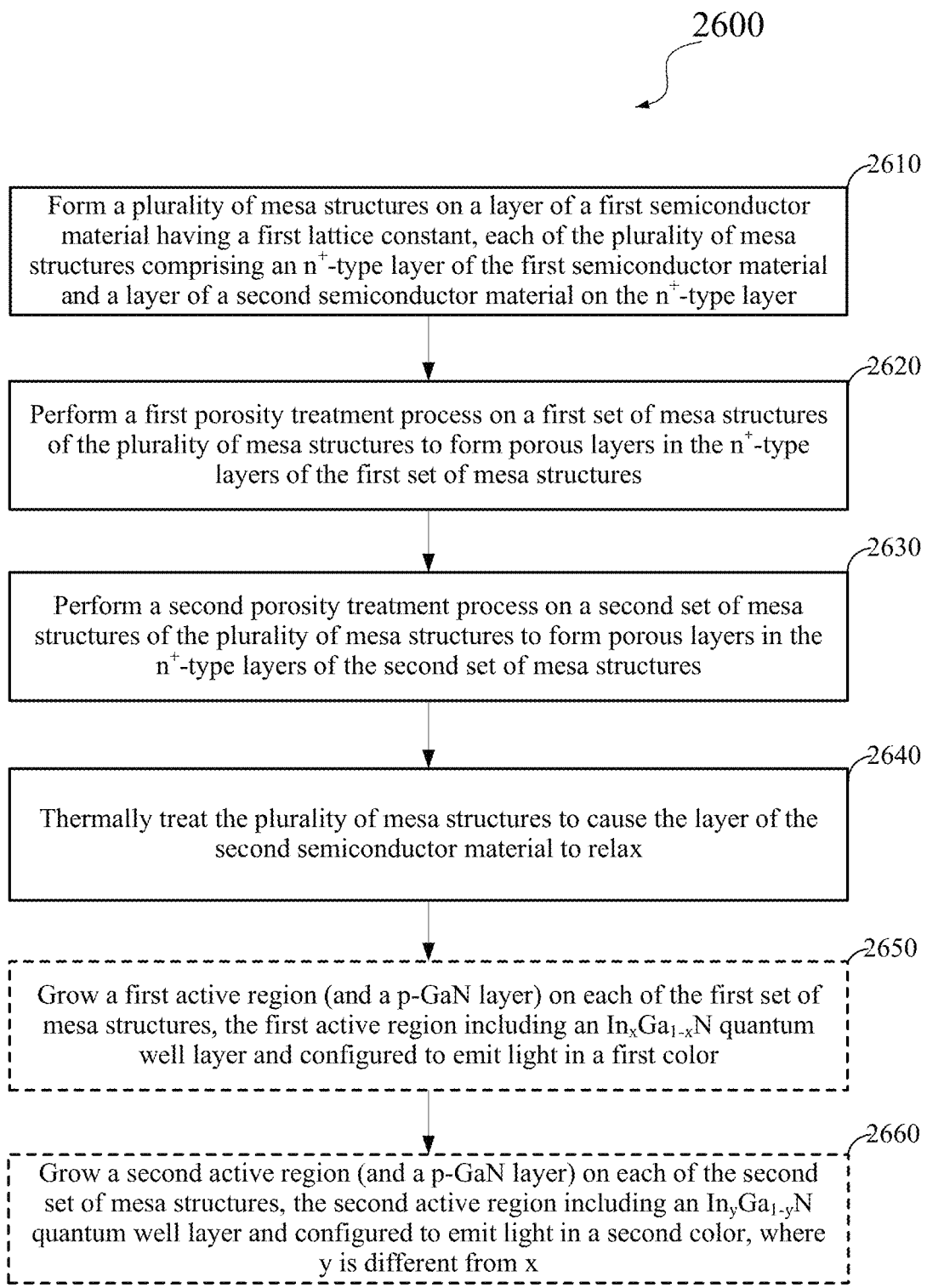
FIG. 26 includes a simplified flowchart illustrating an example of a method of fabricating multi-color light emitting devices on a same wafer or die according to certain embodiments.

FIG. 26 includes a simplified flowchart 2600 illustrating an example of a method of fabricating multi-color light emitting devices, such as multi-color micro-LEDs or multi-color VCSELs, on a same wafer or die according to certain embodiments. It is noted that the operations illustrated in FIG. 26 provide particular processes for fabricating multi-color light emitting devices. Other sequences of operations can also be performed according to alternative embodiments. For example, alternative embodiments may perform the operation in a different order. Moreover, the individual operations illustrated in FIG. 26 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

The operations at block 2610 of flowchart 2600 may include forming a plurality of mesa structures on a layer of a first semiconductor material having a first lattice constant. The layer of the first semiconductor material may be grown on a substrate. Each mesa structure of the plurality of mesa structures may include an $n^+$-type layer of the first semiconductor material and a layer of a second semiconductor material on the $n^+$-type layer. The second semiconductor material may have a second lattice constant different from the first lattice constant. The first semiconductor material may include a first III-nitride semiconductor material, such as GaN. The second semiconductor material may include a second III-nitride semiconductor material, such as InGaN. The layer of the second semiconductor material may include $In_xGa_{1-x}N$, where $0<x\leq0.2$.

The operations at block 2620 may include performing a first porosity treatment process on a first set of mesa structures of the plurality of mesa structures to form porous layers in the $n^+$-type layers of the first set of mesa structures. The first porosity treatment process may include electrochemically etching the $n^+$-type layers of the first set of mesa structures for a first time period and/or using a first voltage signal. In some embodiments, the first porosity treatment process may include implanting ions in the $n^+$-type layers of the first set of mesa structures to change a donor density of the $n^+$-type layers of the first set of mesa structures, and electrochemically etching the $n^+$-type layers of the first set of mesa structures.

The operations at block 2630 may include performing a second porosity treatment process on a second set of mesa structures of the plurality of mesa structures to form porous layers in the $n^+$-type layers of the second set of mesa structures. The second porosity treatment process may include electrochemically etching the $n^+$-type layers of the second set of mesa structures for a second time period and/or using a second voltage signal that is different from (e.g., higher than) the first voltage signal. In some embodiments, the second porosity treatment process may include implanting ions in the $n^+$-type layers of the second set of mesa structures to change a donor density of the $n^+$-type layers of the second set of mesa structures, and electrochemically etching the $n^+$-type layers of the second set of mesa structures. The porosity of the porous layers in the second set of mesa structures may be different from the porosity of the porous layers in the first set of mesa structures.

In some embodiments, each mesa structure of the plurality of mesa structures may include a plurality of layers between the layer of the first semiconductor material and the layer of the second semiconductor material. The plurality of layers may include a first set of unintentionally doped layers of the first semiconductor material and a second set of $n^+$-type layers of the first semiconductor material. The first set of unintentionally doped layers and the second set of $n^+$-type layers may be interleaved. For each mesa structure of the first set of mesa structures, the first porosity treatment process may form a respective porous layer in each of the second set of $n^+$-type layers. Therefore, the plurality of layers in each mesa structure of the first set of mesa structures may form a first DBR structure that includes a set of porous layers interleaved with a set of unintentionally doped layers. The first DBR structure may be configured to reflect light in a first wavelength band. For each mesa structure of the second set of mesa structures, the second porosity treatment process may form a respective porous layer in each of the second set of $n^+$-type layers. Therefore, the plurality of layers in each mesa structure of the second set of mesa structures may form a second DBR structure that includes a set of porous layers interleaved with a set of unintentionally doped layers. The second DBR structure may be configured to reflect light in a second wavelength band.

The operations at block 2640 may include thermally treating the plurality of mesa structures to cause the layer of the second semiconductor material to relax. Because of the different porosities between the porous layers in the first set of mesa structures and the porous layers in the second set of mesa structures, the layers of the second semiconductor material in the first set of mesa structures and the layers of the second semiconductor material in the second set of mesa structures may relax by different amounts.

Optionally, at block 2650, a first active region (and a p-GaN layer) may be grown on each of the first set of mesa structures. The first active region includes at least one $In_xGa_{1-x}N$ quantum well layer and is configured to emit light in a first color, where x may be greater than about 0.2, due to the relaxation of the layers of the second semiconductor material in the first set of mesa structures. In some embodiments where each mesa structure of the first set of mesa structures includes the first DBR structure, a first mirror may be formed on the first active region to form, in combination with the first DBR structure, a resonant cavity.

Optionally, at block 2660, a second active region (and a p-GaN layer) may be grown on each of the second set of mesa structures. The second active region includes an $In_yGa_{1-y}N$ quantum well layer and is configured to emit light in a second color, where y is different from x and may also be greater than about 0.2, due to the relaxation of the layers of the second semiconductor material in the second set of mesa structures. In some embodiments, the first active regions and the second active regions may be grown in a same epitaxial growth step. In some embodiments where each mesa structure of the second set of mesa structures includes the second DBR structure, a second mirror may be formed on the second active region to form, in combination with the second DBR structure, a resonant cavity.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 27A, 27B:
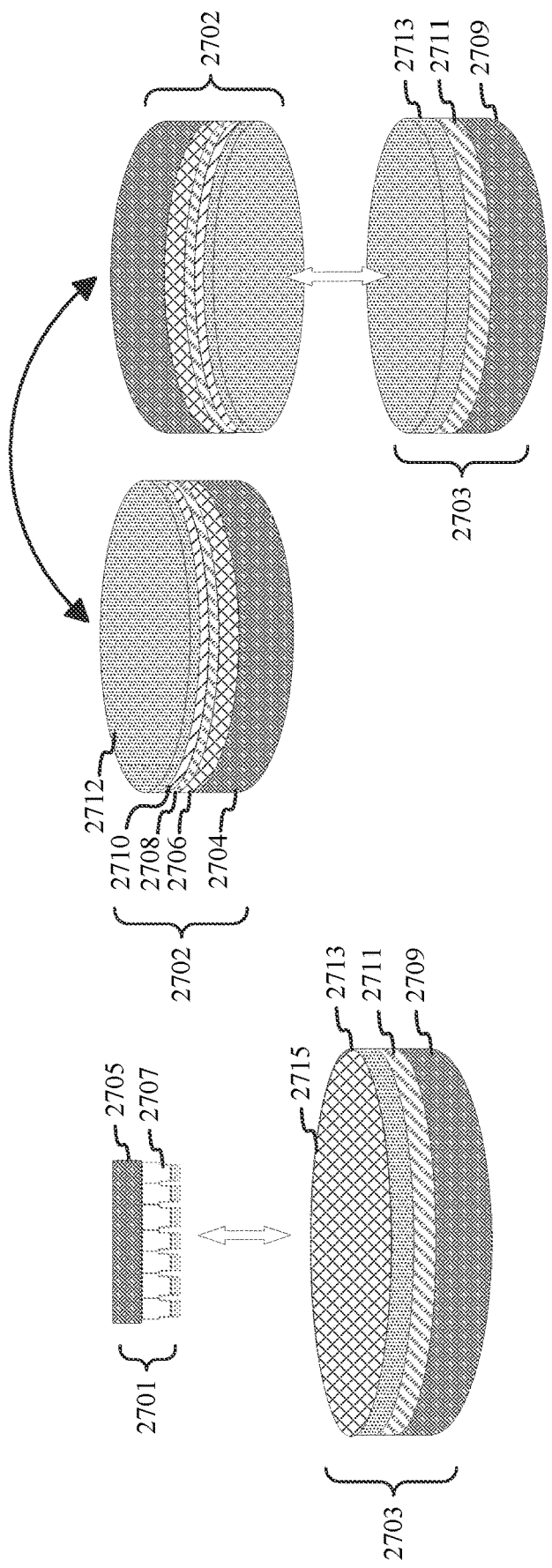
FIG. 27A illustrates an example of a method of die-to-wafer bonding for arrays of LEDs according to certain embodiments.
FIG. 27B illustrates an example of a method of wafer-to-wafer bonding for arrays of LEDs according to certain embodiments.

FIG. 27A illustrates an example of a method of die-to-wafer bonding for arrays of LEDs according to certain embodiments. In the example shown in FIG. 27A, an LED array 2701 may include a plurality of LEDs 2707 on a carrier substrate 2705. Carrier substrate 2705 may include various materials, such as GaAs, InP, GaN, AlN, sapphire, SiC, Si, or the like. LEDs 2707 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 2703 may include a base layer 2709 having passive or active integrated circuits (e.g., driver circuits 2711) fabricated thereon. Base layer 2709 may include, for example, a silicon wafer. Driver circuits 2711 may be used to control the operations of LEDs 2707. For example, the driver circuit for each LED 2707 may include a 2T1C pixel structure that has two transistors and one capacitor. Wafer 2703 may also include a bonding layer 2713. Bonding layer 2713 may include various materials, such as a metal, an oxide, a dielectric, CuSn, AuTi, and the like. In some embodiments, a patterned layer 2715 may be formed on a surface of bonding layer 2713, where patterned layer 2715 may include a metallic grid made of a conductive material, such as Cu, Ag, Au, Al, or the like.

LED array 2701 may be bonded to wafer 2703 via bonding layer 2713 or patterned layer 2715. For example, patterned layer 2715 may include metal pads or bumps made of various materials, such as CuSn, AuSn, or nanoporous Au, that may be used to align LEDs 2707 of LED array 2701 with corresponding driver circuits 2711 on wafer 2703. In one example, LED array 2701 may be brought toward wafer 2703 until LEDs 2707 come into contact with respective metal pads or bumps corresponding to driver circuits 2711. Some or all of LEDs 2707 may be aligned with driver circuits 2711, and may then be bonded to wafer 2703 via patterned layer 2715 by various bonding techniques, such as metal-to-metal bonding. After LEDs 2707 have been bonded to wafer 2703, carrier substrate 2705 may be removed from LEDs 2707.

FIG. 27B illustrates an example of a method of wafer-to-wafer bonding for arrays of LEDs according to certain embodiments. As shown in FIG. 27B, a first wafer 2702 may include a substrate 2704, a first semiconductor layer 2706, active layers 2708, and a second semiconductor layer 2710. Substrate 2704 may include various materials, such as GaAs, InP, GaN, AlN, sapphire, SiC, Si, or the like. First semiconductor layer 2706, active layers 2708, and second semiconductor layer 2710 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 2706 may be an n-type layer, and second semiconductor layer 2710 may be a p-type layer. For example, first semiconductor layer 2706 may be an n-doped GaN layer (e.g., doped with Si or Ge), and second semiconductor layer 2710 may be a p-doped GaN layer (e.g., doped with Mg, Ca, Zn, or Be). Active layers 2708 may include, for example, one or more GaN layers, one or more InGaN layers, one or more AlInGaP layers, and the like, which may form one or more heterostructures, such as one or more quantum wells or MQWs.

In some embodiments, first wafer 2702 may also include a bonding layer. Bonding layer 2712 may include various materials, such as a metal, an oxide, a dielectric, CuSn, AuTi, or the like. In one example, bonding layer 2712 may include p-contacts and/or n-contacts (not shown). In some embodiments, other layers may also be included on first wafer 2702, such as a buffer layer between substrate 2704 and first semiconductor layer 2706. The buffer layer may include various materials, such as polycrystalline GaN or AlN. In some embodiments, a contact layer may be between second semiconductor layer 2710 and bonding layer 2712. The contact layer may include any suitable material for providing an electrical contact to second semiconductor layer 2710 and/or first semiconductor layer 2706.

First wafer 2702 may be bonded to wafer 2703 that includes driver circuits 2711 and bonding layer 2713 as described above, via bonding layer 2713 and/or bonding layer 2712. Bonding layer 2712 and bonding layer 2713 may be made of the same material or different materials. Bonding layer 2713 and bonding layer 2712 may be substantially flat. First wafer 2702 may be bonded to wafer 2703 by various methods, such as metal-to-metal bonding, eutectic bonding, metal oxide bonding, anodic bonding, thermo-compression bonding, ultraviolet (UV) bonding, and/or fusion bonding.

As shown in FIG. 27B, first wafer 2702 may be bonded to wafer 2703 with the p-side (e.g., second semiconductor layer 2710) of first wafer 2702 facing down (i.e., toward wafer 2703). After bonding, substrate 2704 may be removed from first wafer 2702, and first wafer 2702 may then be processed from the n-side. The processing may include, for example, the formation of certain mesa shapes for individual LEDs, as well as the formation of optical components corresponding to the individual LEDs.

Figure 28A:
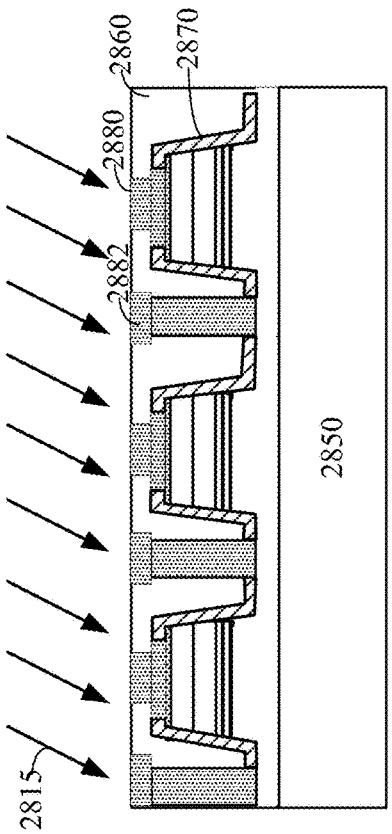
FIGS. 28A-28D illustrates an example of a method of hybrid bonding for arrays of LEDs according to certain embodiments.

FIGS. 28A-28D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 28A shows a substrate 2810 with passive or active circuits 2820 manufactured thereon. As described above with respect to FIGS. 27A-27B, substrate 2810 may include, for example, a silicon wafer. Circuits 2820 may include driver circuits for the arrays of LEDs. A bonding layer may include dielectric regions 2840 and contact pads 2830 connected to circuits 2820 through electrical interconnects 2822. Contact pads 2830 may include, for example, Cu, Ag, Au, Al, W, Mo, Ni, Ti, Pt, Pd, or the like. Dielectric materials in dielectric regions 2840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 2805. The activated surface may be atomically clean and may be reactive for formation of direct bonds between wafers when they are brought into contact, for example, at room temperature.

Figure 28B:
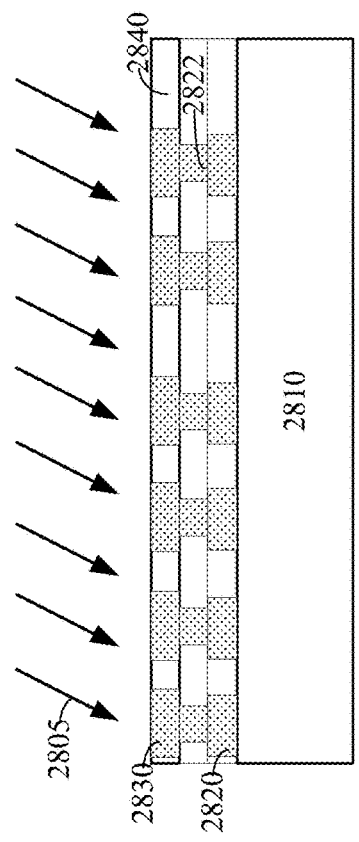

FIG. 28B illustrates a wafer 2850 including an array of micro-LEDs 2870 fabricated thereon as described above. Wafer 2850 may be a carrier wafer and may include, for example, GaAs, InP, GaN, AlN, sapphire, SiC, Si, or the like. Micro-LEDs 2870 may include an n-type layer, an active region, and a p-type layer epitaxially grown on wafer

2850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 2880 and n-contacts 2882 may be formed in a dielectric material layer 2860 deposited on the mesa structures and may make electrical contacts with the p-type layer and the n-type layers, respectively. Dielectric materials in dielectric material layer 2860 may include, for example, SiCN, $SiO_2$, SiN, $Al_2O_3$, $HfO_2$, $ZrO_2$, $Ta_2O_5$, or the like. P-contacts 2880 and n-contacts 2882 may include, for example, Cu, Ag, Au, Al, W, Mo, Ni, Ti, Pt, Pd, or the like. The top surfaces of p-contacts 2880, n-contacts 2882, and dielectric material layer 2860 may form a bonding layer. The bonding layer may be planarized and polished using, for example, chemical mechanical polishing, where the polishing may cause dishing in p-contacts 2880 and n-contacts 2882. The bonding layer may then be cleaned and activated by, for example, an ion (e.g., plasma) or fast atom (e.g., Ar) beam 2815. The activated surface may be atomically clean and reactive for formation of direct bonds between wafers when they are brought into contact, for example, at room temperature.

Figure 28C:
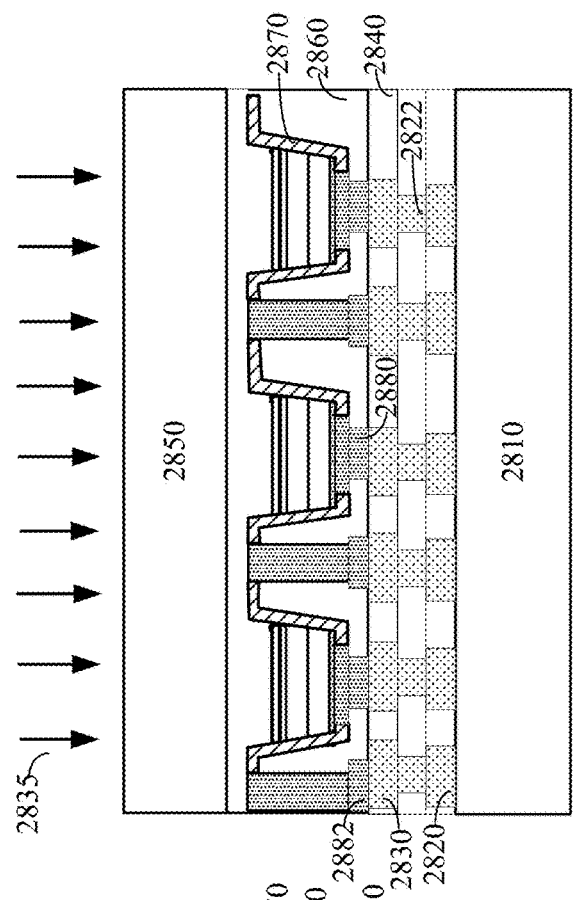

FIG. 28C illustrates a room temperature bonding process for bonding the dielectric materials in the bonding layers. For example, after the bonding layer that includes dielectric regions 2840 and contact pads 2830 and the bonding layer that includes p-contacts 2880, n-contacts 2882, and dielectric material layer 2860 are surface activated, wafer 2850 and micro-LEDs 2870 may be turned upside down and brought into contact with substrate 2810 and the circuits formed thereon. In some embodiments, compression pressure 2825 may be applied to substrate 2810 and wafer 2850 such that the bonding layers are pressed against each other. Due to the surface activation and the dishing in the contacts, dielectric regions 2840 and dielectric material layer 2860 may be in direct contact because of the surface attractive force, and may react and form chemical bonds between them because the surface atoms may have dangling bonds and may be in unstable energy states after the activation. Thus, the dielectric materials in dielectric regions 2840 and dielectric material layer 2860 may be bonded together with or without heat treatment or pressure.

Figure 28D:
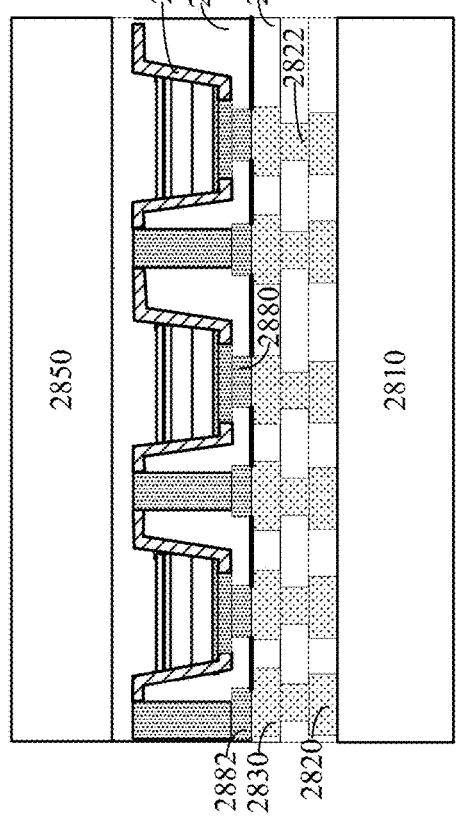

FIG. 28D illustrates an annealing process for bonding the contacts in the bonding layers after bonding the dielectric materials in the bonding layers. For example, contact pads 2830 and p-contacts 2880 or n-contacts 2882 may be bonded together by annealing at, for example, about 280-400° C. or higher. During the annealing process, heat 2835 may cause the contacts to expand more than the dielectric materials (due to different coefficients of thermal expansion), and thus may close the dishing gaps between the contacts such that contact pads 2830 and p-contacts 2880 or n-contacts 2882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 29:
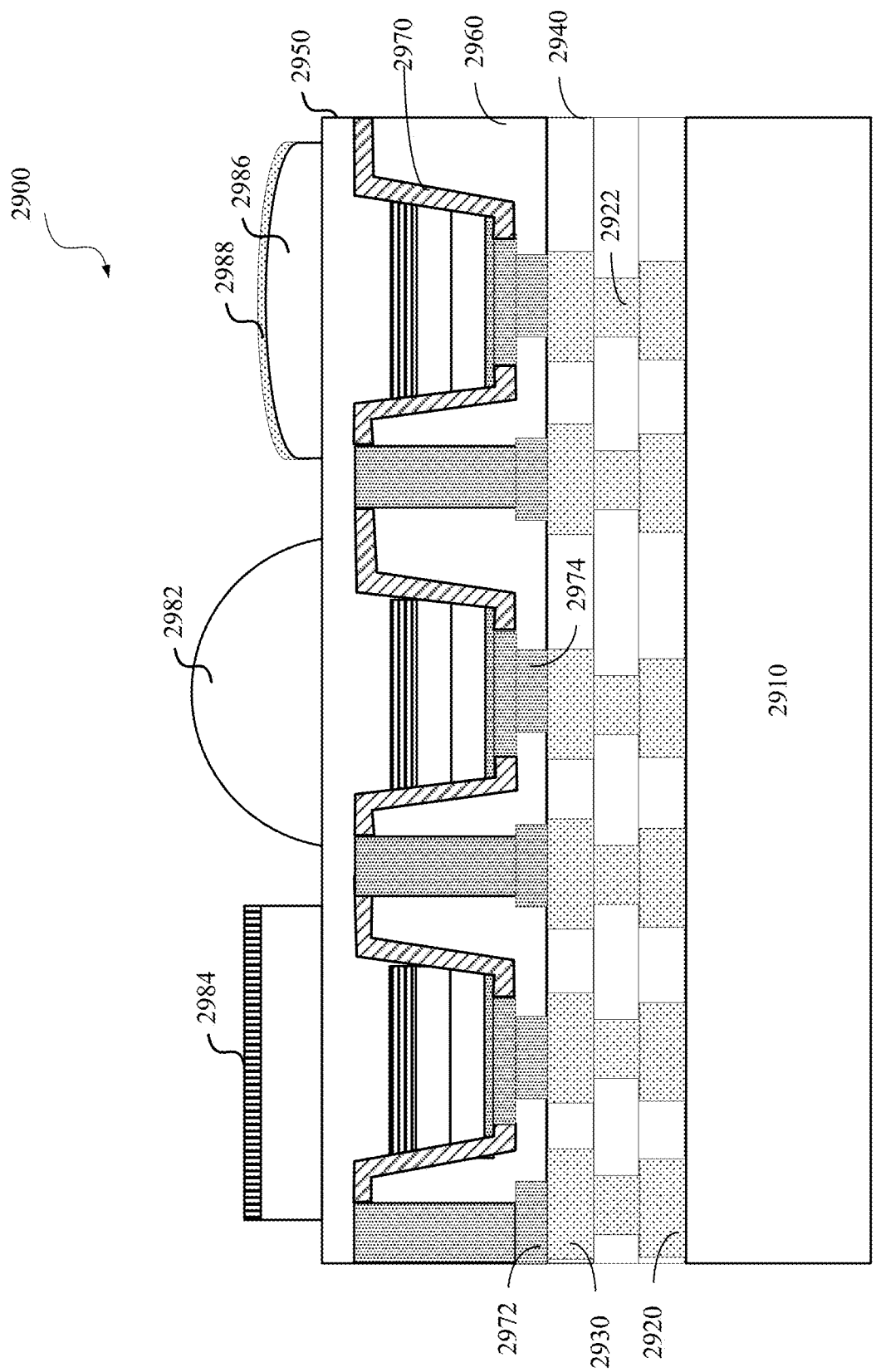
FIG. 29 illustrates an example of an LED array with secondary optical components fabricated thereon according to certain embodiments.

FIG. 29 illustrates an example of an LED array 2900 with secondary optical components fabricated thereon according to certain embodiments. LED array 2900 may be made by bonding an LED chip or wafer with a silicon wafer including electrical circuits fabricated thereon, using any suitable bonding techniques described above with respect to, for example, FIGS. 27A-28D. In the example shown in FIG. 29, LED array 2900 may be bonded using a wafer-to-wafer hybrid bonding technique as described above with respect to FIG. 28A-28D. LED array 2900 may include a substrate 2910, which may be, for example, a silicon wafer. Integrated circuits 2920, such as LED driver circuits, may be fabricated on substrate 2910. Integrated circuits 2920 may be connected to p-contacts 2974 and n-contacts 2972 of micro-LEDs 2970 through interconnects 2922 and contact pads 2930, where contact pads 2930 may form metallic bonds with p-contacts 2974 and n-contacts 2972. Dielectric layer 2940 on substrate 2910 may be bonded to dielectric layer 2960 through fusion bonding.

The substrate (not shown) of the LED chip or wafer may be thinned or may be removed to expose the n-type layer 2950 of micro-LEDs 2970. Various secondary optical components, such as a spherical micro-lens 2982, a grating 2984, a micro-lens 2986, an antireflection layer 2988, and the like, may be formed in or on top of n-type layer 2950. For example, spherical micro-lens arrays may be etched in the semiconductor materials of micro-LEDs 2970 using a gray-scale mask and a photoresist with a linear response to exposure light, or using an etch mask formed by thermal reflowing of a patterned photoresist layer. The secondary optical components may also be etched in a dielectric layer deposited on n-type layer 2950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 2970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 29 to show some examples of secondary optical components that can be formed on micro-LEDs 2970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 30:
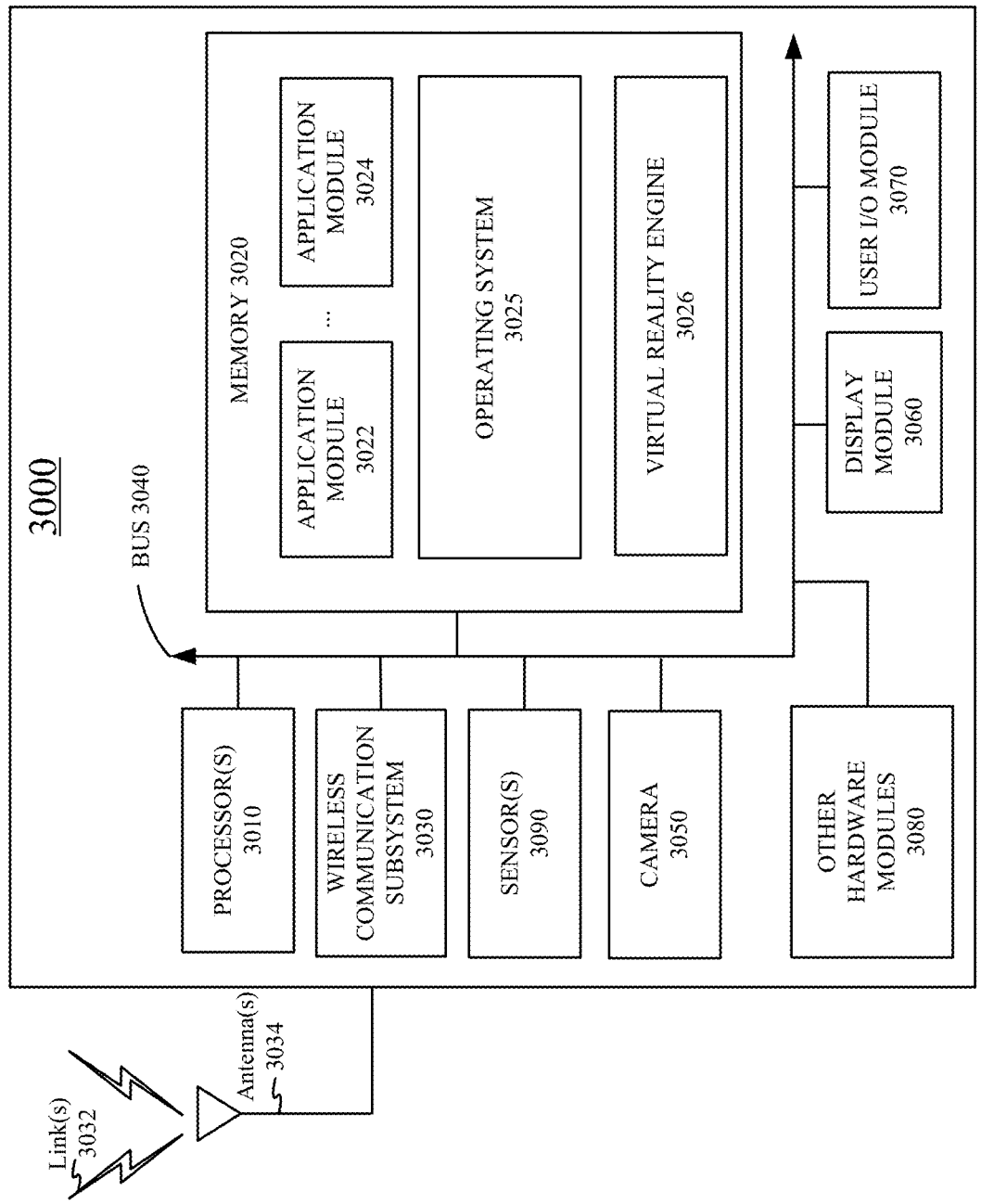
FIG. 30 is a simplified block diagram of an electronic system of an example of a near-eye display according to certain embodiments.

FIG. 30 is a simplified block diagram of an example electronic system 3000 of an example near-eye display (e.g., HMD device) for implementing some of the examples disclosed herein. Electronic system 3000 may be used as the electronic system of an HMD device or other near-eye displays described above. In this example, electronic system 3000 may include one or more processor(s) 3010 and a memory 3020. Processor(s) 3010 may be configured to execute instructions for performing operations at a number of components, and can be, for example, a general-purpose processor or microprocessor suitable for implementation within a portable electronic device. Processor(s) 3010 may be communicatively coupled with a plurality of components within electronic system 3000. To realize this communicative coupling, processor(s) 3010 may communicate with the other illustrated components across a bus 3040. Bus 3040 may be any subsystem adapted to transfer data within electronic system 3000. Bus 3040 may include a plurality of computer buses and additional circuitry to transfer data.

Memory 3020 may be coupled to processor(s) 3010. In some embodiments, memory 3020 may offer both short-term and long-term storage and may be divided into several units. Memory 3020 may be volatile, such as static random access memory (SRAM) and/or dynamic random access memory (DRAM) and/or non-volatile, such as read-only memory (ROM), flash memory, and the like. Furthermore, memory 3020 may include removable storage devices, such as secure digital (SD) cards. Memory 3020 may provide storage of computer-readable instructions, data structures, program modules, and other data for electronic system 3000. In some embodiments, memory 3020 may be distributed into different hardware modules. A set of instructions and/or code might be stored on memory 3020. The instructions might take the form of executable code that may be executable by electronic system 3000, and/or might take the form of source and/or installable code, which, upon compilation and/or installation on electronic system 3000 (e.g., using any of a variety of generally available compilers, installation programs, compression/decompression utilities, etc.), may take the form of executable code.

In some embodiments, memory 3020 may store a plurality of application modules 3022 through 3024, which may include any number of applications. Examples of applications may include gaming applications, conferencing applications, video playback applications, or other suitable applications. The applications may include a depth sensing function or eye tracking function. Application modules 3022-3024 may include particular instructions to be executed by processor(s) 3010. In some embodiments, certain applications or parts of application modules 3022-3024 may be executable by other hardware modules 3080. In certain embodiments, memory 3020 may additionally include secure memory, which may include additional security controls to prevent copying or other unauthorized access to secure information.

In some embodiments, memory 3020 may include an operating system 3025 loaded therein. Operating system 3025 may be operable to initiate the execution of the instructions provided by application modules 3022-3024 and/or manage other hardware modules 3080 as well as interfaces with a wireless communication subsystem 3030 which may include one or more wireless transceivers. Operating system 3025 may be adapted to perform other operations across the components of electronic system 3000 including threading, resource management, data storage control and other similar functionality.

Wireless communication subsystem 3030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 3000 may include one or more antennas 3034 for wireless communication as part of wireless communication subsystem 3030 or as a separate component coupled to any portion of the system. Depending on desired functionality, wireless communication subsystem 3030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN.

Wireless communications subsystem 3030 may permit data to be exchanged with a network, other computer systems, and/or any other devices described herein. Wireless communication subsystem 3030 may include a means for transmitting or receiving data, such as identifiers of HMD devices, position data, a geographic map, a heat map, photos, or videos, using antenna(s) 3034 and wireless link(s) 3032. Wireless communication subsystem 3030, processor(s) 3010, and memory 3020 may together comprise at least a part of one or more of a means for performing some functions disclosed herein.

Embodiments of electronic system 3000 may also include one or more sensors 3090. Sensor(s) 3090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 3090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 3000 may include a display module 3060. Display module 3060 may be a near-eye display, and may graphically present information, such as images, videos, and various instructions, from electronic system 3000 to a user. Such information may be derived from one or more application modules 3022-3024, virtual reality engine 3026, one or more other hardware modules 3080, a combination thereof, or any other suitable means for resolving graphical content for the user (e.g., by operating system 3025). Display module 3060 may use LCD technology, LED technology (including, for example, OLED, ILED, μ-LED, AMOLED, TOLED, etc.), light emitting polymer display (LPD) technology, or some other display technology.

Electronic system 3000 may include a user input/output module 3070. User input/output module 3070 may allow a user to send action requests to electronic system 3000. An action request may be a request to perform a particular action. For example, an action request may be to start or end an application or to perform a particular action within the application. User input/output module 3070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 3000. In some embodiments, user input/output module 3070 may provide haptic feedback to the user in accordance with instructions received from electronic system 3000. For example, the haptic feedback may be provided when an action request is received or has been performed.

Electronic system 3000 may include a camera 3050 that may be used to take photos or videos of a user, for example, for tracking the user's eye position. Camera 3050 may also be used to take photos or videos of the environment, for example, for VR, AR, or MR applications. Camera 3050 may include, for example, a complementary metal-oxide-semiconductor (CMOS) image sensor with a few millions or tens of millions of pixels. In some implementations, camera 3050 may include two or more cameras that may be used to capture 3-D images.

In some embodiments, electronic system 3000 may include a plurality of other hardware modules 3080. Each of other hardware modules 3080 may be a physical module within electronic system 3000. While each of other hardware modules 3080 may be permanently configured as a structure, some of other hardware modules 3080 may be temporarily configured to perform specific functions or temporarily activated. Examples of other hardware modules 3080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 3080 may be implemented in software.

In some embodiments, memory 3020 of electronic system 3000 may also store a virtual reality engine 3026. Virtual reality engine 3026 may execute applications within electronic system 3000 and receive position information, acceleration information, velocity information, predicted future positions, or any combination thereof of the HMD device from the various sensors. In some embodiments, the information received by virtual reality engine 3026 may be used for producing a signal (e.g., display instructions) to display module 3060. For example, if the received information indicates that the user has looked to the left, virtual reality engine 3026 may generate content for the HMD device that mirrors the user's movement in a virtual environment. Additionally, virtual reality engine 3026 may perform an action within an application in response to an action request received from user input/output module 3070 and provide feedback to the user. The provided feedback may be visual, audible, or haptic feedback. In some implementations, processor(s) 3010 may include one or more GPUs that may execute virtual reality engine 3026.

In various implementations, the above-described hardware and modules may be implemented on a single device or on multiple devices that can communicate with one another using wired or wireless connections. For example, in some implementations, some components or modules, such as GPUs, virtual reality engine 3026, and applications (e.g., tracking application), may be implemented on a console separate from the head-mounted display device. In some implementations, one console may be connected to or support more than one HMD.

In alternative configurations, different and/or additional components may be included in electronic system 3000. Similarly, functionality of one or more of the components can be distributed among the components in a manner different from the manner described above. For example, in some embodiments, electronic system 3000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light emitting diode (LED) device comprising:
   a substrate; and
   a plurality of mesa structures on the substrate, each mesa structure of the plurality of mesa structures comprising:
   a layer of a first semiconductor material grown on the substrate;
   a porous layer of the first semiconductor material on the layer of the first semiconductor material, the porous layer characterized by an areal porosity equal to or greater than 15%;
   a layer of a second semiconductor material on the porous layer, the second semiconductor material characterized by a lattice constant greater than a lattice constant of the first semiconductor material;

an active region on the layer of the second semiconductor material, the active region configured to emit red light, wherein the active region includes at least one quantum well layer including InGaN;

a p-contact layer on the active region;

a dielectric layer on sidewalls of the p-contact layer and the active region; and an n-contact layer in physical contact with at least a portion of sidewalls of the layer of the second semiconductor material, wherein the n-contact layer is on sidewalls of the porous layer and at least a portion of sidewalls of the layer of the first semiconductor material.

2. The LED device of claim 1, wherein:
the first semiconductor material includes a first III-nitride semiconductor material; and
the second semiconductor material includes a second III-nitride semiconductor material.

3. The LED device of claim 2, wherein the first semiconductor material includes GaN and the second semiconductor material includes InGaN.

4. The LED device of claim 1, wherein the at least one quantum well layer includes $In_xGa_{1-x}N$, where $x>0.2$.

5. The LED device of claim 1, wherein the layer of the second semiconductor material includes $In_xGa_{1-x}N$, where $0<x\leq 0.2$.

6. The LED device of claim 1, wherein the dielectric layer is between the n-contact layer and the sidewalls of the p-contact layer and the active region.

7. The LED device of claim 1, wherein the dielectric layer is on a portion of the sidewalls of the layer of the second semiconductor material.

8. The LED device of claim 1, wherein the areal porosity of the porous layer is between 30% and 90%.

9. The LED device of claim 1, wherein the layer of the second semiconductor material has a lower resistance than the porous layer.

10. The LED device of claim 1, wherein a thickness of the porous layer is greater than 50 nm.

11. The LED device of claim 1, wherein the substrate includes a buffer layer and a sapphire or silicon substrate layer.

12. The LED device of claim 1, wherein:
the layer of the first semiconductor material and the porous layer are n-doped; and
a difference between a doping density of the porous layer and the doping density of the layer of the first semiconductor material is less than 5%.

13. The LED device of claim 1, further comprising a patterned dielectric layer on the substrate, wherein:
the substrate includes a buffer layer;
the patterned dielectric layer is on the buffer layer and includes a plurality of apertures to expose portions of the substrate; and
the layer of the first semiconductor material in each mesa structure of the plurality of mesa structures is grown on a respective portion of the buffer layer through a respective aperture of the plurality of apertures.

14. The LED device of claim 1, further comprising a driver backplane bonded to the plurality of mesa structures, the driver backplane including driver circuits electrically connected to the p-contact layer and the n-contact layer of each mesa structure of the plurality of mesa structures.

15. A method of fabricating a light emitting diode (LED) device, the method comprising:
forming a plurality of precursor mesa structures on a substrate, each precursor mesa structure of the plurality of precursor mesa structures comprising:
a layer of a first semiconductor material grown on the substrate;
a porous layer of the first semiconductor material on the layer of the first semiconductor material, the porous layer characterized by an areal porosity equal to or greater than 15%; and
a layer of a second semiconductor material on the porous layer, the second semiconductor material characterized by a lattice constant greater than a lattice constant of the first semiconductor material;
forming an LED layer stack on each precursor mesa structure of the plurality of precursor mesa structures, the LED layer stack comprising:
an active region on the layer of the second semiconductor material, the active region configured to emit red light; and
a p-contact layer on the active region;
etching, using a mask layer, the LED layer stack to remove peripheral regions of the LED layer stack and to form one or more pixel mesa structures on each precursor mesa structure of the plurality of precursor mesa structures;
forming a dielectric layer on sidewalls of each pixel mesa structures of the one or more pixel mesa structures;
etching, using the mask layer on the one or more pixel mesa structure, the plurality of precursor mesa structures on the substrate; and
forming an n-contact layer on sidewalls of each pixel mesa structure of the one or more pixel mesa structures, the n-contact layer in physical contact with the dielectric layer, at least a portion of sidewalls of the layer of the second semiconductor material, and sidewalls of the porous layer.

16. The method of claim 15, wherein forming the plurality of precursor mesa structures on the substrate comprises:
growing an epitaxial layer stack on the substrate, the epitaxial layer stack including:
the layer of the first semiconductor material;
an $n^+$-type layer of the first semiconductor material; and
the layer of the second semiconductor material on the $n^+$-type layer;
electrochemically etching the $n^+$-type layer of the first semiconductor material to form the porous layer;
etching the epitaxial layer stack to form the plurality of precursor mesa structures; and
thermally treating the plurality of precursor mesa structures to cause the layer of the second semiconductor material to relax.

17. The method of claim 16, wherein:
the layer of the first semiconductor material is n-doped with a doping density less than $1\times10^{19}$ $cm^{-3}$;
the $n^+$-type layer of the first semiconductor material has a higher doping density than the layer of the first semiconductor material; and
electrochemically etching the $n^+$-type layer of the first semiconductor material comprises etching the $n^+$-type layer of the first semiconductor material until a difference between a doping density of the $n^+$-type layer and a doping density of the layer of the first semiconductor material is less than 5%.

18. The method of claim 15, wherein forming the plurality of precursor mesa structures on the substrate comprises:
- forming a patterned dielectric layer on the substrate, the patterned dielectric layer including a plurality of apertures to expose portions of a buffer layer on the substrate;
- growing, through a respective aperture of the plurality of apertures, a respective epitaxial layer stack on each exposed portion of the exposed portions of the buffer layer on substrate, the respective epitaxial layer stack including:
  - the layer of the first semiconductor material;
  - an $n^+$-type layer of the first semiconductor material; and
  - the layer of the second semiconductor material on the $n^+$-type layer;
- electrochemically etching the $n^+$-type layer of the first semiconductor material to form the porous layer; and
- thermally treating the plurality of precursor mesa structures to cause the layer of the second semiconductor material to relax.

19. The method of claim 15, wherein forming the LED layer stack comprises:
- forming a growth mask layer on sidewalls of each precursor mesa structure of the plurality of precursor mesa structures;
- growing the active region on the layer of the second semiconductor material; and
- forming the p-contact layer on the active region.

\* \* \* \* \*